US012787465B2

(12) United States Patent
Adachi et al.

(10) Patent No.: US 12,787,465 B2
(45) Date of Patent: Nov. 3, 2026

(54) SEMICONDUCTOR DEVICE

(71) Applicant: SONY SEMICONDUCTOR SOLUTIONS CORPORATION, Kanagawa (JP)

(72) Inventors: Mitsuru Adachi, Kanagawa (JP); Toshihiro Murayama, Kanagawa (JP); Ryo Inomoto, Gifu (JP); Hirohisa Yasukawa, Kanagawa (JP); Yuki Suda, Kanagawa (JP); Masaki Hatano, Kanagawa (JP); Toshiki Koyama, Kanagawa (JP); Harumi Miyaki, Kanagawa (JP); Kiyohisa Sakai, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 474 days.

(21) Appl. No.: 18/554,244

(22) PCT Filed: Dec. 28, 2021

(86) PCT No.: PCT/JP2021/048843
§ 371 (c)(1),
(2) Date: Oct. 6, 2023

(87) PCT Pub. No.: WO2022/230243
PCT Pub. Date: Nov. 3, 2022

(65) Prior Publication Data

US 2024/0194708 A1 Jun. 13, 2024

(30) Foreign Application Priority Data

Apr. 28, 2021 (JP) ................................ 2021-075535

(51) Int. Cl.
*H10F 39/00* (2025.01)
*H10W 40/22* (2026.01)
(Continued)

(52) U.S. Cl.
CPC ......... *H10F 39/804* (2025.01); *H10F 39/809* (2025.01); *H10W 40/22* (2026.01);
(Continued)

(58) Field of Classification Search
None
See application file for complete search history.

(56) References Cited

U.S. PATENT DOCUMENTS

2012/0050996 A1 3/2012 Loo
2015/0145115 A1* 5/2015 Liu .................... H10W 74/117 257/737
2016/0276245 A1 9/2016 Murai et al.

FOREIGN PATENT DOCUMENTS

JP H02-307251 12/1990
JP 2000-174179 6/2000
(Continued)

OTHER PUBLICATIONS

English translation of JP200725843 (Year: 2007).*
(Continued)

*Primary Examiner* — Bradley Smith
(74) *Attorney, Agent, or Firm* — SHERIDAN ROSS P.C.

(57) ABSTRACT

Reliability is improved in a semiconductor device using a heat conductive member. The semiconductor device includes a first semiconductor chip, a heat dissipation member, a heat conductive member, and an outflow prevention part. In a semiconductor package including the first semiconductor chip, the heat dissipation member, the heat conductive member, and the outflow prevention part, the heat conductive member is disposed between the heat dissipation member and the chip plane of the first semiconductor chip. The outflow prevention part prevents the outflow of the heat conductive member from the chip plane of the first semiconductor chip.

20 Claims, 83 Drawing Sheets

(51) Int. Cl.
*H10W 40/70* (2026.01)
*H10W 70/63* (2026.01)
*H10W 90/00* (2026.01)

(52) U.S. Cl.
CPC ......... *H10W 40/70* (2026.01); *H10W 70/635* (2026.01); *H10W 90/736* (2026.01)

(56) References Cited

FOREIGN PATENT DOCUMENTS

| | | |
|---|---|---|
| JP | 2007-258430 | 10/2007 |
| JP | 2007-335742 | 12/2007 |
| JP | 2010-245468 | 10/2010 |
| WO | WO 2015/102046 | 7/2015 |

OTHER PUBLICATIONS

English translation of JP2010245468 (Year: 2010).*
International Search Report and Written Opinion prepared by the Japan Patent Office on Mar. 14, 2022, for International Application No. PCT/JP2021/048843, 3 pgs.

* cited by examiner a b a b a b c a b a b a b c a b a b c a b a b a b a b a b a b c

SEMICONDUCTOR DEVICE

CROSS REFERENCE TO RELATED APPLICATIONS

This application is a national stage application under 35 U.S.C. 371 and claims the benefit of PCT Application No. PCT/JP2021/048843, having an international filing date of 28 Dec. 2021, which designated the United States, which PCT application claimed the benefit of Japanese Patent Application No. 2021-075535, filed 28 Apr. 2021, the entire disclosures of each of which are incorporated herein by reference.

TECHNICAL FIELD

The present technology relates to a semiconductor device. Specifically, the present technology relates to a semiconductor device on which a heat dissipation member is mounted.

BACKGROUND ART

Conventionally, in a semiconductor device, a heat dissipation member such as a heat sink is used to dissipate heat generated in a semiconductor chip. For example, there has been proposed a semiconductor device having a structure in which a heat conductive member that melts at an operating temperature of a semiconductor chip is provided on the back surface of the semiconductor chip, and a heat dissipation member is attached via the heat conductive member (e.g., see Patent Document 1.).

CITATION LIST

Patent Document

Patent Document 1: Japanese Patent Application Laid-Open No. 2007-335742

SUMMARY OF THE INVENTION

Problems to be Solved by the Invention

In the conventional technology described above, the molten heat conductive member deforms according to a load to reduce the warpage and inclination of the substrate. However, in the semiconductor device described above, there is a possibility that the molten heat conductive member flows out from the back surface of the semiconductor chip. When the flowed-out heat conductive member comes into contact with a peripheral terminal, component, or element, a defect may occur in its electrical connectivity. In particular, when the heat conductive member has conductivity, a short circuit may occur. There is a problem that the reliability of the operation of the semiconductor device deteriorates due to the defect of the electrical connectivity.

The present technology was made in view of such a situation, and an object of the present technology is to improve reliability in a semiconductor device using a heat conductive member.

Solutions to Problems

The present technology has been made to solve the problems described above, and a first aspect of the present technology is a semiconductor device including: a first semiconductor chip; a heat dissipation member; a heat conductive member disposed between a chip plane of the first semiconductor chip and the heat dissipation member; and an outflow prevention part that prevents outflow of the heat conductive member from the chip plane. This brings about an effect of preventing the outflow of the heat conductive member.

Further, in the first aspect, the semiconductor device may further include a first sealing resin configured to seal the first semiconductor chip, and the outflow prevention part may be formed in the first sealing resin. This brings about an effect that the outflow of the heat conductive member is prevented by processing the first sealing resin.

Further, in the first aspect, the first sealing resin may be formed with a first opening that exposes at least a part of a chip plane of the first semiconductor chip, and the outflow prevention part may include a first notch adjacent to at least a part of an outer periphery of the first opening. This brings about an effect that the outflow of the heat conductive member is prevented by the first notch.

Further, in the first aspect, the semiconductor device may further include a second semiconductor chip, the first sealing resin may be formed with a second opening that exposes at least a part of a chip plane of the second semiconductor chip, and the outflow prevention part may further include a second notch formed between the first opening and the second opening. This brings about an effect that the heights of the heat conductive members on the upper portions of the first and second semiconductor chips are equal to each other.

Further, in the first aspect, a predetermined number of trenches may be formed in the first notch. This brings about an effect of reliably preventing the outflow of the heat conductive member.

Further, in the first aspect, the trench may be formed outside the outer periphery of the chip plane. This brings about an effect of making the trench deep.

Further, in the first aspect, one of both surfaces of the semiconductor chip may be a light-receiving surface, the heat conductive member may be disposed between the other of both surfaces of the first semiconductor chip and the heat dissipation member, and the outflow prevention part may include a notch formed in the first sealing resin and a trench formed in the heat dissipation member. This brings about an effect that the outflow of the heat conductive member is prevented by the notch and the trench.

Further, in the first aspect, the semiconductor device may further include: a sealing glass that transmits light to the light-receiving surface; and a second sealing resin formed around the sealing glass. This brings about an effect of preventing flare and ghosting.

Further, in the first aspect, the semiconductor device may further include a through-via substrate in which a through via is formed, and the first sealing resin may be formed inside the through-via substrate. This brings about an effect of improving the strength of a semiconductor package.

Further, in the first aspect, the heat dissipation member may include a base having a plate shape and a plurality of protrusions protruding from the base in a direction perpendicular to the chip plane, and the height of the base from the chip plane may be lower than the height of the first sealing resin from the chip plane. This brings about an effect of reducing the size of the semiconductor package.

Further, in the first aspect, the semiconductor device may further include: a second sealing resin having an elastic modulus lower than a lower elastic modulus of the first sealing resin; and a wiring layer in which an external terminal is provided on one of both surfaces and the second sealing resin and the first semiconductor chip are stacked on the other of both surfaces, and the first sealing resin may be stacked on the second sealing resin. This brings about an effect of improving connection reliability.

Further, in the first aspect, the semiconductor device may further include a substrate on which the first semiconductor chips are stacked and in which an opening that exposes a part of the chip plane is formed, one of both surfaces of the first semiconductor chip may be a light-receiving surface, and the other of the both surfaces may be the chip plane, and the outflow prevention part may include a notch formed in the substrate. This brings about an effect of preventing the outflow of the heat conductive member in a face-up mounted semiconductor package.

Further, in the first aspect, the notch may be formed by at least one of processing of a base material of the substrate, processing of a solder resist, patterning for a wiring pattern, or silk printing. This brings about an effect that a notch with a desired structure is formed.

Further, in the first aspect, the notch may be formed on each of both surfaces of the substrate. This brings about an effect of increasing the amount of heat dissipated.

Further, in the first aspect, the shape of the notch may differ between one and the other of both surfaces of the substrate. This configuration provides an effect of improving wiring efficiency.

Further, in the first aspect, the notch may be formed adjacent to a part of the outer periphery of the opening. This brings about an effect of preventing the outflow of the heat conductive member.

Further, in the first aspect, the notch may be formed in a region surrounding the outer periphery of the opening. This brings about an effect of preventing the outflow of the heat conductive member.

Further, in the first aspect, a predetermined electronic component may be mounted on the substrate. This configuration provides an effect of improving wiring efficiency.

Further, in the first aspect, the semiconductor device may further include a first sealing resin configured to seal the first semiconductor chip, and the outflow prevention part may be formed in each of the first sealing resin and the heat dissipation member. This brings about an effect of reliably preventing the outflow of the heat conductive member.

Further, in the first aspect, the outflow prevention part may further include a holding part formed in the heat dissipation member, and the holding part may hold the heat conductive member. This brings about an effect that the amount of the heat conductive member increases as much as the heat conductive member is held.

MODE FOR CARRYING OUT THE INVENTION

Hereinafter, modes for carrying out the present technology (hereinafter referred to as embodiments) will be described. The description will be given in the following order.

1. First Embodiment (example in which notch is formed in sealing resin)
2. Second Embodiment (example in which notch is formed in substrate)
3. Third Embodiment (example in which notch is formed in sealing resin and trench is formed in heat dissipation member)
4. Fourth Embodiment (example in which notch is formed in sealing resin, and height of base of heat dissipation member is lower than that of sealing resin)
5. Fifth Embodiment (example in which notch is formed in sealing resin and trench is formed in notch)
6. Sixth Embodiment (example in which notch is formed on upper side of two-layer sealing resin)
7. Seventh embodiment (example in which trenches and holes are formed in heat dissipation member)
8. Example of application to mobile body

1. First Embodiment

Configuration Example of Semiconductor Package

Figure 1:
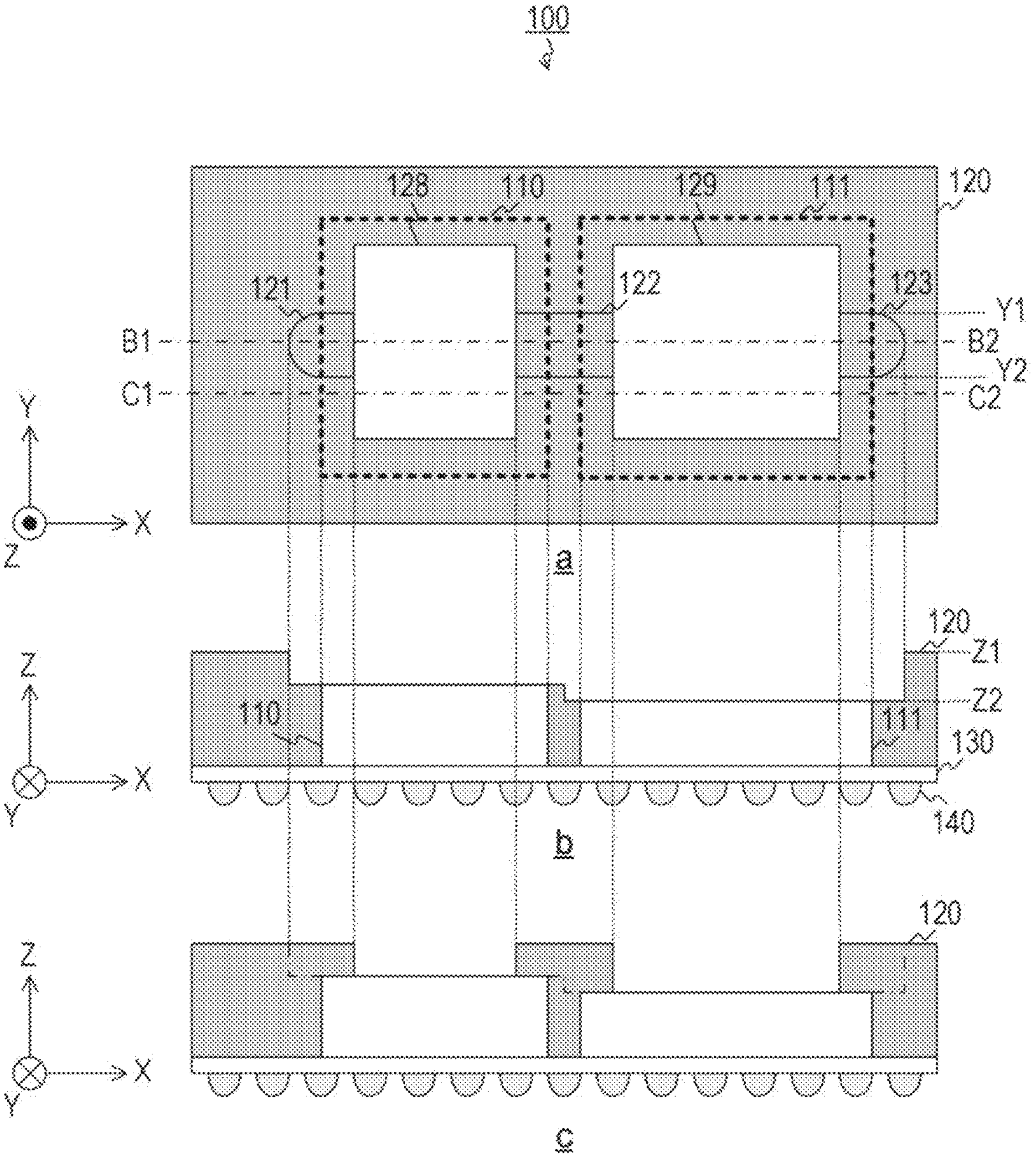
FIG. 1 is an example of a top view and a cross-sectional view of a semiconductor package according to a first embodiment of the present technology.

FIG. 1 is an example of a top view and a cross-sectional view of a semiconductor package 100 according to a first embodiment of the present technology. (a) in the drawing is an example of a top view of the semiconductor package 100. (b) in the drawing is an example of a cross-sectional view taken along line segment B1-B2 of (a) in the drawing, and (c) in the drawing is an example of a cross-sectional view taken along line segment C1-C2 of (a) in the drawing.

The semiconductor package 100 includes semiconductor chips 110, 111, a sealing resin 120, a wiring layer 130, and an external terminal 140. The semiconductor package 100 is further provided with a heat conductive member and a heat dissipation member to be described later.

Further, hereinafter, a predetermined axis parallel to the chip plane of the semiconductor chips 110, 111 is referred to as an "X axis", and an axis perpendicular to the chip plane is referred to as a "Z axis". An axis perpendicular to the X axis and the Z axis is referred to as a "Y axis". (b) and (c) in the drawing are cross-sectional views when viewed from the Y-axis direction.

The semiconductor chips 110, 111 are rectangular chips mounted on the wiring layer 130. In the drawing, the semiconductor chips 110, 111 are arranged in the X-axis direction. Further, one of both surfaces of each of the semiconductor chips 110, 111 is a circuit surface on which a circuit is disposed. With these circuit surfaces taken as front surfaces, the front surface sides are mounted on the wiring layer 130. The method of mounting the front surface side of the semiconductor chip in this manner is called a face-down mounting method. Note that the semiconductor chips 110, 111 are examples of first and second semiconductor chips described in the claims.

Each of the front surface of the semiconductor chip 110 or the like and the back surface with respect to the front surface may be simply referred to as a "chip plane". In addition, hereinafter, the front surface side of each of the semiconductor chips 110, 111 is referred to as a lower side, and the back surface side with respect to the front surface is referred to as an upper side.

The sealing resin 120 is a resin for sealing the semiconductor chips 110, 111. The sealing resin 120 is formed around the semiconductor chips 110, 111. Note that the sealing resin 120 is an example of a first sealing resin described in the claims.

Further, as illustrated in (a) of the drawing, openings 128, 129 are formed in the sealing resin 120. In addition, the thick dotted line in the drawing indicates the outer peripheries of the semiconductor chips 110, 11.

The opening 128 is formed in the upper portion of the semiconductor chip 110, and the area thereof is smaller than that of the back surface of the semiconductor chip 110. Thus, a part of the back surface (chip plane) of the semiconductor chip 110 is exposed by the opening 128. In addition, the opening 129 is formed in the upper portion of the semiconductor chip 111, and the area thereof is smaller than that of the back surface of the semiconductor chip 111. Thus, a part of the back surface of the semiconductor chip 111 is exposed by the opening 129. Note that the openings 128, 129 are examples of first and second openings described in the claims.

Further, in the sealing resin 120, notches 121, 122, 123 are formed by partially cutting the resin, adjacent to a part of the outer peripheries of the openings 128, 129. For example, the notches 121 to 123 are formed by cutting in a strip shape along the X-axis direction from portions Y1 to Y2 of the outer peripheries of the openings 128, 129. The notch 121 is formed on the left side of the opening 128, and the notch 122 is formed between the openings 128, 129. The notch 123 is formed on the right side of the opening 129. Note that the notches 121, 123 are examples of a first notch described in the claims, and the notch 122 is an example of a second notch described in the claims.

In addition, when portions of the notches 121, 123 adjacent to the outer peripheries of the openings 128, 129 are set as starting ends, the terminal end on the opposite side has an arc shape. Note that the shape of the terminal end may not be an arc but a pair of right angles. In addition, the shapes and the number of notches such as the notches 121 to 123 are not limited to those illustrated in the drawing. For example, the notch 121 and the like can be formed in regions surrounding the outer peripheries of the opening 128 or 129.

As illustrated in (b) of the drawing, the semiconductor chips 110, 111 are stacked on the upper portion of the wiring layer 130. In addition, a predetermined number of external terminals 140 are formed on the lower portion the wiring layer 130. In addition, the notches 121 to 123 do not penetrate the sealing resin 120 and each have a length in the Z-axis direction (in other words, depth) smaller than the length of the sealing resin 120 in the Z-axis direction (in other words, thickness). Therefore, in the cross-section along line segment B1-B2 passing through the notches 121 to 123, stages are generated around the semiconductor chips 110, 111 by the notches 121 to 123.

On the other hand, as illustrated in (c) of the drawing, no stage is generated in the sealing resin 120 in the cross-section along line segment C1-C2 that does not pass through the notches 121 to 123.

Note that although the semiconductor chips 110, 111 are mounted, three or more semiconductor chips can be mounted on the semiconductor package 100.

Figure 2:
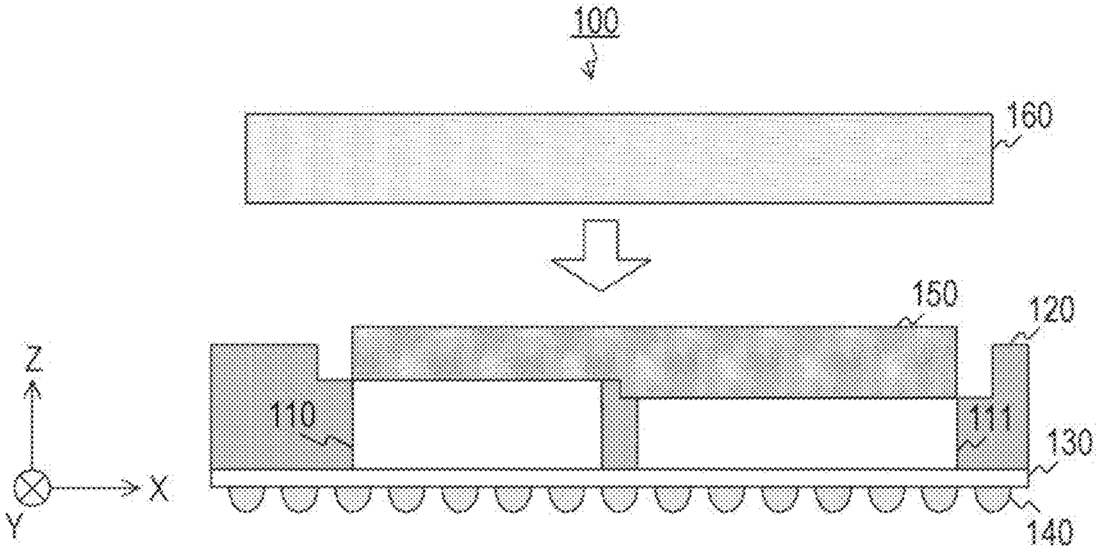
FIG. 2 is an example of a cross-sectional view of the semiconductor package before and after mounting of a heat dissipation member according to the first embodiment of the present technology.
Figure 2:
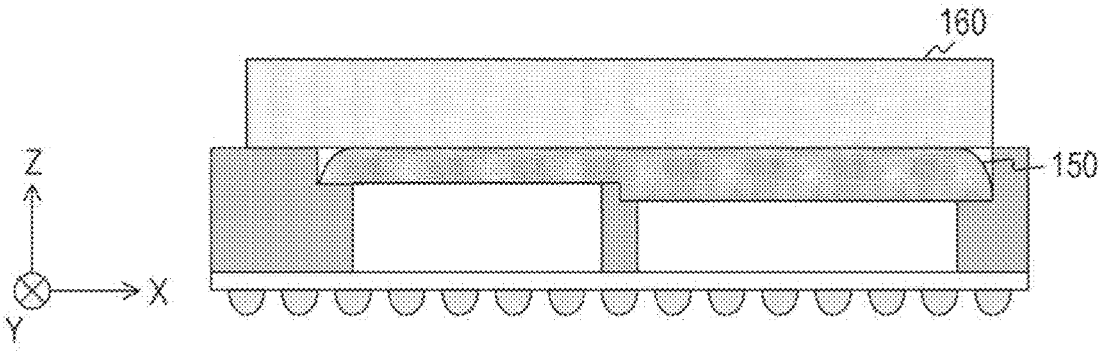

FIG. 2 is an example of a cross-sectional view of the semiconductor package 100 before and after mounting of a heat dissipation member 160 according to the first embodiment of the present technology. (a) in the drawing is an example of a cross-sectional view of the semiconductor package 100 before the mounting of the heat dissipation member 160. (b) in the drawing is an example of a cross-sectional view of the semiconductor package 100 after the mounting of the heat dissipation member 160. The semiconductor package 100 on which the heat dissipation member 160 is mounted on a substrate (not illustrated) in the semiconductor device.

As illustrated in (a) of the drawing, a heat conductive member 150 is applied to the upper portions of the semiconductor chips 110, 111 before the mounting of the heat dissipation member 160. The heat conductive member 150 is a member that brings the heat dissipation member 160 into close contact with the semiconductor chips 110, 111 and conducts heat generated in the semiconductor chips 110, 111 to the heat dissipation member 160. As the heat conductive member 150, for example, a silicone-based member (silicone oil, etc.) is used.

In addition, as the heat conductive member 150, a phase change material that melts at the operating temperatures of the semiconductor chips 110, 111 can also be used. As the phase change material, for example, one or more low melting point metals selected from the group consisting of gallium (Ga), indium (In), and tin (Sn) are used. Alternatively, a so-called phase change metallic alloy (FCMA), such as an alloy containing one or more kinds of these low melting point metals, is used as the phase change material. Specific examples of the alloy include In—Ag, Sn—Ag—Cu, and In—Sn—Bi.

Further, the heat dissipation member 160 is a member for releasing heat generated in the semiconductor chips 110, 111 to the outside. As the heat dissipation member 160, a heat sink, a heat pipe, or the like is used.

In a case where the heat conductive member 150 is a member having low viscosity (silicone-based member, etc.), as illustrated in (b) of the drawing, when the heat dissipation member 160 is mounted, pressure is applied to the heat conductive member 150 due to contact with the heat dissipation member 160, and the heat conductive member 150 spreads on the back surface. However, with the stage generated in the sealing resin 120 by each of the notches 121, 123, the heat conductive member 150 is blocked by the stage, and the heat conductive member 150 does not flow out from the back surfaces of the semiconductor chips 110, 111. By preventing the outflow of the heat conductive member 150, the reliability of the operation of the semiconductor package 100 can be improved.

In addition, in a case where the heat conductive member 150 is a phase change material, the heat conductive member 150 spreads on the back surface at the time of melting, but similarly, the outflow of the heat conductive member 150 is prevented by the stage. Note that the notches 121 to 123 are examples of an outflow prevention part described in the claims.

In addition, the heat conductive member 150 moves from one back surface to the other back surface of each of the semiconductor chips 110, 111 by the notch 122 between the semiconductor chips 110, 111. This makes it possible to equalize the height of the heat conductive member 150 on each of the upper portions of the semiconductor chips 110, 111.

Here, a semiconductor package having a structure without the notches 121 to 123 is assumed as a comparative example.

Figure 3:
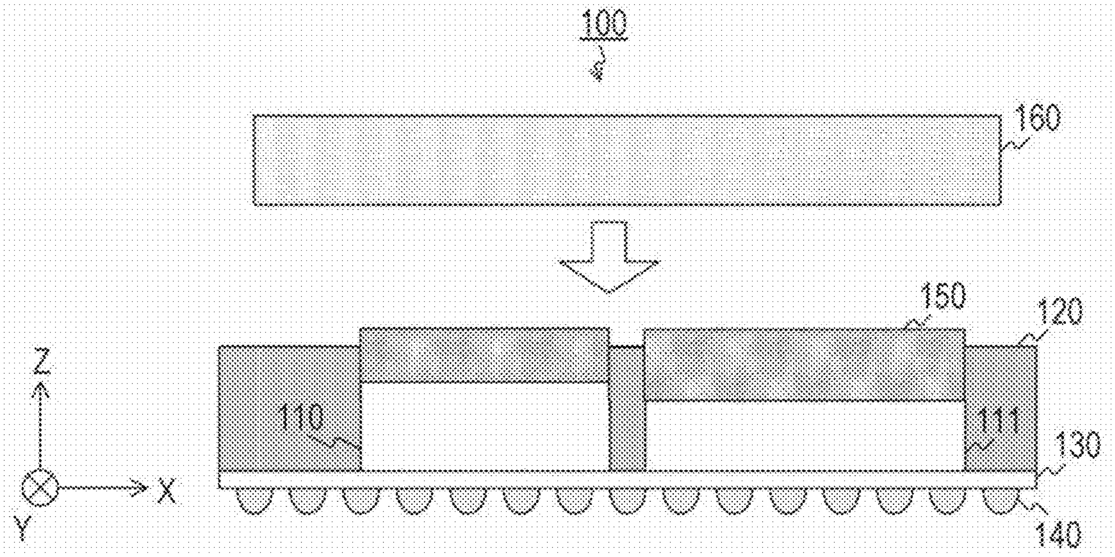
FIG. 3 is an example of a cross-sectional view of a semiconductor package before and after mounting of a heat dissipation member in a comparative example.
Figure 3:
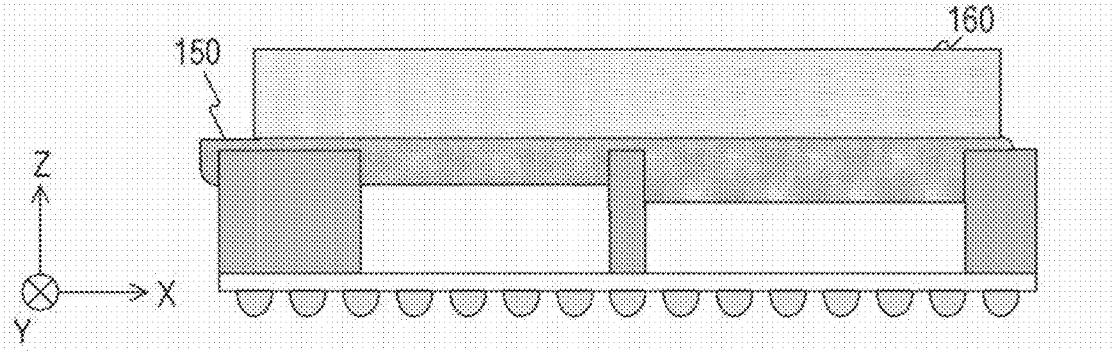

FIG. 3 is an example of a cross-sectional view of the semiconductor package 100 before and after the mounting of the heat dissipation member 160 in the comparative example. (a) in the drawing is an example of a cross-sectional view of the semiconductor package 100 before the mounting of the heat dissipation member 160. (b) in the drawing is an example of a cross-sectional view of the semiconductor package 100 after the mounting of the heat dissipation member 160.

As illustrated in (a) of the drawing, in the comparative example, there is no stage in the sealing resin 120 because the notches 121 to 123 are not formed.

Therefore, as illustrated in (b) of the drawing, when the heat dissipation member 160 is mounted, pressure is applied to the heat conductive member 150 due to contact with the heat dissipation member 160, and the heat conductive member 150 flows out from the back surfaces of the semiconductor chips 110, 111. When the flowed-out heat conductive member 150 comes into contact with a peripheral terminal, component, or element, a defect may occur in its electrical connectivity. In particular, when the heat conductive member has conductivity, a short circuit may occur. Due to this defect in electrical connectivity, the reliability of the operation of the semiconductor device decreases.

Forming the notches 121 to 123 can prevent the outflow of the heat conductive member 150. Note that it is also possible to implement the prevention of the outflow by using a member with sufficiently high viscosity as the heat conductive member 150, but this is not preferable because the physical properties of the heat conductive member 150 are limited.

Example of Method for Manufacturing Semiconductor Package

Figure 4:
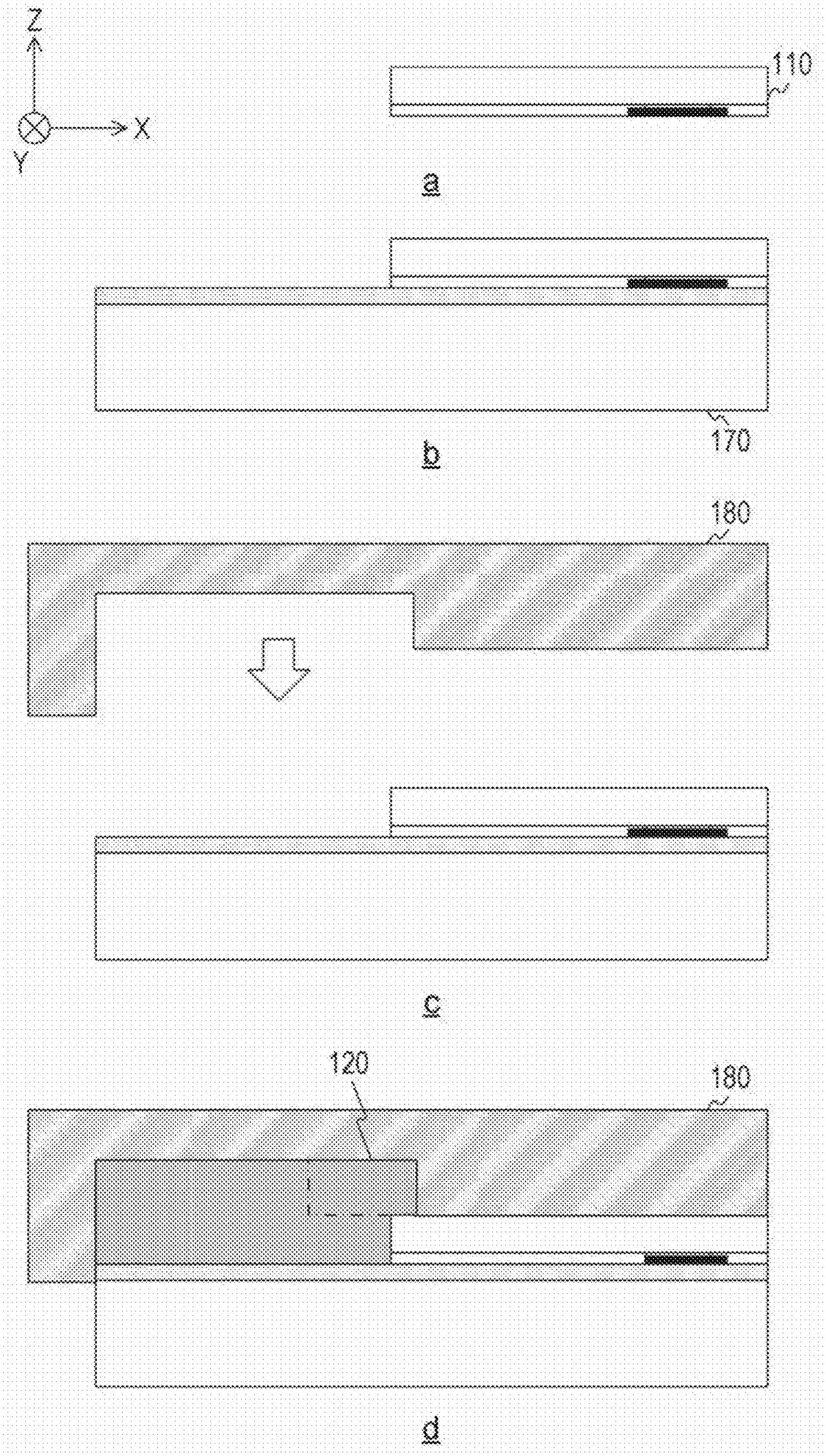
FIG. 4 is a view illustrating an example of a method for manufacturing the semiconductor package up to formation of a sealing resin according to the first embodiment of the present technology.

FIG. 4 is a view illustrating an example of a method for manufacturing the semiconductor package up to the formation of the sealing resin 120 according to the first embodiment of the present technology. As illustrated in (a) of the drawing, first, the manufacturing system manufactures a semiconductor chip (semiconductor chip 110, etc.) to be mounted.

Next, the manufacturing system attaches the semiconductor chip to a support 170 as illustrated in (b) of the drawing, and sets a sealing jig 180 as illustrated in (c) of the drawing. Details of the shape of the sealing jig 180 will be described later. Then, as illustrated in (d) of the drawing, the manufacturing system fills a space in the sealing jig 180 with the sealing resin 120.

Figure 5:
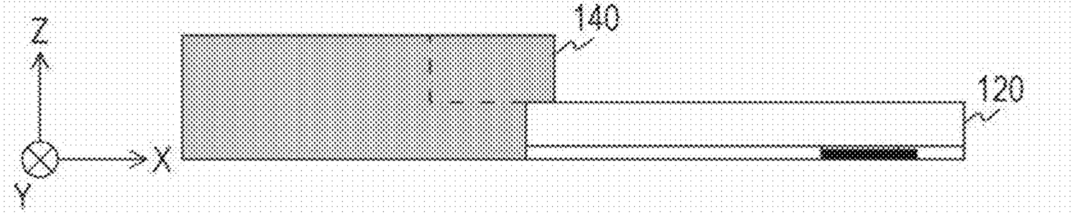
FIG. 5 is a view illustrating an example of a method for manufacturing the semiconductor package up to formation of an external terminal according to the first embodiment of the present technology.
Figure 5:
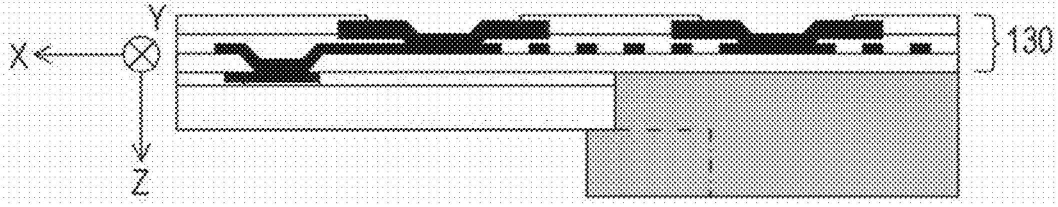
Figure 5:
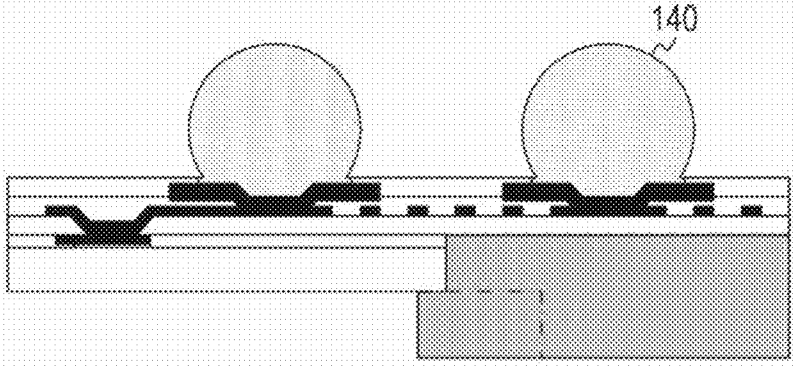

FIG. 5 is a view illustrating an example of a method for manufacturing the semiconductor package 100 up to the formation of the external terminal 140 according to the first embodiment of the present technology. The manufacturing system removes the support 170 as illustrated in (a) of the drawing, and forms the wiring layer 130 as illustrated in (b) of the drawing. Then, as illustrated in (c) of the drawing, the manufacturing system forms the external terminal 140 on the wiring layer 130, and performs a subsequent step such as the mounting of the heat dissipation member 160.

Configuration Example of Sealing Jig

Figure 6:
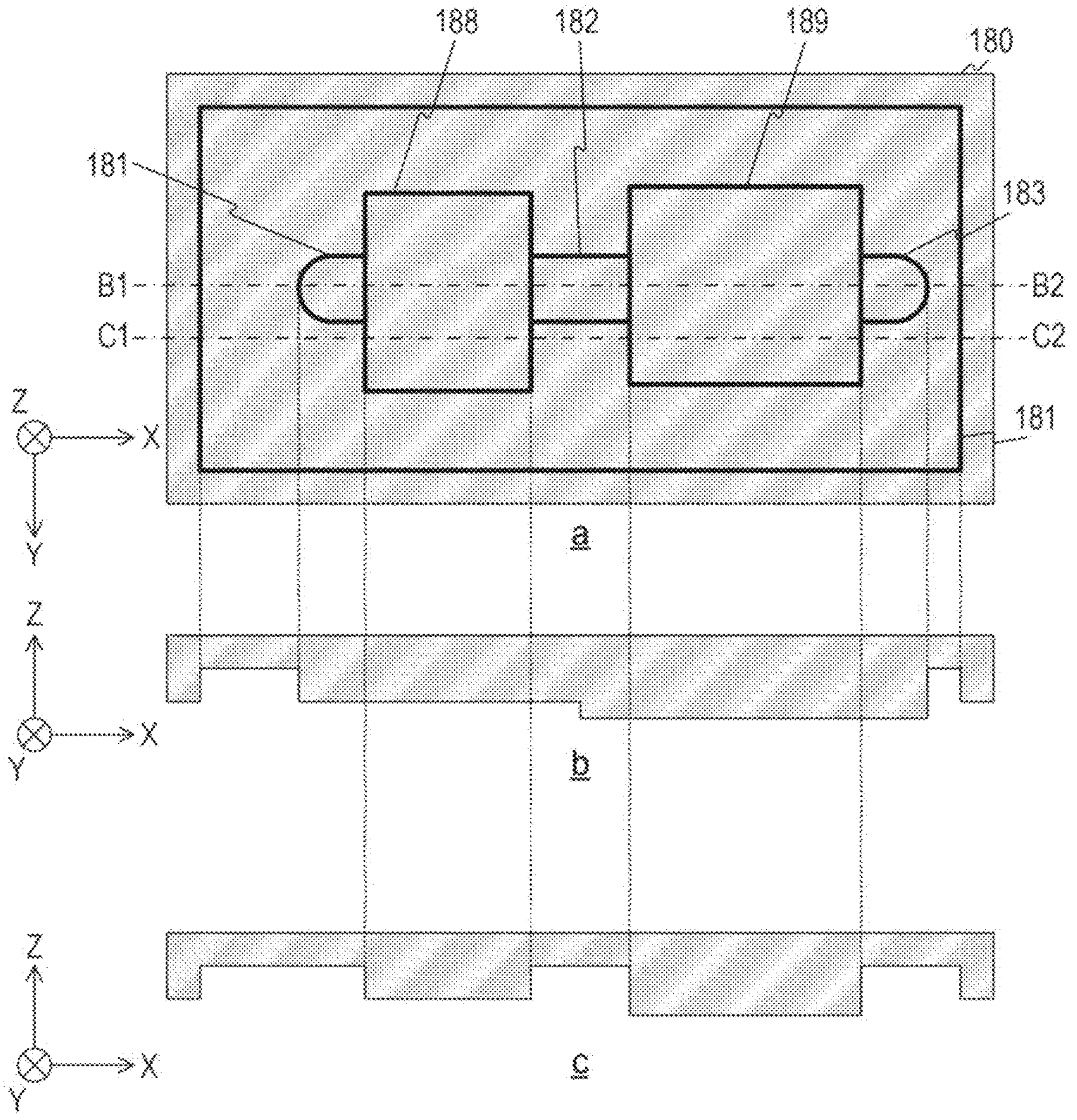
FIG. 6 is a view illustrating an example of a bottom view and a cross-sectional view of a sealing jig according to the first embodiment of the present technology.

FIG. 6 is a view illustrating an example of a bottom view and a cross-sectional view of the sealing jig 180 according to the first embodiment of the present technology. (a) in the drawing is an example of a bottom view of the sealing jig 180. (b) in the drawing is an example of a cross-sectional view taken along line segment B1-B2 of (a) in the drawing, and (c) in the drawing is an example of a cross-sectional view taken along line segment C1-C2 of (a) in the drawing.

As illustrated in (a) of the drawing, protrusions 181, 182, 183, 188, 189 are formed on the sealing jig 180. The protrusions 188, 189 are rectangular when viewed from the Z-axis direction, and openings 128, 129 are formed in the sealing resin 120 by the protrusions 188, 189.

As illustrated in (a), (b), and (c) of the drawing, the protrusions 181 to 183 are formed adjacent to the rectangular protrusions 188, 189, and the thicknesses thereof are smaller than those of the protrusions 188, 189. These protrusions 181 to 183 form notches 121 to 123.

Figure 7:
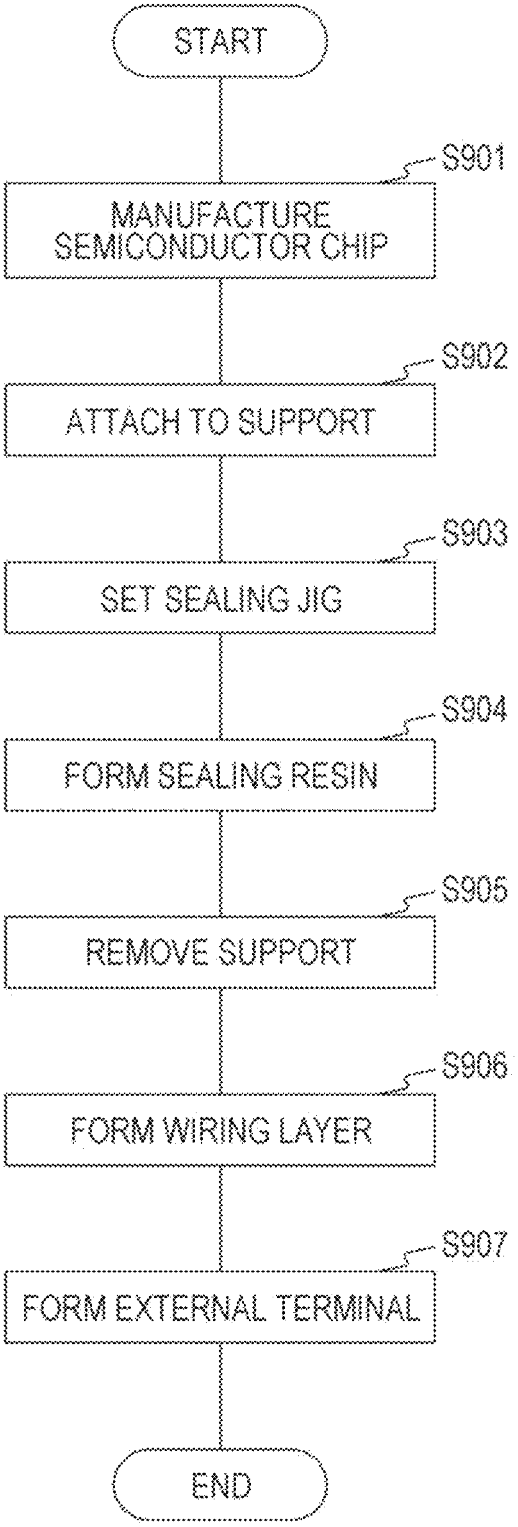
FIG. 7 is a flowchart illustrating an example of a method for manufacturing the semiconductor package according to the first embodiment of the present technology.

FIG. 7 is a flowchart illustrating an example of the method for manufacturing the semiconductor package according to the first embodiment of the present technology. The manufacturing system manufactures a semiconductor chip (step S901). The manufacturing system attaches the semiconductor chip to the support 170 (step S902), and sets the sealing jig 180 (step S903).

Then, as illustrated in (d) of the drawing, the manufacturing system forms the sealing resin 120 (step S904). The manufacturing system removes the support 170 (step S905) and forms the wiring layer 130 (step S906). Then, the manufacturing system forms the external terminal 140 on the wiring layer 130 (step S907), performs a subsequent step such as the mounting of the heat dissipation member 160, and ends the manufacturing of the semiconductor package 100.

As described above, according to the first embodiment of the present technology, due to the formation of the notches 121 to 123 in the sealing resin 120, the outflow of the heat conductive member 150 can be prevented.

First Modification

In the first embodiment of the present technology described above, the plurality of semiconductor chips has been mounted on the semiconductor package 100, but one semiconductor chip can also be mounted. A semiconductor package 100 according to a first modification of the first embodiment differs from the first embodiment in that only a semiconductor chip 110 is mounted.

Figure 8:
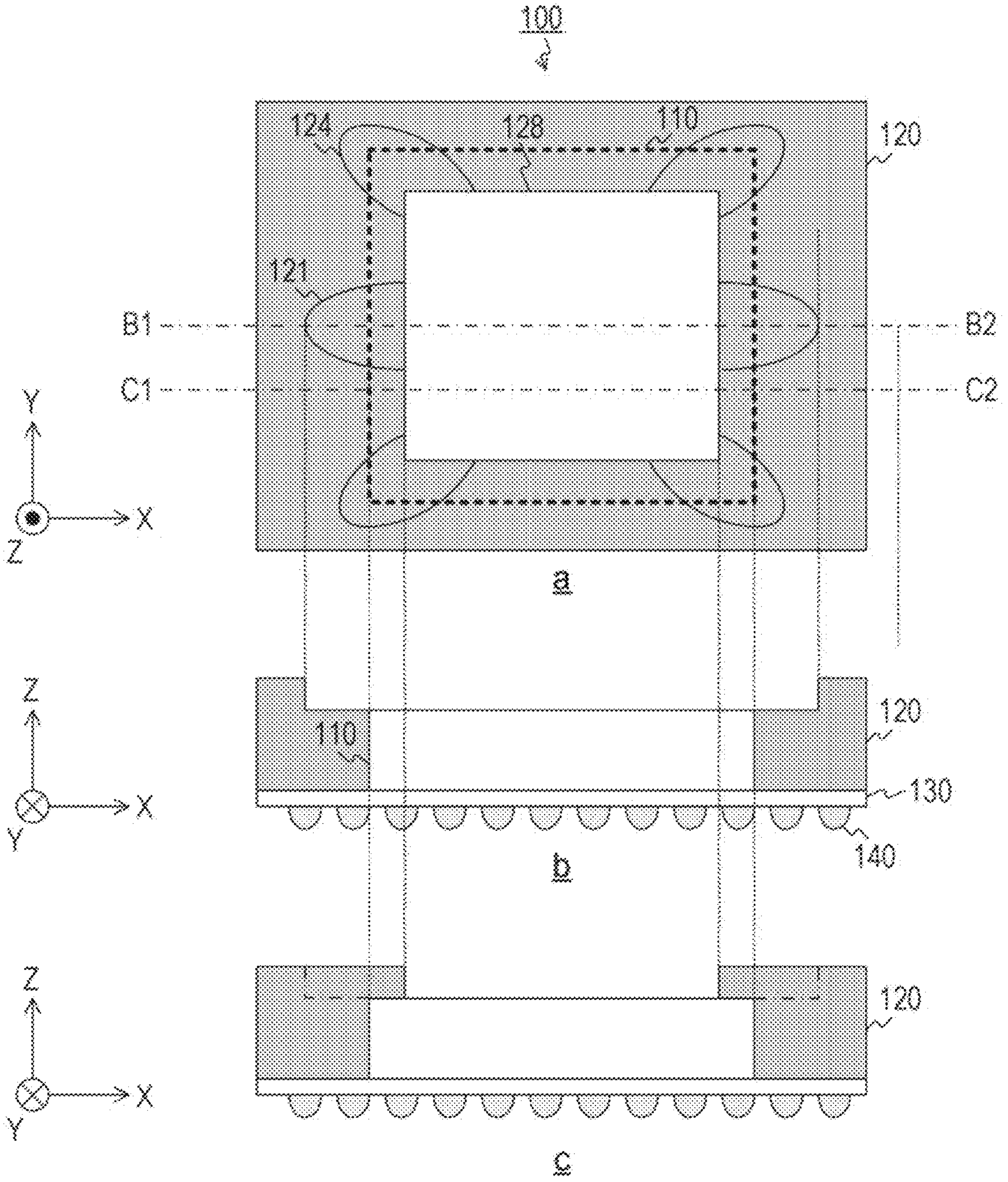
FIG. 8 is an example of a top view and a cross-sectional view of a semiconductor package according to a first modification of the first embodiment of the present technology.

FIG. 8 is an example of a top view and a cross-sectional view of the semiconductor package 100 according to the first modification of the first embodiment of the present technology. (a) in the drawing is an example of a top view of the semiconductor package 100. (b) in the drawing is an example of a cross-sectional view taken along line segment B1-B2 of (a) in the drawing, and (c) in the drawing is an example of a cross-sectional view taken along line segment C1-C2 of (a) in the drawing.

As illustrated in (a), (b), and (c) of the drawing in (a), (b), and (c) of the drawing, the semiconductor package 100 according to the first modification of the first embodiment differs from the first embodiment in that only the semiconductor chip 110 is mounted.

Further, in addition to the notch (such as the notch 121) extending in the X-axis direction, notches (such as a notch 124) extending obliquely from the four corners of the opening 128 are further formed.

As described above, according to the first modification of the first embodiment of the present technology, since only the semiconductor chip 110 is mounted, the circuit scale and size can be reduced more than in a case where two semiconductor chips are mounted.

Second Modification

In the first modification of the first embodiment of the present technology described above, a part of the back surface of the semiconductor chip 110 has been exposed by the opening 128, but this configuration may result in an insufficient amount of heat dissipated. A semiconductor package 100 according to a second modification of the first embodiment differs from the first modification of the first embodiment in that the entire back surface is exposed to increase the amount of heat dissipated.

Figure 9:
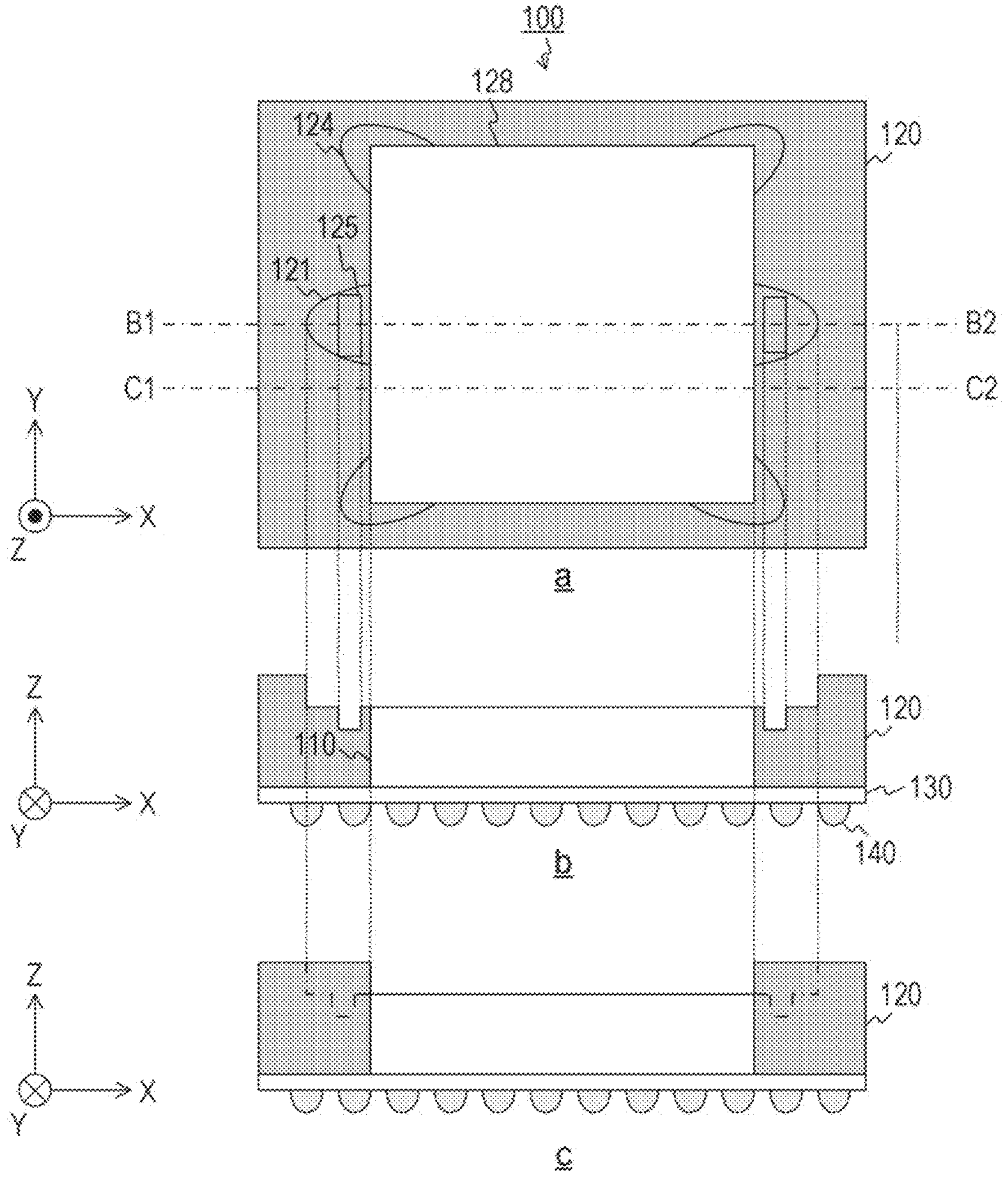
FIG. 9 is an example of a top view and a cross-sectional view of a semiconductor package according to a second modification of the first embodiment of the present technology.

FIG. 9 is an example of a top view and a cross-sectional view of the semiconductor package 100 according to the second modification of the first embodiment of the present technology. (a) in the drawing is an example of a top view of the semiconductor package 100. (b) in the drawing is an example of a cross-sectional view taken along line segment B1-B2 of (a) in the drawing, and (c) in the drawing is an example of a cross-sectional view taken along line segment C1-C2 of (a) in the drawing.

As illustrated in (a), (b), and (c) of the drawing, the semiconductor package 100 according to the second modification of the first embodiment differs from the first modification of the first embodiment in that the entire back surface of a semiconductor chip 110 is exposed. By exposing the whole of the back surface, the amount of heat dissipated can be increased more than in a case where a part thereof is exposed.

In addition, in the second modification of the first embodiment, a trench 125 is formed in the notch 121. The trench 125 facilitates the filling of the heat conductive member 150.

As described above, according to the second modification of the first embodiment of the present technology, since the entire back surface of the semiconductor chip 110 is exposed, the amount of heat dissipated can be increased.

2. Second Embodiment

In the first embodiment of the present technology described above, the notch 121 and the like have been formed in the semiconductor package 100 on which the semiconductor chip is mounted face down, but the notch can also be formed in a semiconductor package on which the semiconductor chip is mounted face up. A semiconductor package 200 of a second embodiment differs from the first embodiment in that a semiconductor chip is mounted face up.

Figure 10:
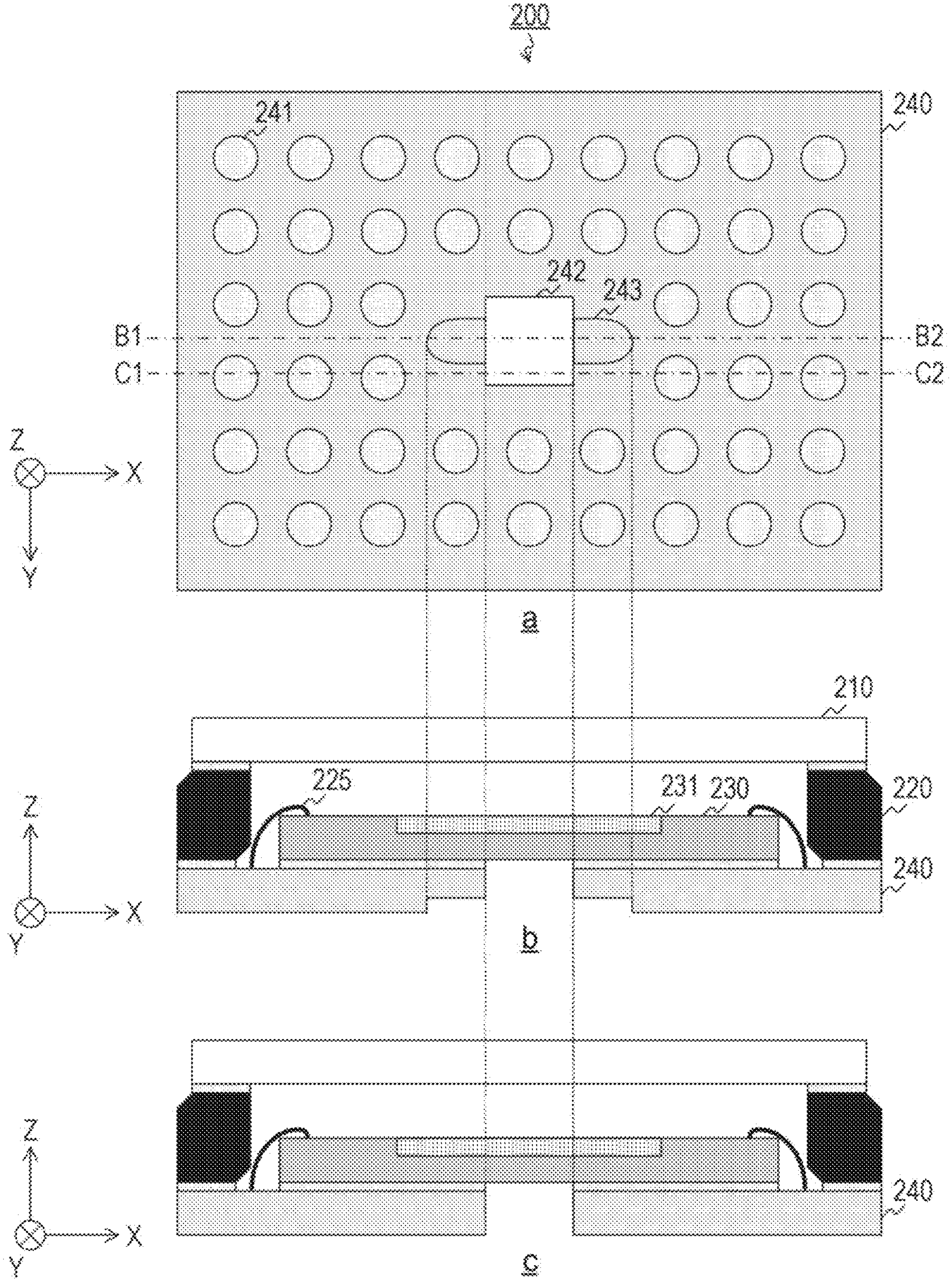
FIG. 10 is an example of a bottom view and a cross-sectional view of a semiconductor package according to a second embodiment of the present technology.

FIG. 10 is an example of a bottom view and a cross-sectional view of the semiconductor package 200 according to the second embodiment of the present technology. (a) in the drawing is an example of the bottom view of the semiconductor package 200. (b) in the drawing is an example of a cross-sectional view taken along line segment B1-B2 of (a) in the drawing, and (c) in the drawing is an example of a cross-sectional view taken along line segment C1-C2 of (a) in the drawing.

The semiconductor package 200 of the second embodiment includes a sealing glass 210, a semiconductor chip 230, and a substrate 240. One of both surfaces of the semiconductor chip 230 is a light-receiving surface on which a light receiver 231 is formed. In the light receiver 231, for example, a plurality of pixels that generates a pixel signal by photoelectric conversion is arranged. For example, a solid-state image sensor is used as the semiconductor chip 230.

Further, when the light-receiving surface of the semiconductor chip 230 is the front surface, the back surface with respect to the front surface is mounted on the substrate 240. In addition, the front surface side is defined as the upper side, and the back surface side is defined as the lower side. The method of mounting the semiconductor chip with the front surface up in this manner is called a face-up mounting method.

Note that in a case where the semiconductor chip 230 (solid-state image sensor) is a front surface illumination type, the "front surface" in the front surface illumination type coincides with the "front surface" in the face-up mounting. On the other hand, in a case where the semiconductor chip 230 is a back surface illumination type, the "back front surface" in the back-illuminated type corresponds to the "front surface" in the face-up mounting. Hereinafter, the light-receiving surface is referred to as the "front surface" regardless of the front surface illumination type and the back surface illumination type.

As illustrated in (a) of the drawing, a predetermined number of external terminals 241, an opening 242, and notches such as a notch 243 are formed in the substrate 240. The opening 242 is located immediately below the light receiver 231. The notches are formed along the X-axis direction adjacent to a part of the outer periphery of the opening 242.

As illustrated in (b) of the drawing, a part of the back surface of the semiconductor chip 230 is exposed by the opening 242. In addition, the notch does not penetrate the substrate 240, and the length (depth) of the notch in the Z-axis direction is smaller than the length (thickness) of the substrate 240 in the Z-axis direction. Hence a stage is generated in the substrate 240 in the cross-section along line segment B1-B2 passing through the notch.

On the other hand, as illustrated in (c) of the drawing, no stage is generated in the substrate 240 in the cross-section along line segment C1-C2 that does not pass through the notch.

Figure 11:
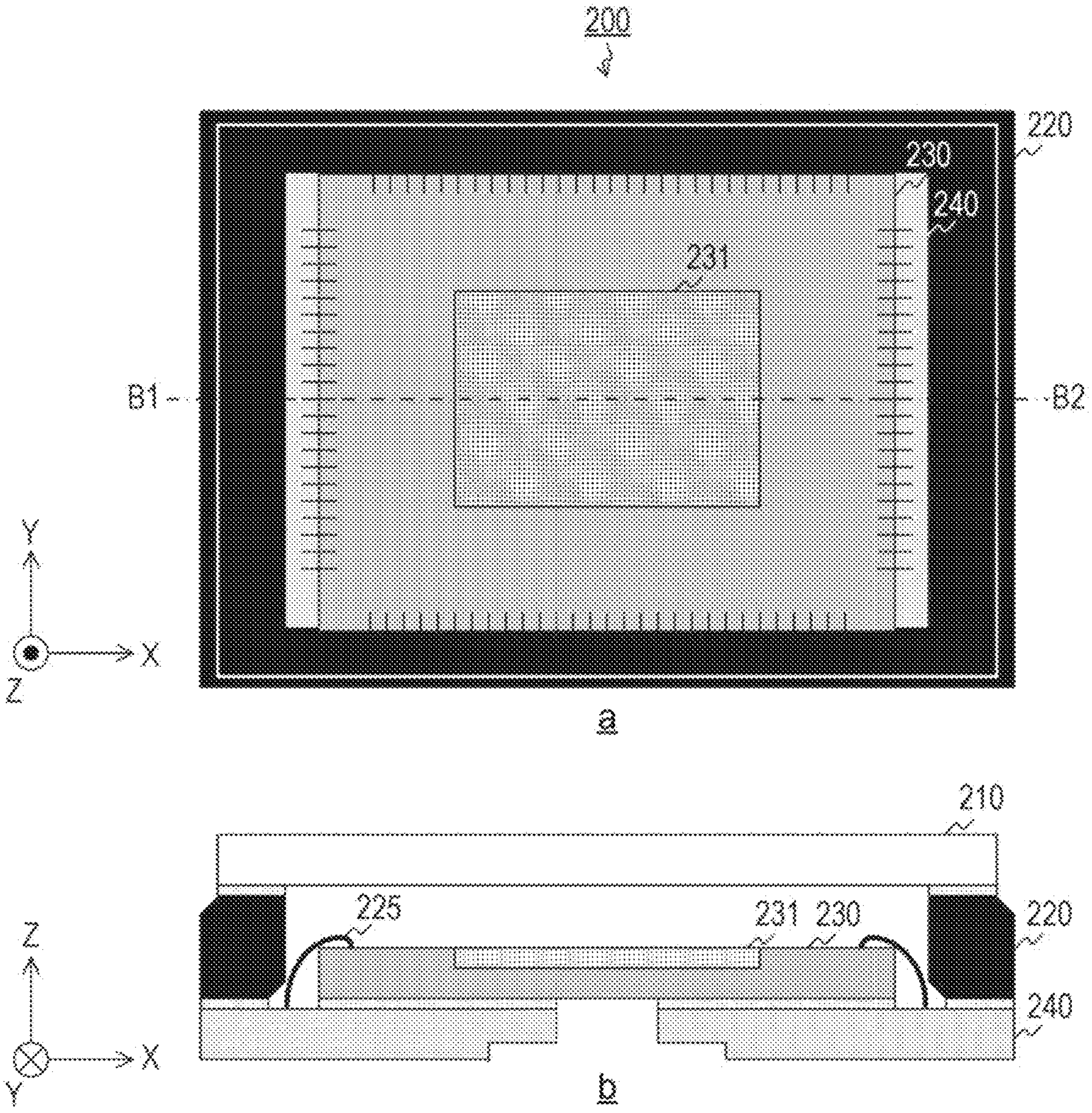
FIG. 11 is an example of a top view and a cross-sectional view of the semiconductor package according to the second embodiment of the present technology.

FIG. 11 is an example of a top view and a cross-sectional view of the semiconductor package 200 according to the second embodiment of the present technology. (a) in the drawing is an example of a top view of the semiconductor package 200. (b) in the drawing is an example of a cross-sectional view taken along line segment B1-B2 of (a) in the drawing. A white frame in (a) of the drawing indicates the outer periphery of the sealing glass 210.

As illustrated in (a) and (b) of the drawing, the lower surface of the semiconductor chip 230 is bonded to the substrate 240 with an adhesive or the like. In addition, the front surface of the semiconductor chip 230 is electrically connected to the substrate 240 by a plurality of wires 225. A frame 220 is provided around the semiconductor chip 230, and a sealing glass 210 is mounted on the upper portion of the frame 220.

Figure 12:
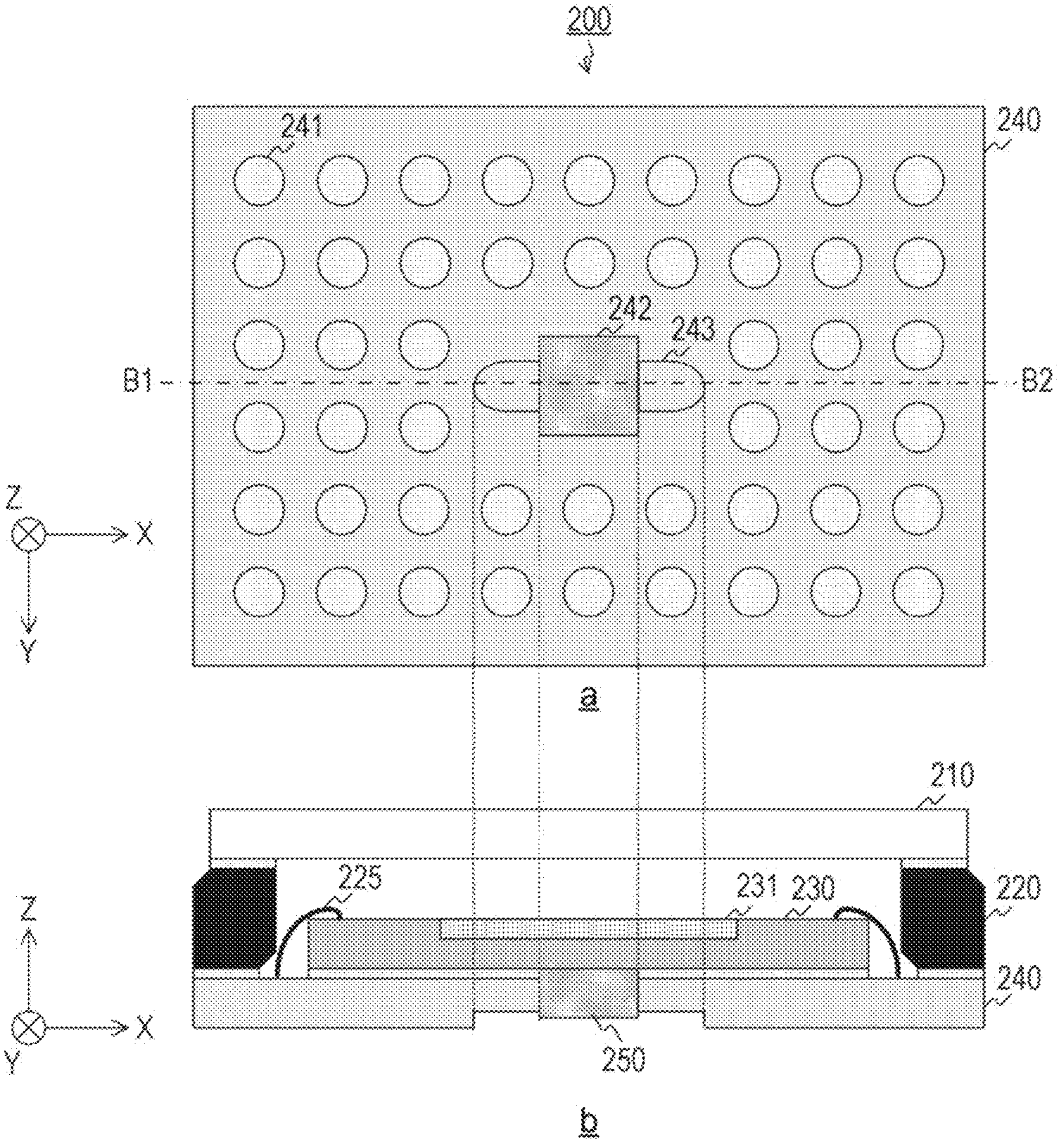
FIG. 12 is an example of a bottom view and a cross-sectional view of the semiconductor package before mounting of a heat dissipation member according to the second embodiment of the present technology.

FIG. 12 is an example of a bottom view and a cross-sectional view of the semiconductor package before mounting of a heat dissipation member 260 according to the second embodiment of the present technology. As illustrated in the drawing, a heat conductive member 250 is applied to the back surface of the semiconductor chip 230 via the opening 242 before the mounting of the heat dissipation member 260.

Figure 13:
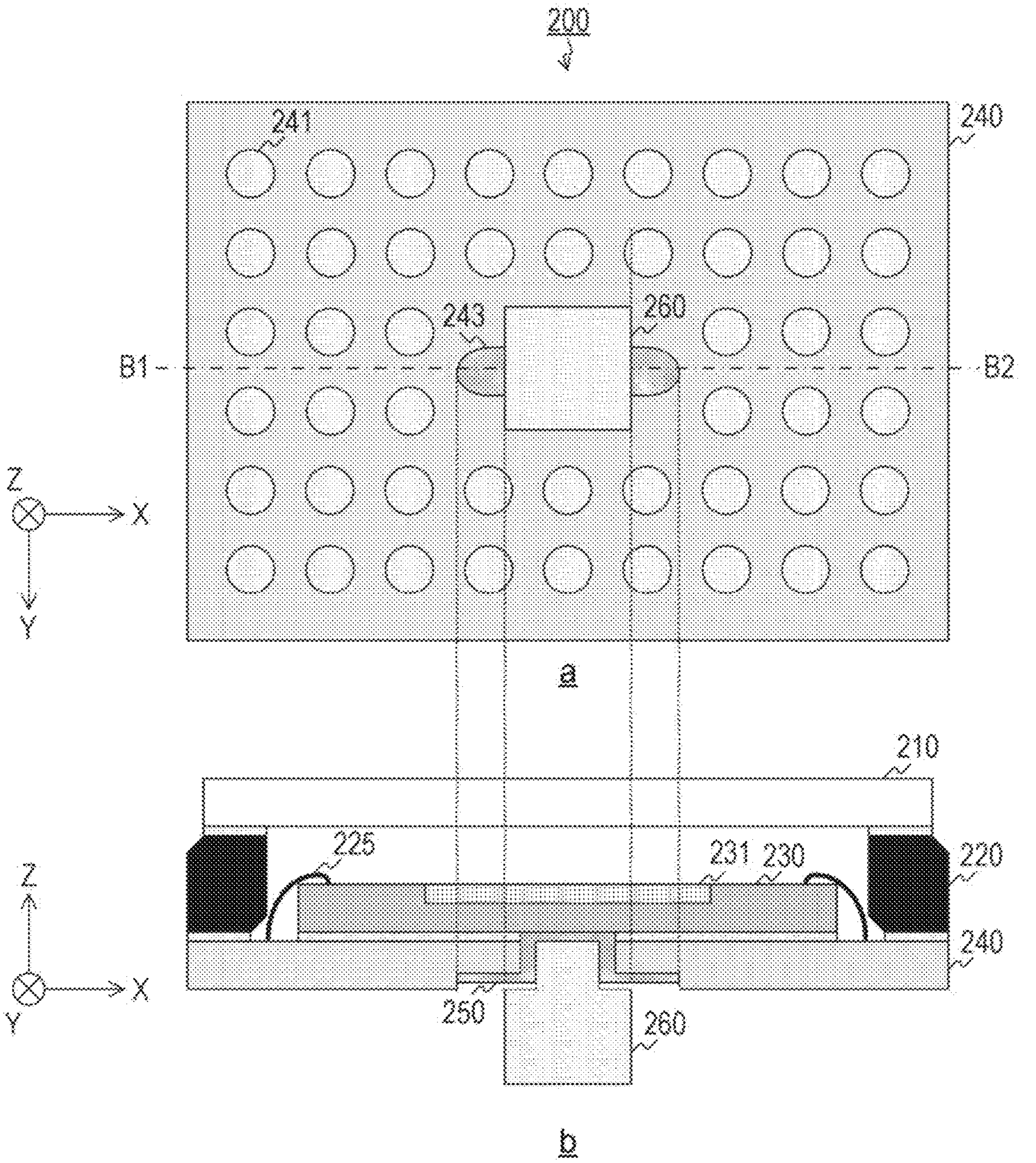
FIG. 13 is an example of a bottom view and a cross-sectional view of the semiconductor package after mounting of a heat dissipation member according to the second embodiment of the present technology.

FIG. 13 is an example of a bottom view and a cross-sectional view of the semiconductor package 200 after the mounting of the heat dissipation member 260 according to the second embodiment of the present technology. The semiconductor package 200 on which the heat dissipation member 260 is mounted on a substrate (not illustrated) in the semiconductor device.

As illustrated in the drawing, with a stage generated in the substrate 240 due to a notch such as the notch 243, it is possible to prevent the outflow of the heat conductive member 150 from the back surface. Note that the notch 243 is an example of an outflow prevention part described in the claims.

Here, a semiconductor package 200 having a structure without a notch is assumed as a comparative example.

Figure 14:
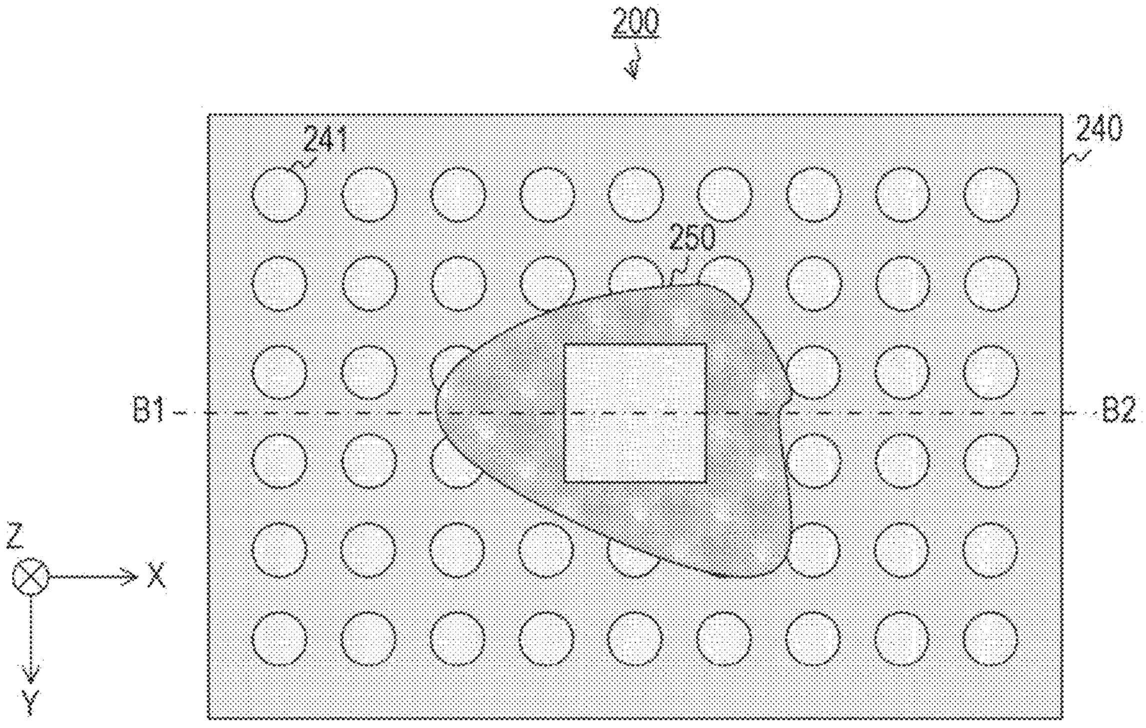
FIG. 14 is an example of a bottom view and a cross-sectional view of a semiconductor package after mounting of a heat dissipation member in a comparative example.
Figure 14:
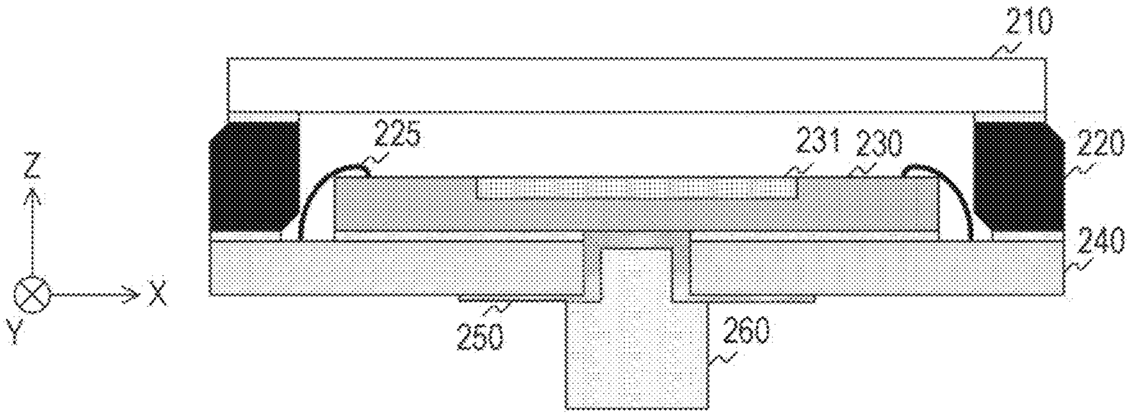

FIG. 14 is an example of a bottom view and a cross-sectional view of a semiconductor package after the mounting of the heat dissipation member in a comparative example. As illustrated in (a) and (b) of the drawing, in the comparative example, there is no stage on the substrate 240 because no notch is formed.

Therefore, when the heat dissipation member 260 is mounted, pressure is applied to the heat conductive member 250 due to contact with the heat dissipation member 260, and the heat conductive member 250 flows out from the back surface of the semiconductor chip 230. When the flowed-out heat conductive member 250 comes into contact with the peripheral external terminal 241, a defect may occur in its electrical connectivity. In particular, when the heat conductive member has conductivity, a short circuit may occur. Due to this defect in electrical connectivity, the reliability of the operation of the semiconductor package 100 decreases.

Forming the notch can prevent the outflow of the heat conductive member 250. Note that it is also possible to implement the prevention of the outflow by using a member with sufficiently high viscosity as the heat conductive member 250, but in that case, there is a concern that the selection of the material of the heat conductive member 250 is restricted.

In addition, it is also possible to implement the prevention of the outflow by optimizing the amount of the heat conductive member 250 applied and manufacturing conditions such as the pressing force, but in that case, there is a concern that the facility capacity is restricted.

Next, a method for manufacturing the semiconductor package 200 will be described.

Figure 15:
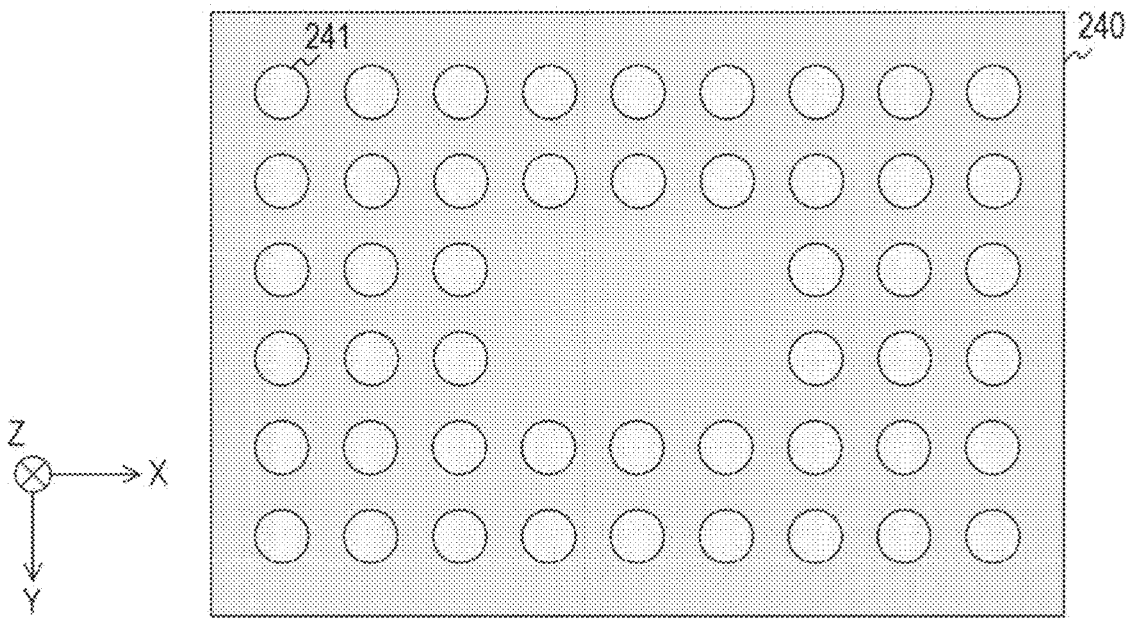
FIG. 15 is an example of a bottom view and a cross-sectional view of a substrate before processing according to the second embodiment of the present technology.
Figure 15:
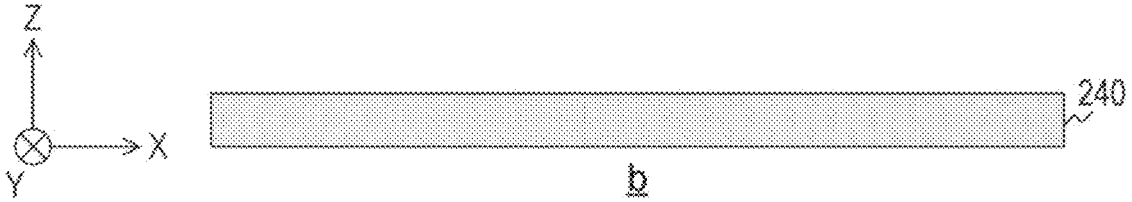

FIG. 15 is an example of a bottom view and a cross-sectional view of the substrate 240 before processing according to the second embodiment of the present technology. As illustrated in the drawing, on the lower surface of the substrate 240, the external terminal 241 is formed with a substantially central portion left.

Figure 16:
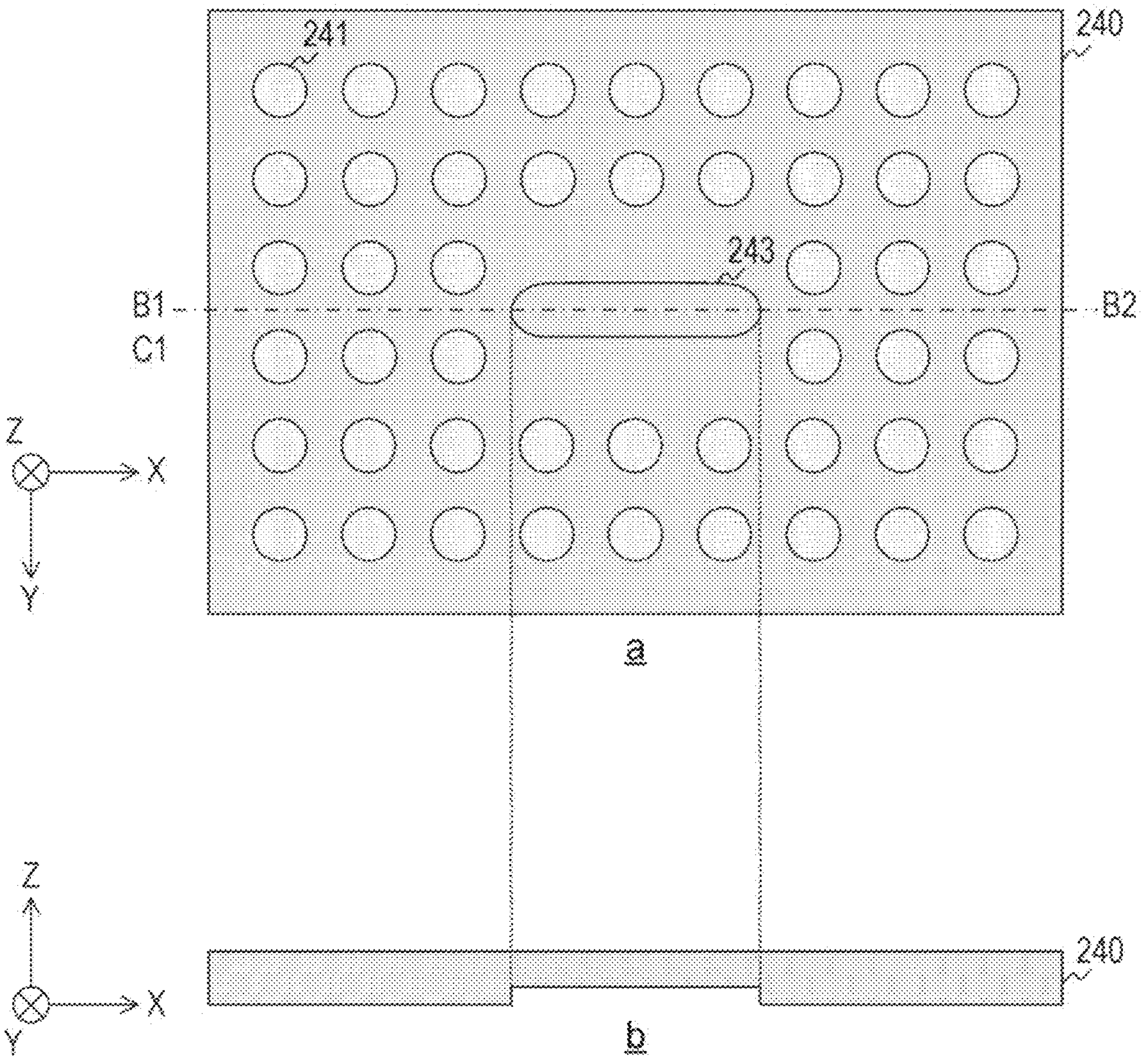
FIG. 16 is an example of a bottom view and a cross-sectional view of the substrate in which a notch is formed according to the second embodiment of the present technology.

FIG. 16 is an example of a bottom view and a cross-sectional view of the substrate 240 in which the notch 243 is formed according to the second embodiment of the present technology. In the substrate 240 after the formation of the external terminal 241, as illustrated in the drawing, the strip-shaped notch 243 is formed along the X-axis direction. The notch 243 is formed by router processing or the like on the base material of the substrate 240. Note that the notch 243 can also be formed by processing a solder resist covering the lower surface of the substrate 240. Further, the notch 243 can also be formed by patterning for a wiring pattern of the substrate 240. Alternatively, the notch 243 can be formed by silk printing. In addition, it is also possible to combine two or more of the processing of the base material, the processing of the solder resist, the patterning for the wiring pattern, and the silk printing.

Figure 17:
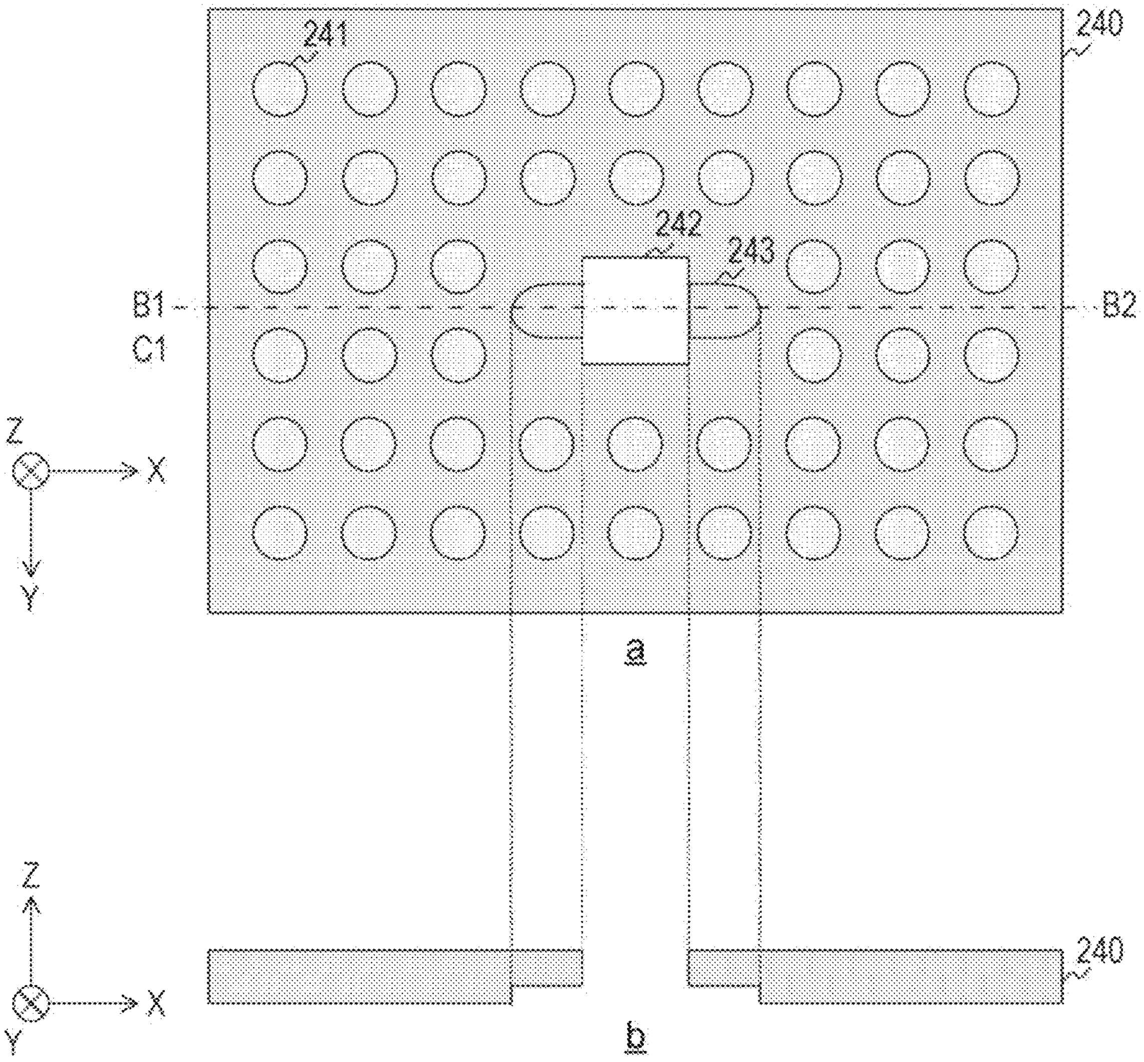
FIG. 17 is an example of a bottom view and a cross-sectional view of the substrate in which an opening is formed according to the second embodiment of the present technology.

FIG. 17 is an example of a bottom view and a cross-sectional view of the substrate 240 in which the opening 242 is formed according to the second embodiment of the present technology. In the substrate 240 after the formation of the notch 243, as illustrated in the drawing, the opening 242 is formed in a substantially central portion by drilling or the like.

Figure 18:
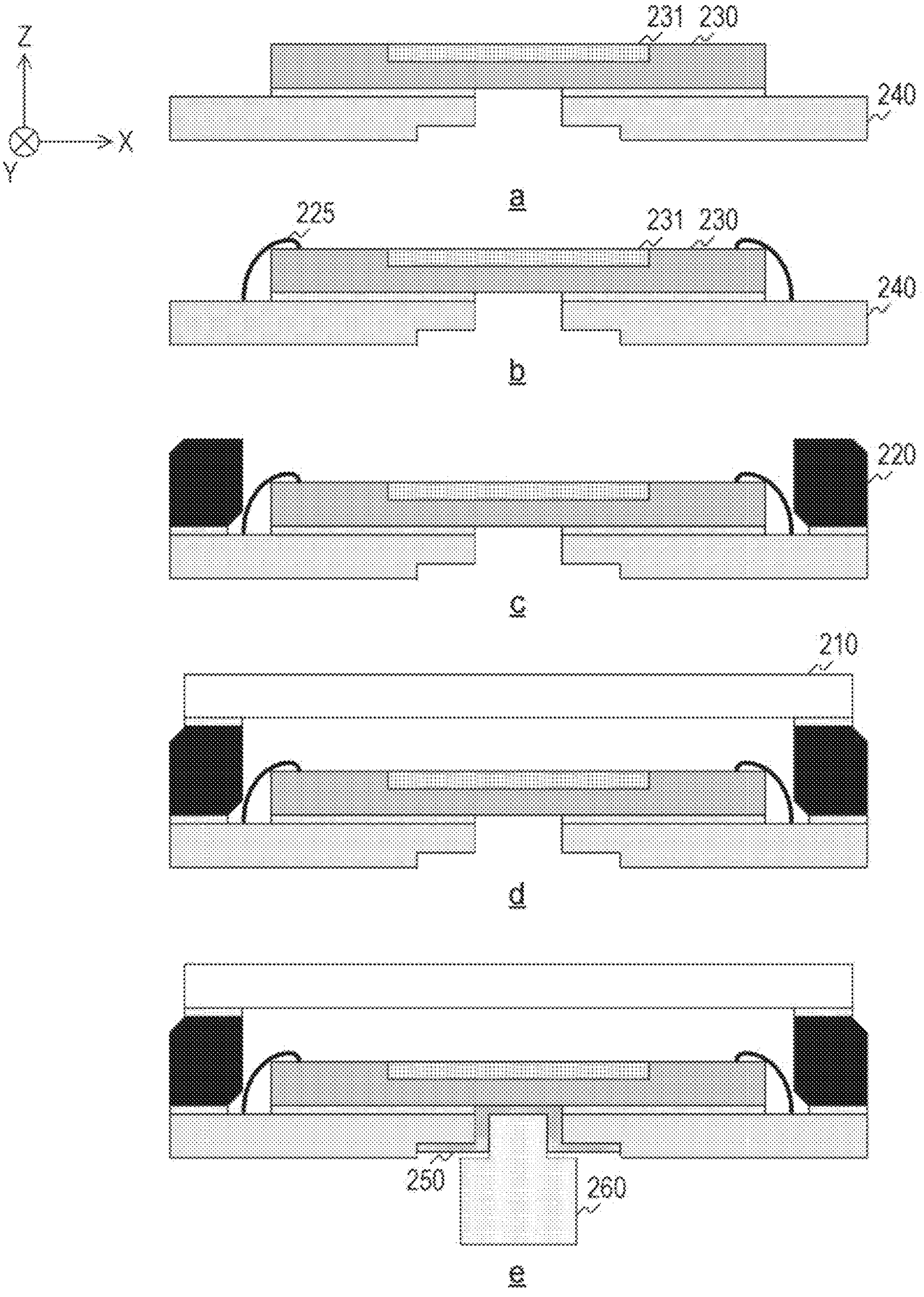
FIG. 18 is a view illustrating an example of a method for manufacturing the semiconductor package after manufacturing of the substrate according to the second embodiment of the present technology.

FIG. 18 is a view illustrating an example of the method for manufacturing the semiconductor package 200 after the manufacturing of the substrate 240 according to the second embodiment of the present technology. Each step in FIG. 18 is executed after the steps in FIGS. 15 to 17.

As illustrated in (a) of the drawing, the manufacturing system applies an adhesive to the upper surface of the substrate 240 to bond the back surface of the semiconductor chip 230.

Next, as illustrated in (b) of the drawing, the manufacturing system electrically connects the semiconductor chip 230 and the substrate 240 by the wire 225. That is, wire bonding is performed. Then, as illustrated in (c) of the drawing, the manufacturing system adheres the frame 220 to the peripheral portion of the semiconductor chip 230 on the upper surface of the substrate 240.

Next, as illustrated in (d) of the drawing, the manufacturing system adheres the sealing glass 210 to the upper portion of the frame 220. Then, as illustrated in (e) of the drawing, the manufacturing system applies the heat conductive member 250 to the exposed back surface of the semiconductor chip 230 and mounts the heat dissipation member 260.

As described above, according to the second embodiment of the present technology, due to the formation of the notch 243 in the substrate 240, the outflow of the heat conductive member 250 can be prevented in the semiconductor package 200 in which the semiconductor chip 230 is mounted face up.

First Modification

In the second embodiment of the present technology described above, the notch has been formed only on the lower surface of the substrate 240, but this configuration may result in an insufficient amount of heat dissipated. A semiconductor package 200 according to a first modification of the second embodiment differs from the second embodiment in that notches are formed on both the upper surface and the lower surface of the substrate 240.

Figure 19:
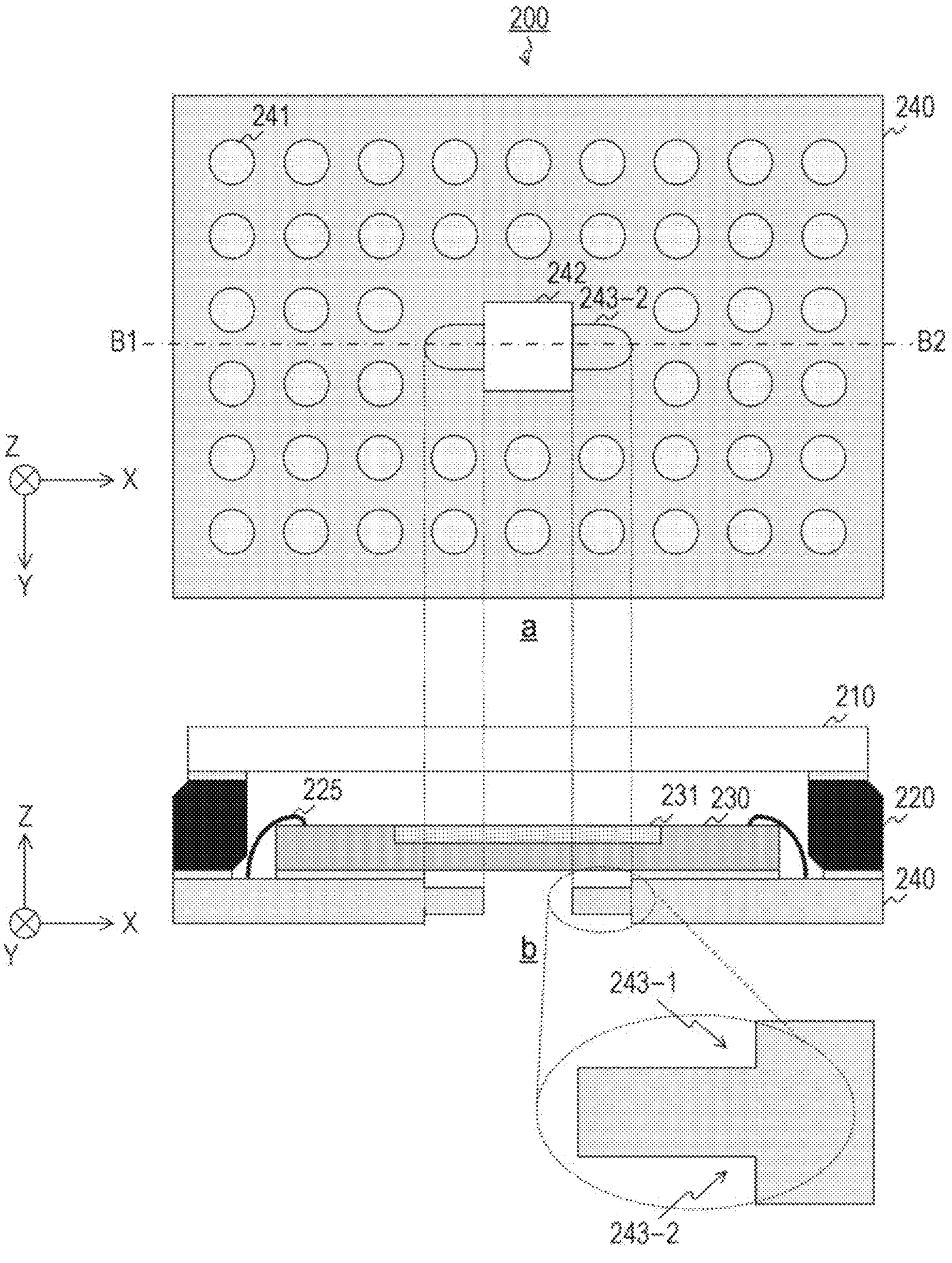
FIG. 19 is an example of a bottom view and a cross-sectional view of a semiconductor package according to a first modification of the second embodiment of the present technology.

FIG. 19 is an example of a bottom view and a cross-sectional view of the semiconductor package 200 according to the first modification of the second embodiment of the present technology. (a) in the drawing is an example of the bottom view of the semiconductor package 200. (b) in the drawing is an example of a cross-sectional view taken along line segment B1-B2 of (a) in the drawing.

In the first modification of the second embodiment, a notch 243-1 and the like are formed on the upper surface of the substrate 240, and a notch 243-2 and the like are formed on the lower surface of the substrate 240. The shape of the upper notch and the shape of the lower notch when viewed from the Z-axis direction are assumed to be substantially the same.

The upper notch increases the area to which the heat conductive member 250 is applied on the back surface of the semiconductor chip 230, and the amount of heat dissipated can be increased.

Next, a method for manufacturing the semiconductor package 200 according to the first modification of the second embodiment will be described.

Figure 20:
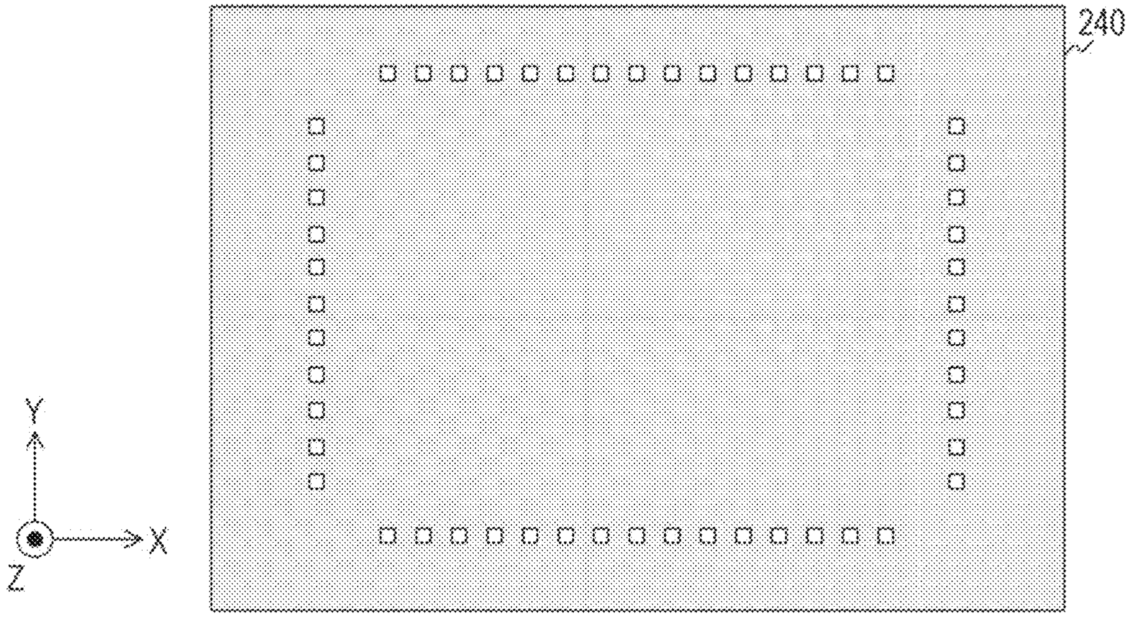
FIG. 20 is an example of a top view, a cross-sectional view, and a bottom view of a substrate before processing according to the first modification of the second embodiment of the present technology.
Figure 20:
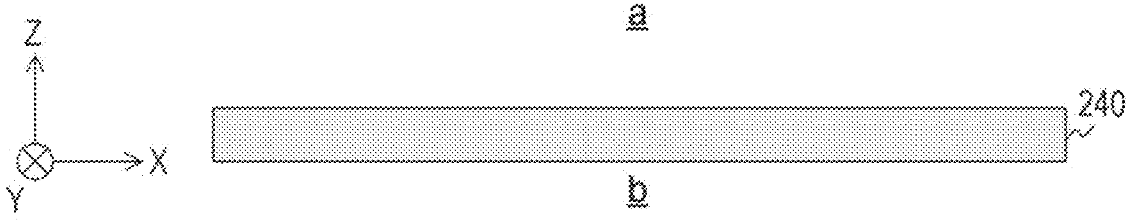
Figure 20:
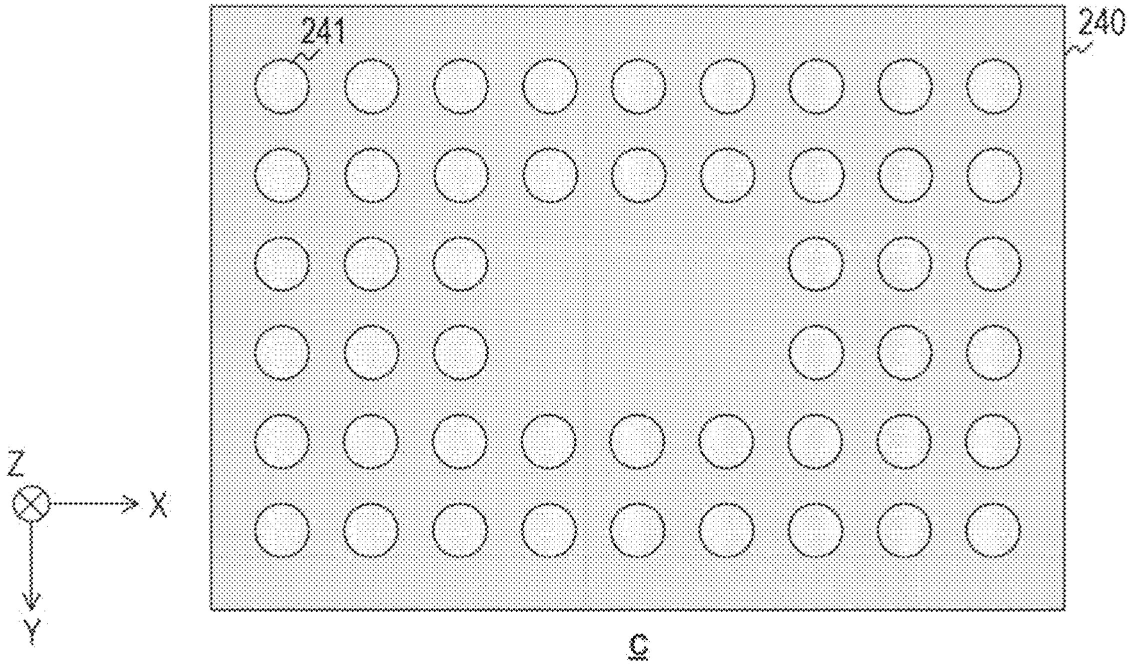

FIG. 20 is an example of a top view, a cross-sectional view, and a bottom view of the substrate 240 before processing according to the first modification of the second embodiment of the present technology. (a) in the drawing is a top view of the substrate 240, and (b) in the drawing is a cross-sectional view of the substrate 240. (c) in the drawing is a bottom view of the substrate 240.

Figure 21:
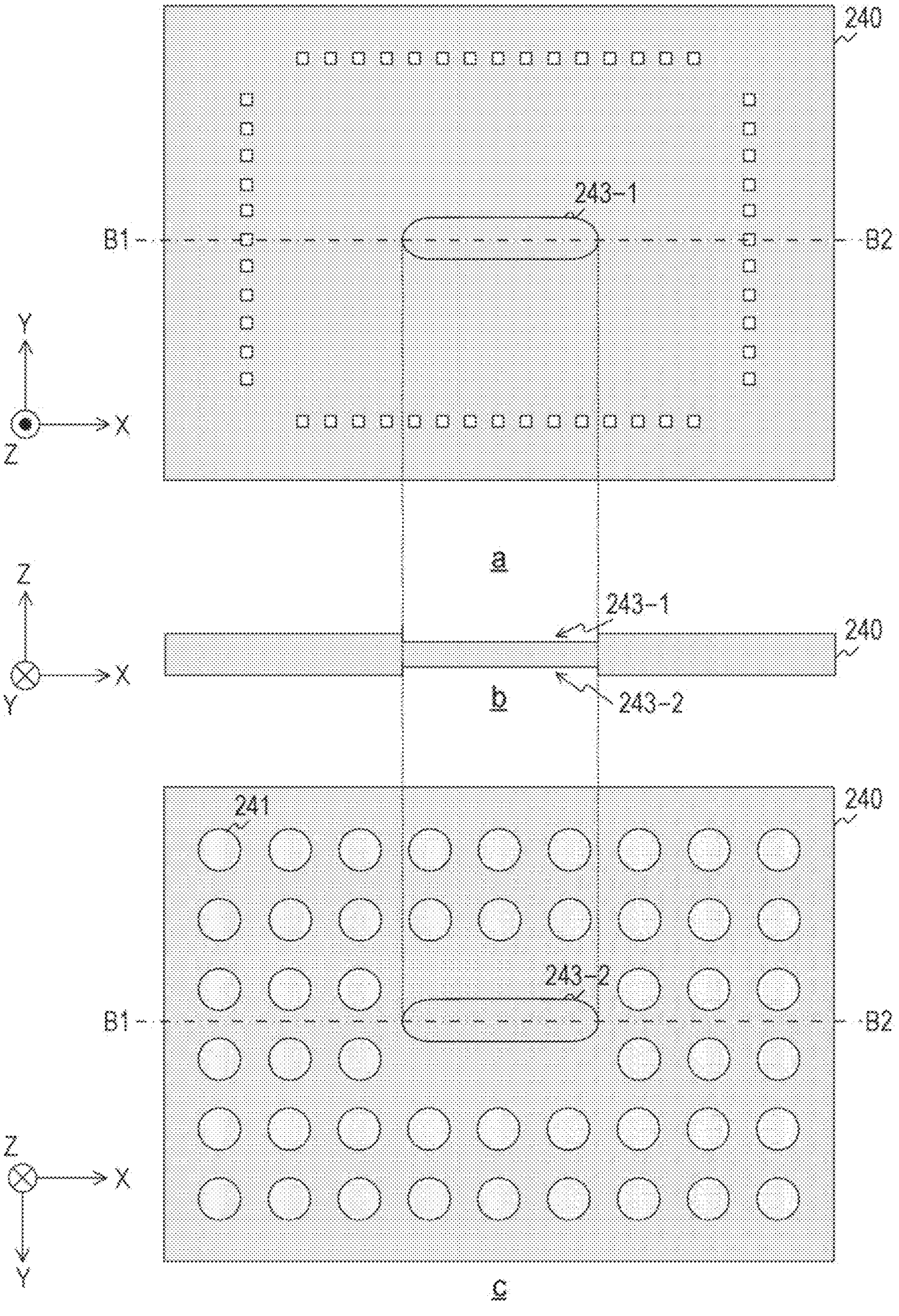
FIG. 21 is an example of a top view, a cross-sectional view, and a bottom view of the substrate in which a notch is formed according to the first modification of the second embodiment of the present technology.

FIG. 21 is an example of a top view, a cross-sectional view, and a bottom view of the substrate 240 in which notches are formed according to the first modification of the second embodiment of the present technology. As illustrated in the drawing, the notch 243-1 is formed on the upper surface of the substrate 240, and the notch 243-2 is formed on the lower surface of the substrate 240.

Figure 22:
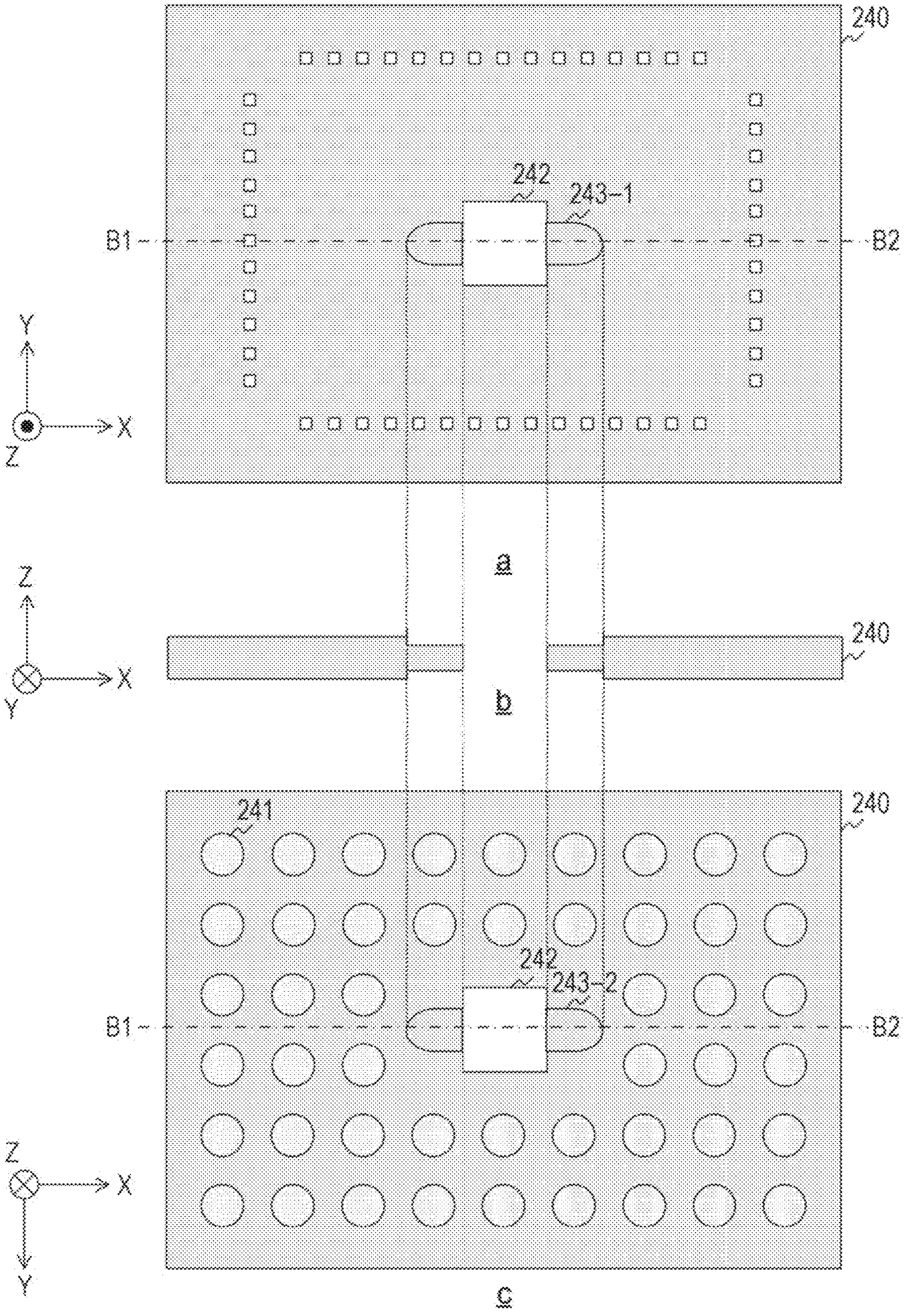
FIG. 22 is an example of a top view, a cross-sectional view, and a bottom view of the substrate in which an opening is formed according to the first modification of the second embodiment of the present technology.

FIG. 22 is an example of a top view, a cross-sectional view, and a bottom view of the substrate 240 in which an opening 242 is formed according to the first modification of the second embodiment of the present technology.

Next, a method of forming the notches 243-1, 243-2 used in FIG. 21 will be described in detail.

Figure 23:
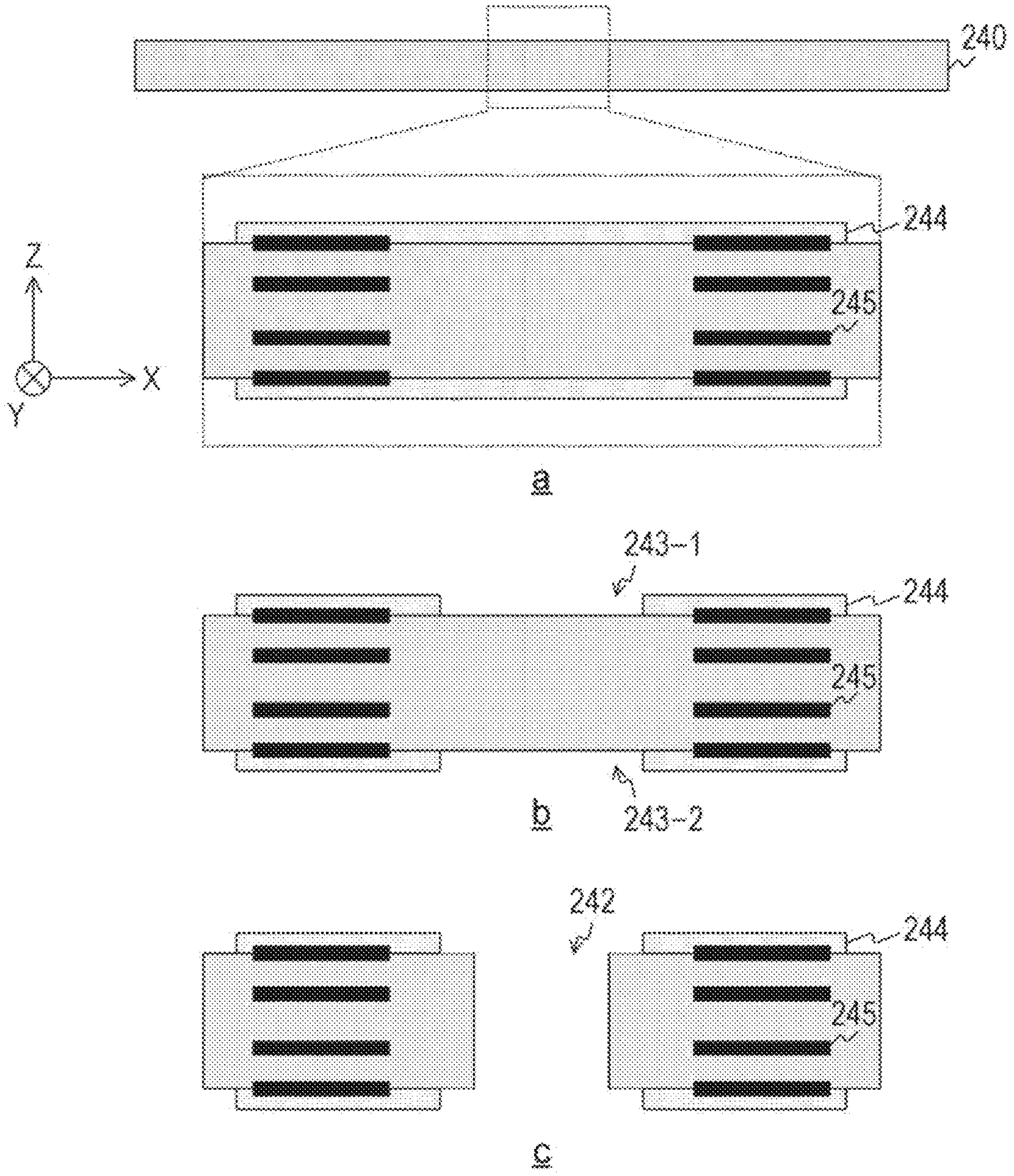
FIG. 23 is a view illustrating an example of a method of processing the substrate according to the first modification of the second embodiment of the present technology.

FIG. 23 is a view illustrating an example of a method of processing the substrate 240 according to the first modification of the second embodiment of the present technology. As illustrated in (a) of the drawing, when the cross-section of the substrate 240 is enlarged, a predetermined number of wires 245 are formed on the substrate 240, and the upper surface and the lower surface are covered with a solder resist 244.

As illustrated in (b) of the drawing, the manufacturing system processes the solder resist 244 on the upper surface and the lower surface to form the notches 243-1, 243-2. Then, as illustrated in (c) of the drawing, the manufacturing system forms the opening 242.

In the drawing, the solder resists 244 on both surfaces of the substrate 240 are processed, but the base material on one of the surfaces can further be subjected to router processing.

Figure 24:
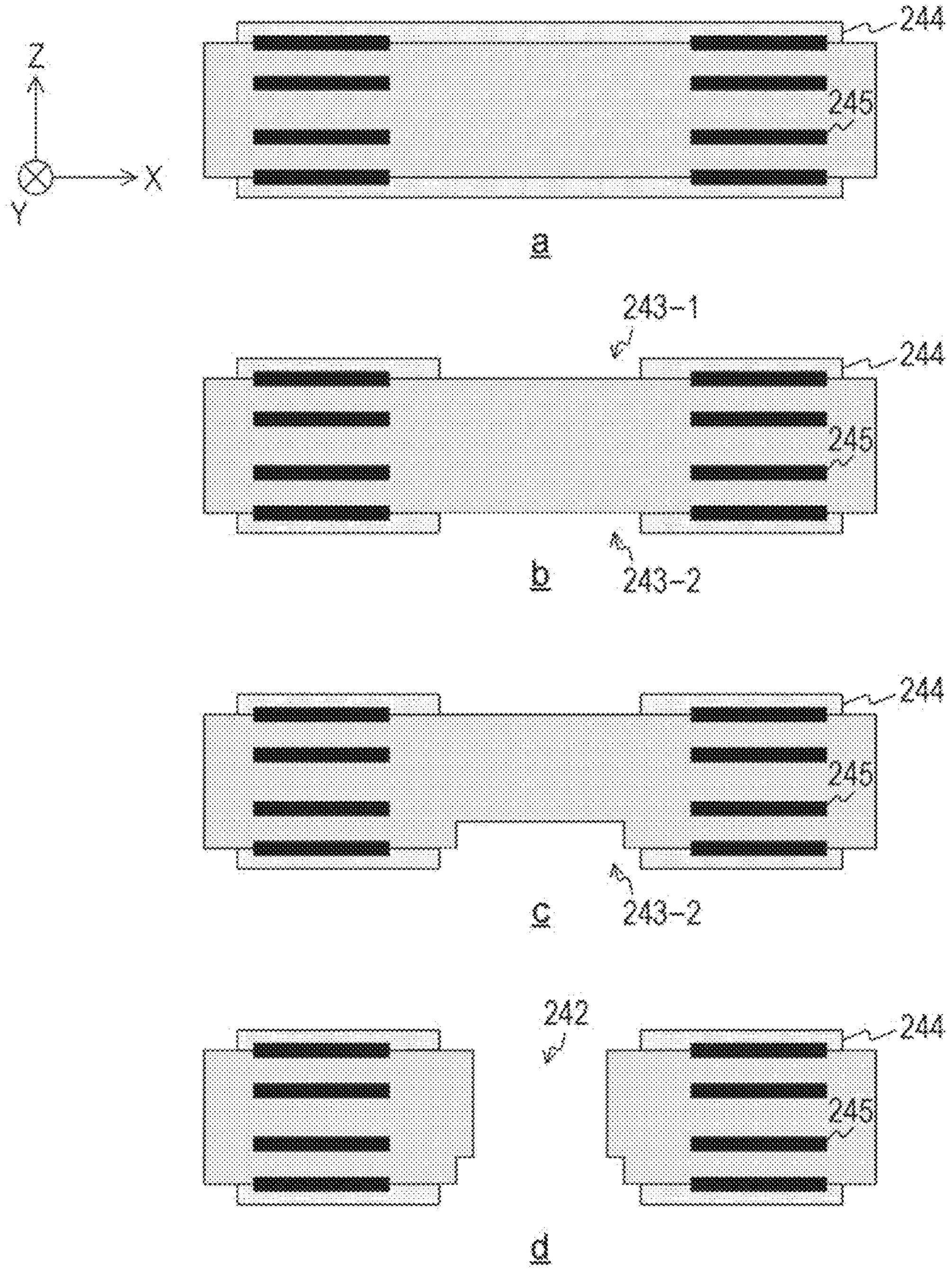
FIG. 24 is a view illustrating an example of a method of processing the substrate when one surface is subjected to router processing on one surface according to the first modification of the second embodiment of the present technology.

FIG. 24 is a view illustrating an example of a method of processing the substrate 240 when one surface is subjected to router processing on one surface according to the first modification of the second embodiment of the present technology. The steps up to (b) in the drawing are similar to the steps up to (b) in FIG. 23.

Then, as illustrated in (c) of FIG. 24, the manufacturing system performs router processing on the base material exposed on the lower side to create two stages in the notch 243-2. Then, as illustrated in (d) of the drawing, the manufacturing system forms the opening 242.

In the drawing, the base material on one surface is subjected to router processing, but both surfaces may be subjected to router processing.

Figure 25:
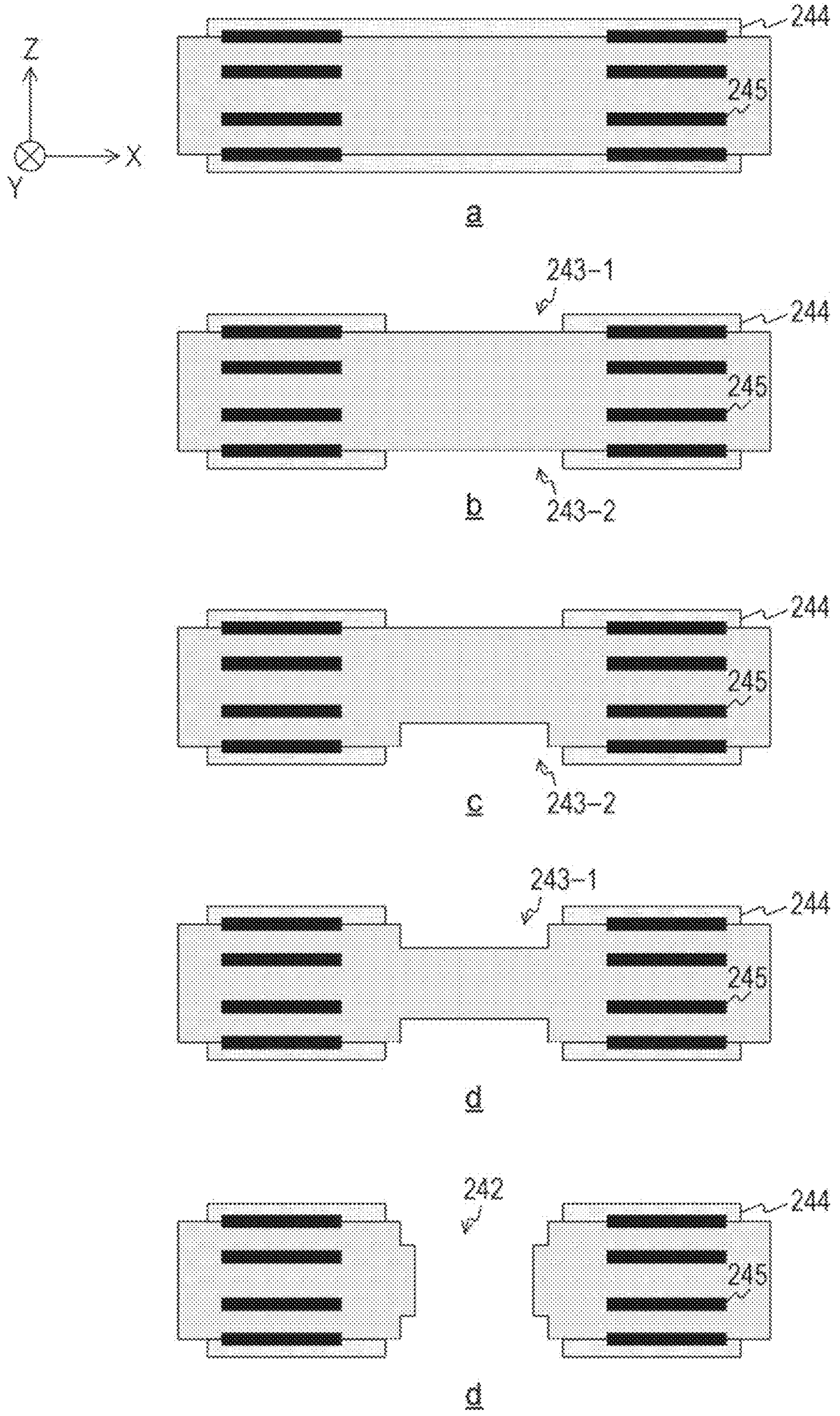
FIG. 25 is a view illustrating an example of a method of processing the substrate when both surfaces are subjected to router processing according to the first modification of the second embodiment of the present technology.

FIG. 25 is a view illustrating an example of a method of processing the substrate 240 when both surfaces are subjected to router processing according to the first modification of the second embodiment of the present technology. The steps up to (c) in the drawing are similar to the steps up to (c) in FIG. 24.

Then, as illustrated in (d) of FIG. 25, the manufacturing system performs router processing on the base material exposed on the upper side to create two stages in the notch 243-1. Then, as illustrated in (e) of the drawing, the manufacturing system forms the opening 242.

As described above, according to the first modification of the second embodiment of the present technology, the notch is also formed on the upper surface of the substrate 240, so that the area to which the heat conductive member 250 is applied is increased, thereby enabling an increase in the amount of heat dissipated.

Second Modification

In the second embodiment of the present technology described above, the two notches have been formed in a strip shape along the X-axis direction, but the shapes and the number of notches are not limited to this configuration. A semiconductor package 200 according to a second modification of the second embodiment differs from the second embodiment in that the shapes and the number of notches are changed.

Figure 26:
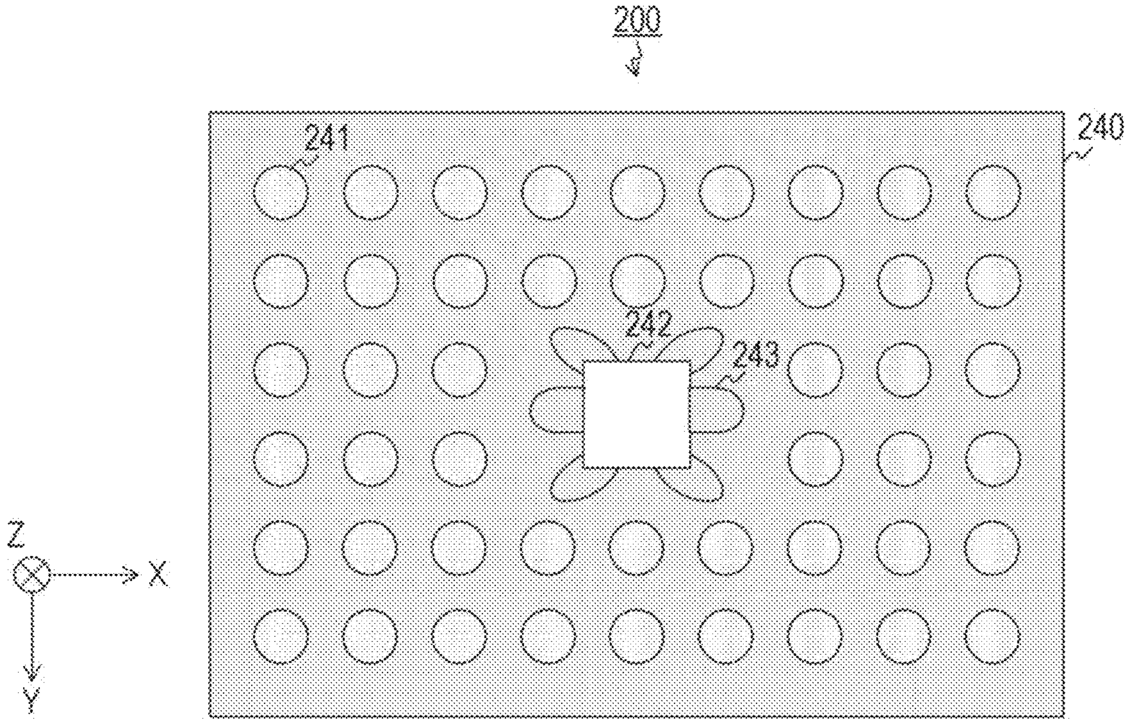
FIG. 26 is an example of a bottom view of a semiconductor package according to a second modification of the second embodiment of the present technology.

FIG. 26 is an example of a bottom view of the semiconductor package 200 according to the second modification of the second embodiment of the present technology. The semiconductor package 200 according to the second modification of the second embodiment differs from the second embodiment in that four notches (such as a notch 243) are further formed obliquely from four corners of an opening 242. As illustrated in the drawing, by increasing the number of notches, the amount of the heat conductive member 250 can be increased. Alternatively, the outflow of the heat conductive member 250 can be prevented more reliably.

Figure 27:
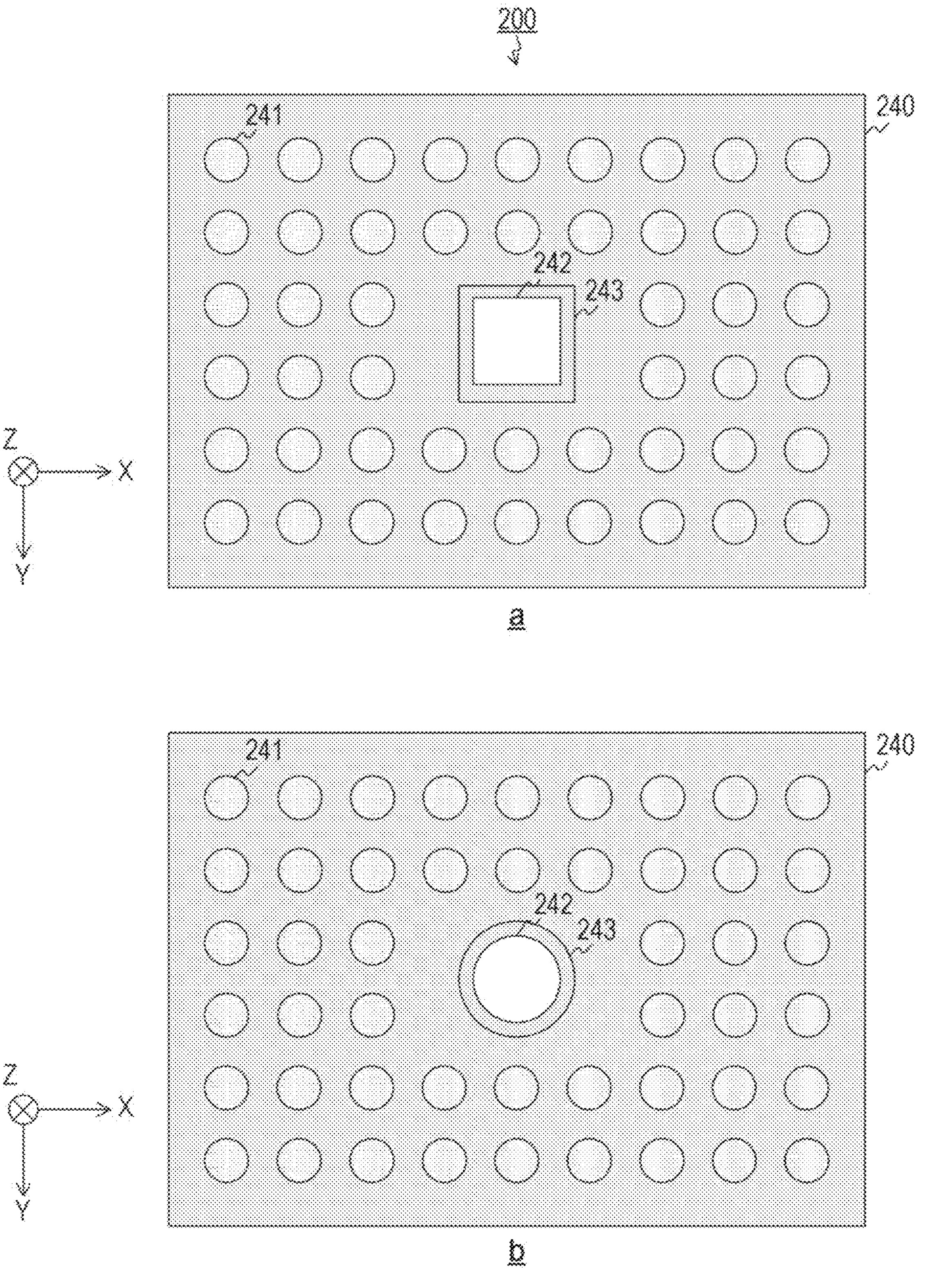
FIG. 27 is an example of a bottom view of the semiconductor package when a notch is formed in a region surrounding an opening according to the second modification of the second embodiment of the present technology.

Note that as illustrated in (a) of FIG. 27, the notch 243 can also be formed in a region surrounding the outer periphery of the rectangular opening 242. At this time, the outer periphery of the notch 243 can also be rectangular.

Further, as illustrated in (b) of the drawing, the opening 242 may be circular, and the outer periphery of the notch 243 may also be circular.

Figure 28:
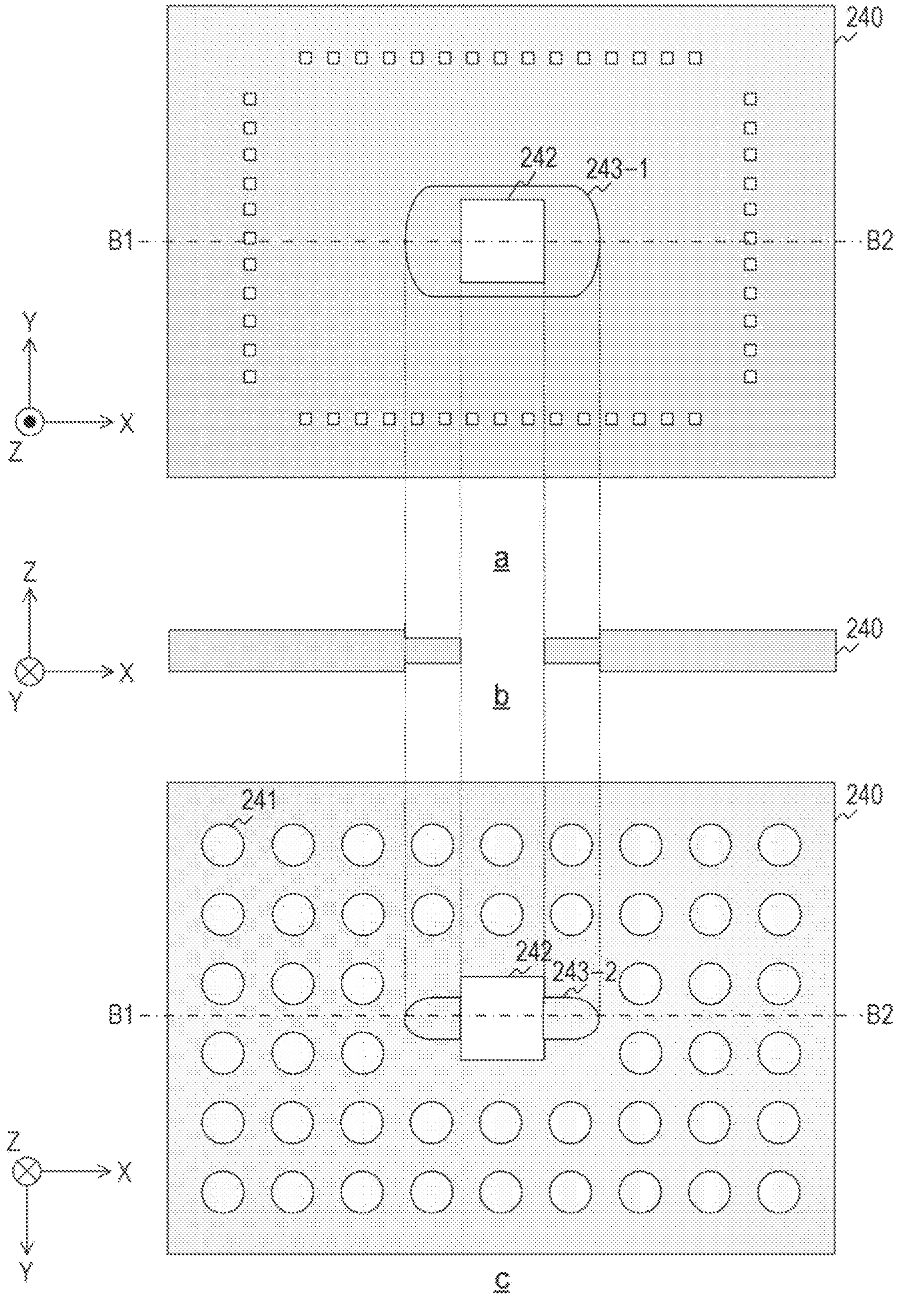
FIG. 28 is an example of a top view, a cross-sectional view, and a bottom view of the semiconductor package according to the second modification of the second embodiment of the present technology.

In addition, as illustrated in FIG. 28, in a case where notches are formed on both surfaces of the substrate 240, notches having different shapes can be formed on the upper surface and the lower surface. For example, as illustrated in (a) of the drawing, a notch 243-1 may be formed in a region surrounding the outer periphery of the opening 242 on the upper surface, and as illustrated in (c) of the drawing, a notch 243-2 or the like may be formed adjacent to a part of the opening 242 on the lower surface. (b) in the drawing is a cross-sectional view of the substrate 240.

Note that the shapes and the number of notches are not limited to those illustrated in FIGS. 26 to 28. The shapes and the number of notches can be appropriately changed according to the shape of the heat dissipation member 260 to be mounted and the characteristics (viscosity, etc.) of the heat conductive member 250.

As described above, according to the second modification of the second embodiment of the present technology, the shapes and the number of notches are changed, thereby making it possible to accommodate various heat dissipation members 260 and heat conductive members 250.

Third Modification

In the second embodiment of the present technology described above, the external terminal 241 has been provided on the lower surface of the substrate 240, but the structure of the substrate 240 can be changed according to the specifications of a device or a device in which the semiconductor package 200 is mounted. The semiconductor package 200 according to the second modification of the second embodiment differs from the second embodiment in that various electronic components are mounted on the substrate 240.

Figure 29:
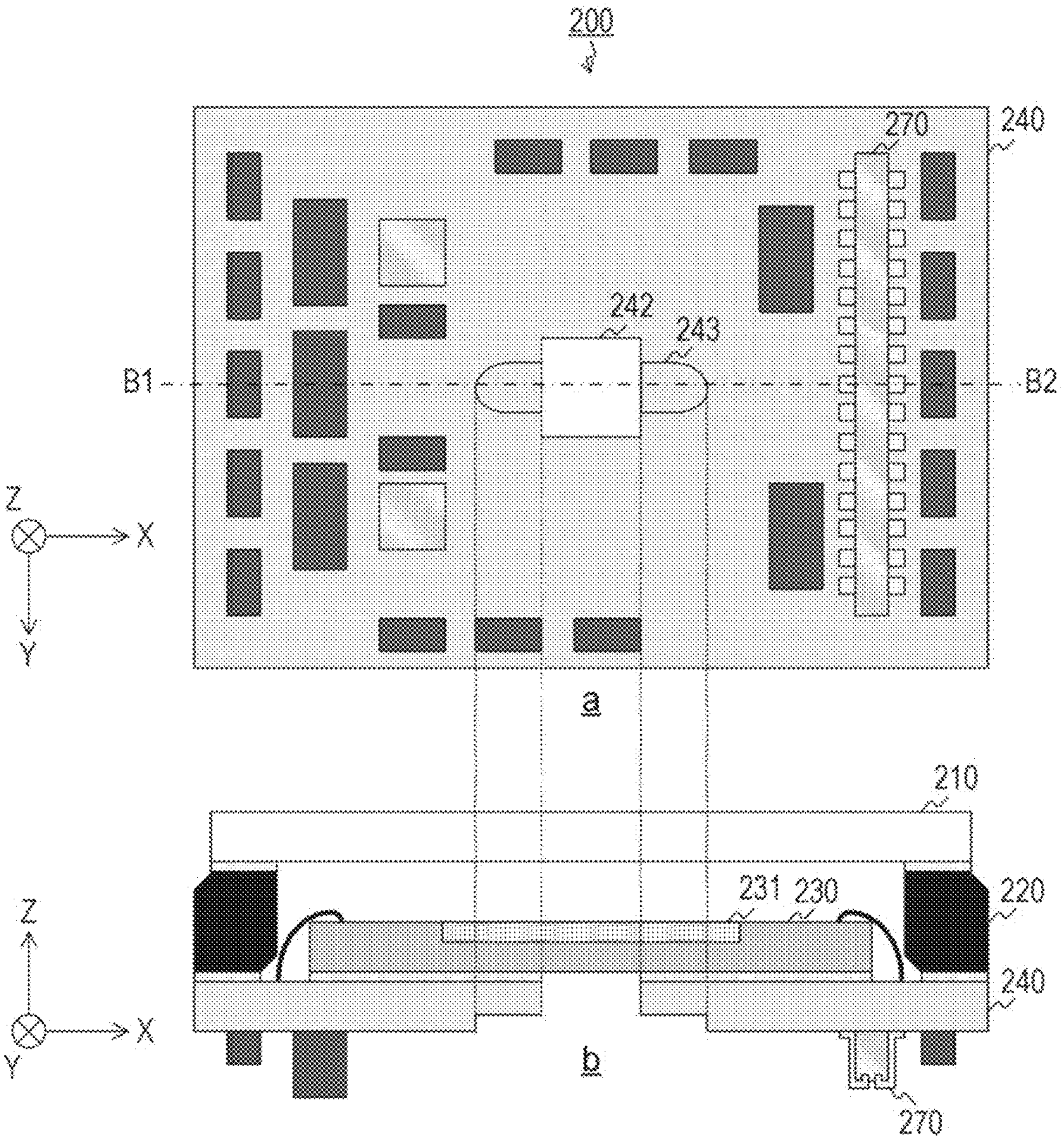
FIG. 29 is an example of a bottom view and a cross-sectional view of a semiconductor package according to a third modification of the second embodiment of the present technology.

FIG. 29 is an example of a bottom view and a cross-sectional view of a semiconductor package 200 according to a third modification of the second embodiment of the technology. (a) in the drawing is an example of a bottom view of the semiconductor package 200, and (b) in the drawing is an example of a cross-sectional view of the semiconductor package 200.

The semiconductor package 200 according to the third modification of the second embodiment differs from the second embodiment in that a predetermined number of electronic components 270 (connectors, etc.) are mounted on the lower surface of the substrate 240.

Note that the second modification of the second embodiment can be applied to the third modification of the second embodiment.

As described above, according to the third modification of the second embodiment of the present technology, the electronic component 270 is mounted on the lower surface of the substrate 240, so that various devices and devices can be accommodated.

Fourth Modification

In the second embodiment of the present technology described above, the semiconductor chip 230 has been sealed by the sealing glass 210 and the frame 220, but the semiconductor chip 230 may be sealed by a sealing resin. A semiconductor package 200 according to a fourth modification of the second embodiment differs from the second embodiment in that a sealing resin is used instead of the sealing glass 210 and the frame 220.

Figure 30:
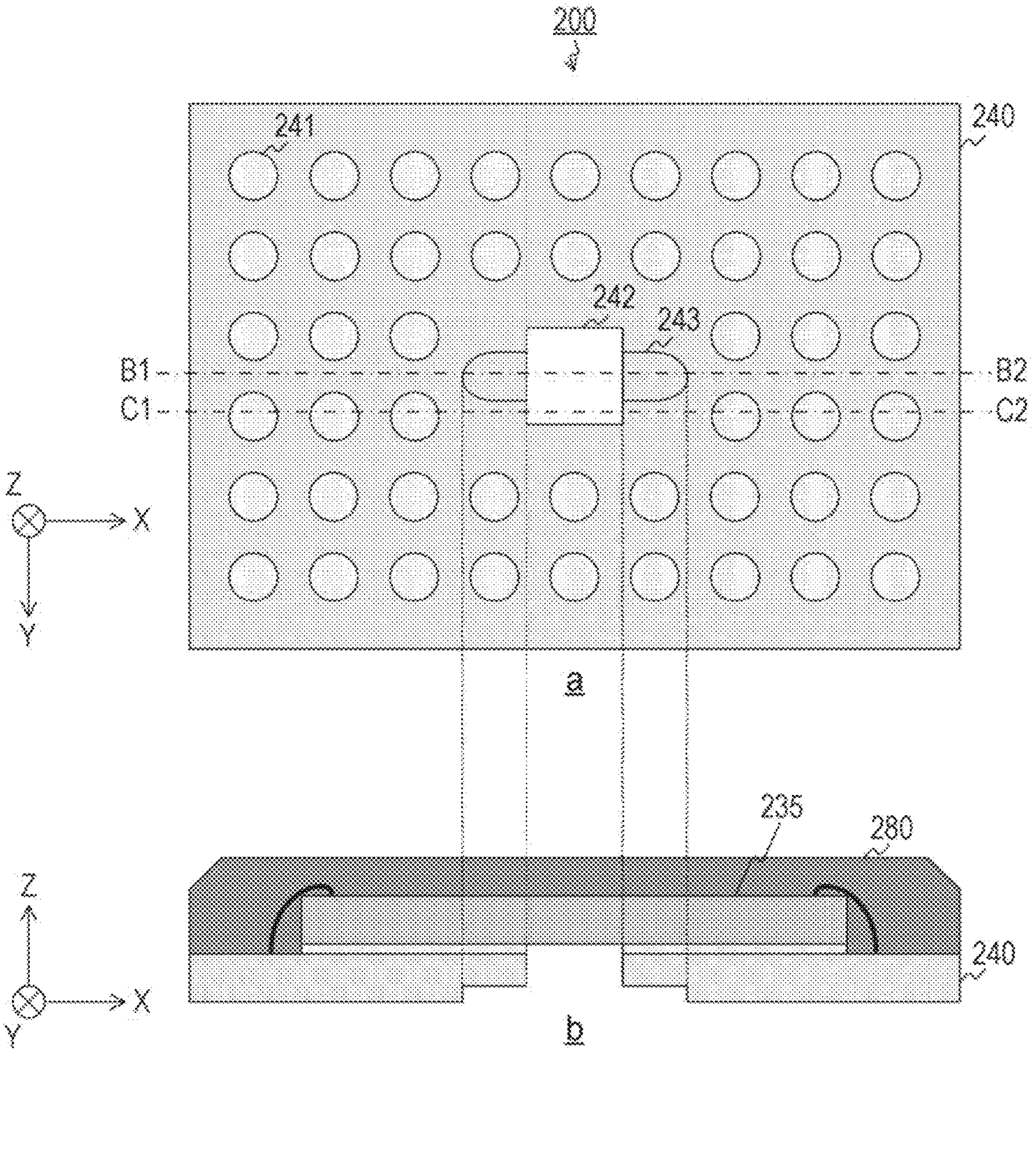
FIG. 30 is an example of a bottom view and a cross-sectional view of a semiconductor package according to a fourth modification of the second embodiment of the present technology.

FIG. 30 is an example of a bottom view and a cross-sectional view of the semiconductor package 200 according to the fourth modification of the second embodiment of the present technology. (a) in the drawing is an example of a bottom view of the semiconductor package 200, and (b) in the drawing is an example of a cross-sectional view of the semiconductor package 200.

In the semiconductor package 200 of the fourth modification of the second embodiment, a large-scale integration (LSI) chip that does not perform photoelectric conversion is provided as a semiconductor chip 235 instead of the semiconductor chip 230 (solid-state image sensor, etc.). The sealing glass 210 is unnecessary because photoelectric conversion is not performed, and the semiconductor chip 235 is sealed with a sealing resin 280 instead of the sealing glass 210 and the frame 220.

Figure 31:
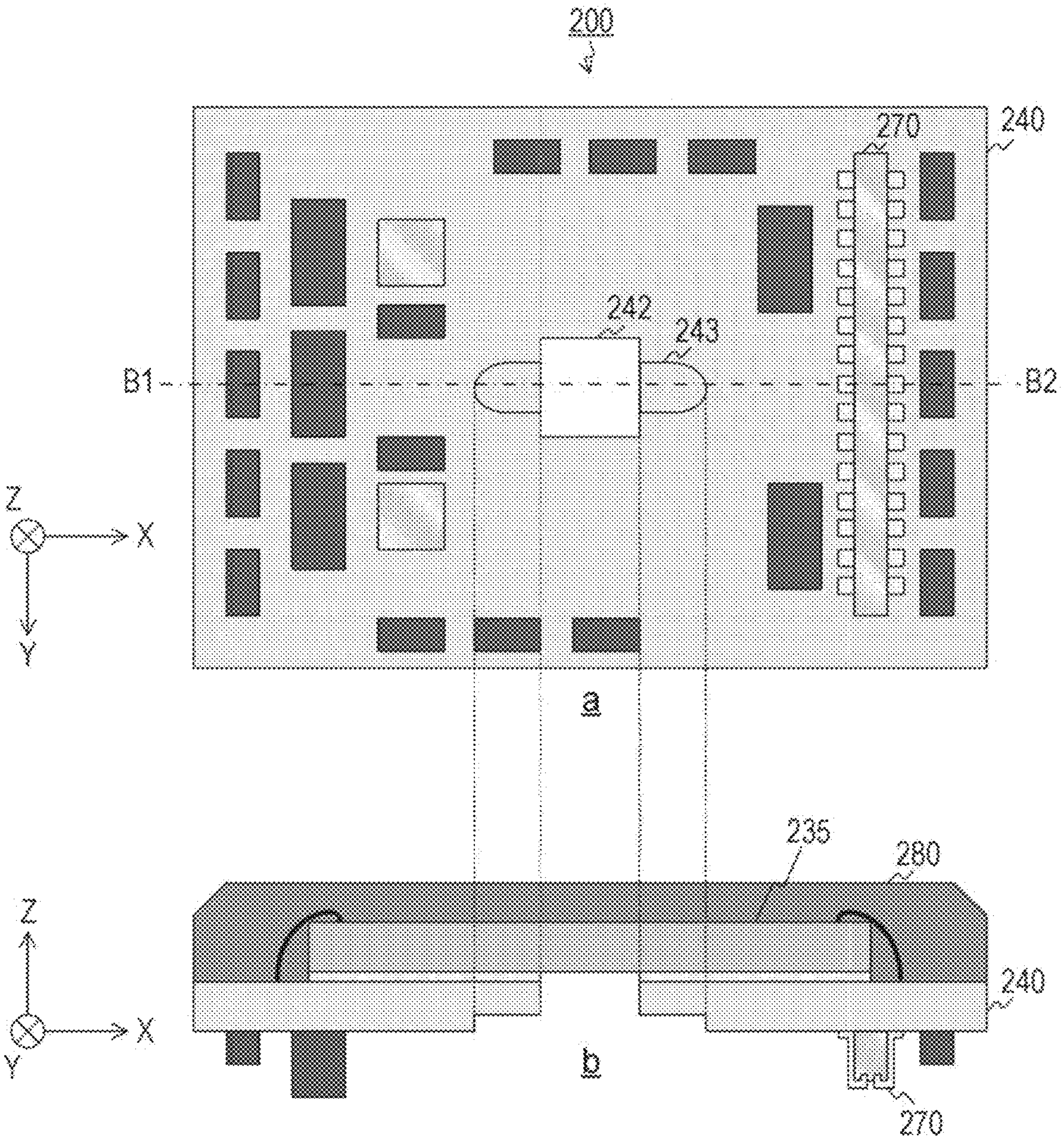
FIG. 31 is an example of a bottom view and a cross-sectional view of the semiconductor package when an electronic component is mounted according to the fourth modification of the second embodiment of the present technology.

Note that in a case where the sealing resin 280 is used, the electronic component 270 can also be mounted on the lower surface of the substrate 240 as illustrated in FIG. 31. In addition, the second modification of the second embodiment can be applied to the fourth modification of the second embodiment.

As described above, according to the fourth modification of the second embodiment of the present technology, the sealing glass 210 and the frame 220 are unnecessary because sealing is performed with the sealing resin 280.

Fifth Modification

In the second embodiment of the present technology described above, one opening 242 has been disposed immediately below the light receiver 231, but a location where heat generation is large in the semiconductor chip 230 is not necessarily immediately below the light receiver 231. A semiconductor package 200 according to a fifth modification of the second embodiment differs from the second embodiment in that the positions and the number of openings are changed according to a heat generating location.

Figure 32:
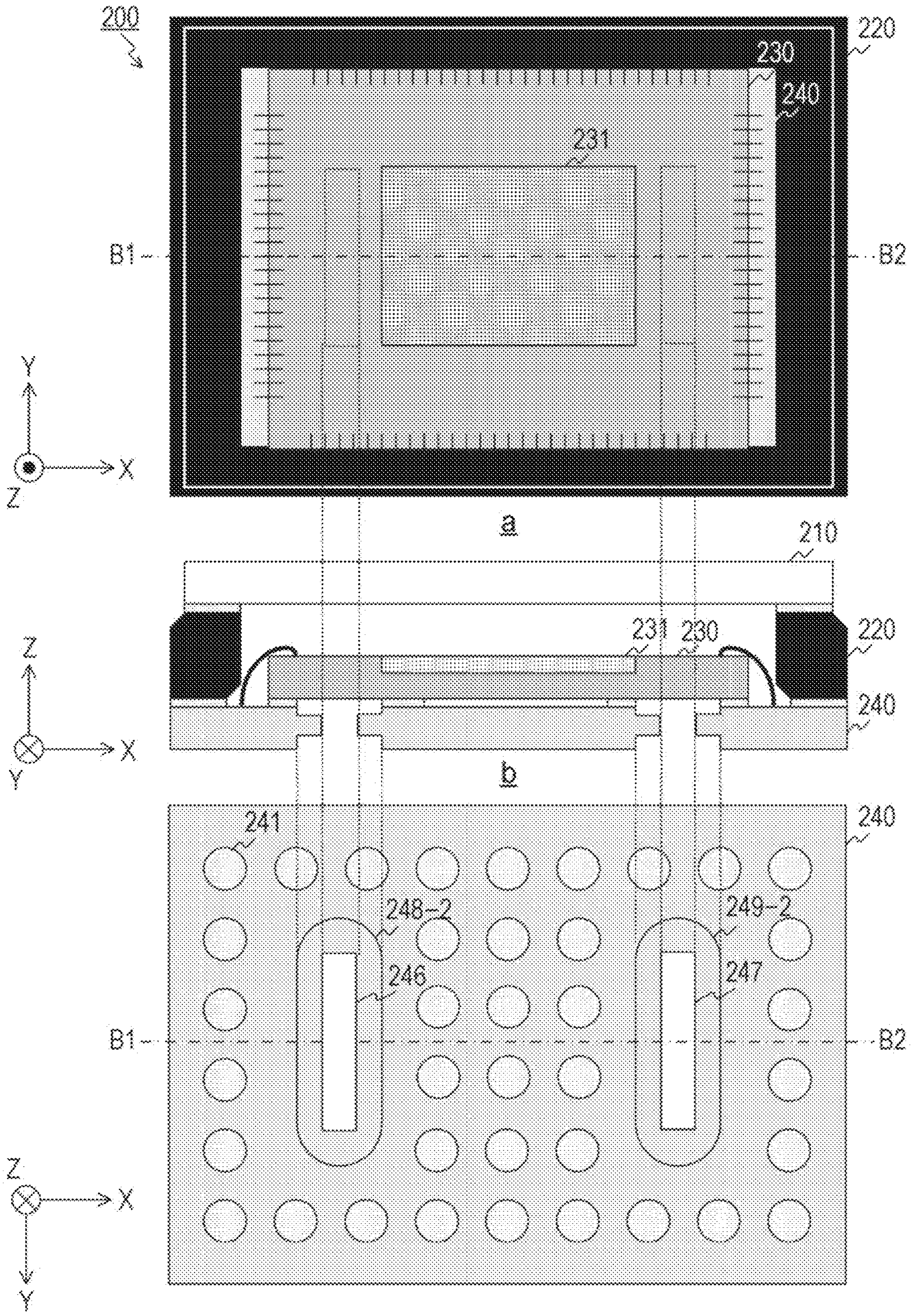
FIG. 32 is an example of a top view, a cross-sectional view, and a bottom view of a semiconductor package according to a fifth modification of the second embodiment of the present technology.

FIG. 32 is an example of a top view, a cross-sectional view, and a bottom view of the semiconductor package 200 according to the fifth modification of the second embodiment of the present technology. (a) in the drawing is an example of a top view of the semiconductor package 200, and (b) in the drawing is an example of a cross-sectional view of the semiconductor package 200. (c) in the drawing is an example of a bottom view of the semiconductor package 200.

The two dotted line portions on both sides of the light receiver 231 in (a) of the drawing are high-temperature portions that generate a significant amount of heat in the semiconductor chip 230. As illustrated in (b) and (c) in the drawing, openings 246, 247 are disposed immediately below these high-temperature portions. Further, on the lower surface of substrate 240, a notch 248-2 is formed in a region surrounding the opening 246, and a notch 249-2 is formed in a region surrounding the opening 247. In addition, a notch is also formed on the upper surface of the substrate 240.

Figure 33:
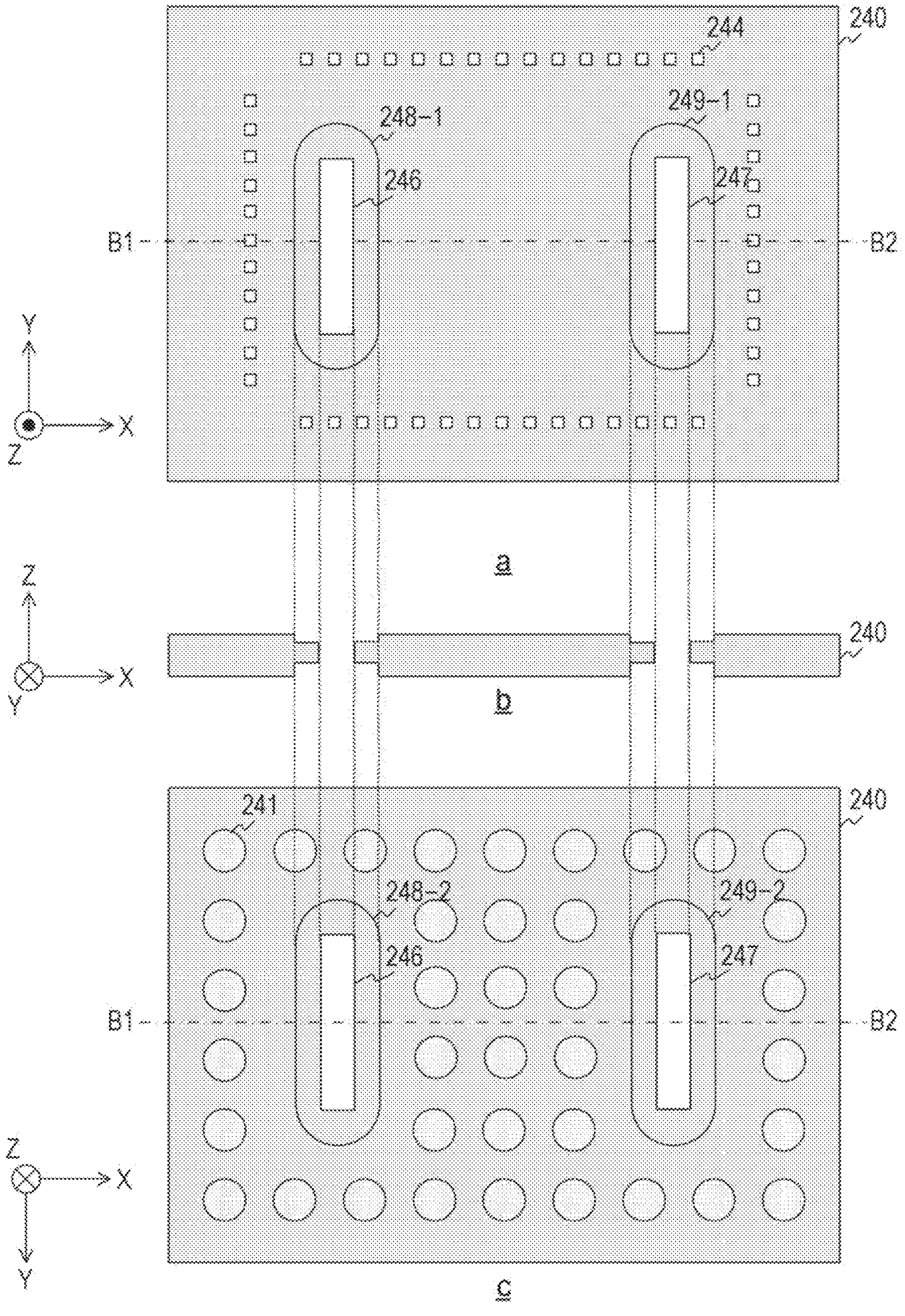
FIG. 33 is an example of a top view, a cross-sectional view, and a bottom view of a substrate according to the fifth modification of the second embodiment of the present technology.

FIG. 33 is an example of a top view, a cross-sectional view, and a bottom view of the substrate 240 according to the fifth modification of the second embodiment of the present technology. (a) in the drawing is an example of a top view of the substrate 240, and (b) in the drawing is an example of a cross-sectional view of the substrate 240. (c) in the drawing is an example of a bottom view of the substrate 240.

As illustrated in (a) of the drawing, a notch 248-1 is formed in a region surrounding the opening 246 on the upper surface of the substrate 240, and a notch 249-1 is formed in a region surrounding the opening 247.

Figure 34:
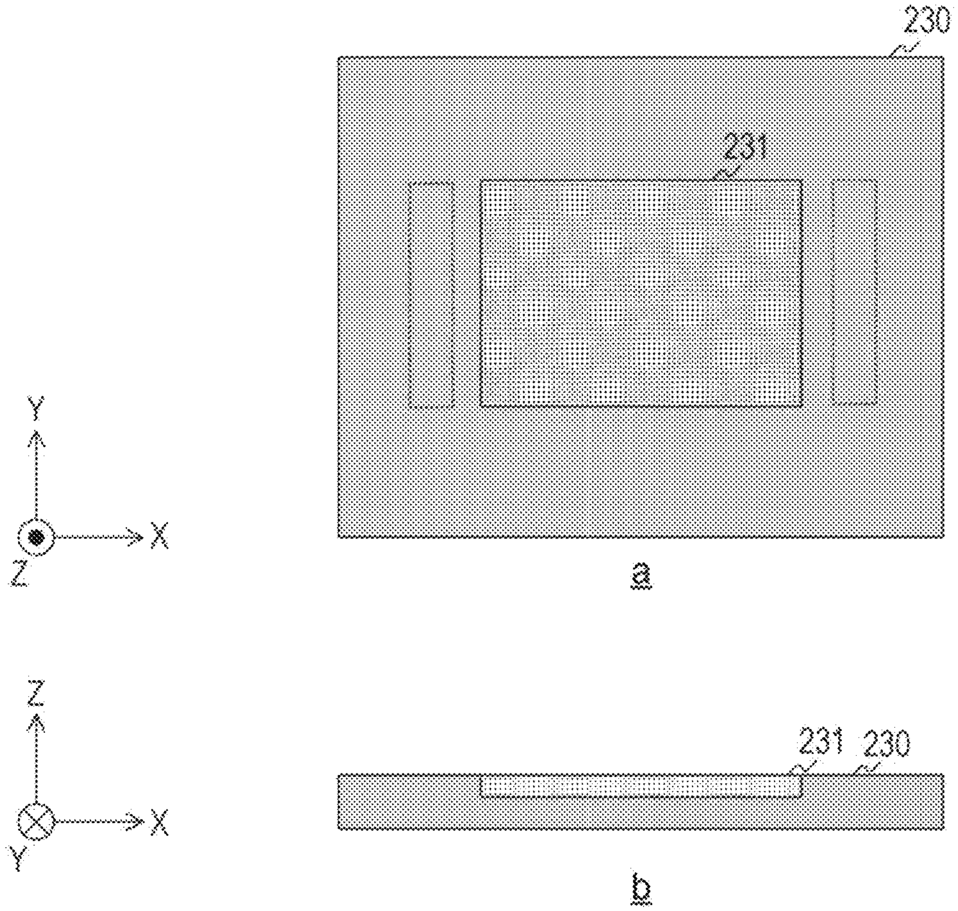
FIG. 34 is an example of a top view and a cross-sectional view of a semiconductor chip according to the fifth modification of the second embodiment of the present technology.

FIG. 34 is an example of a top view and a cross-sectional view of the semiconductor chip 230 according to the fifth modification of the second embodiment of the present technology. (a) in the drawing is an example of a top view of the semiconductor chip 230, and (b) in the drawing is an example of a cross-sectional view of the semiconductor chip 230.

Figure 35:
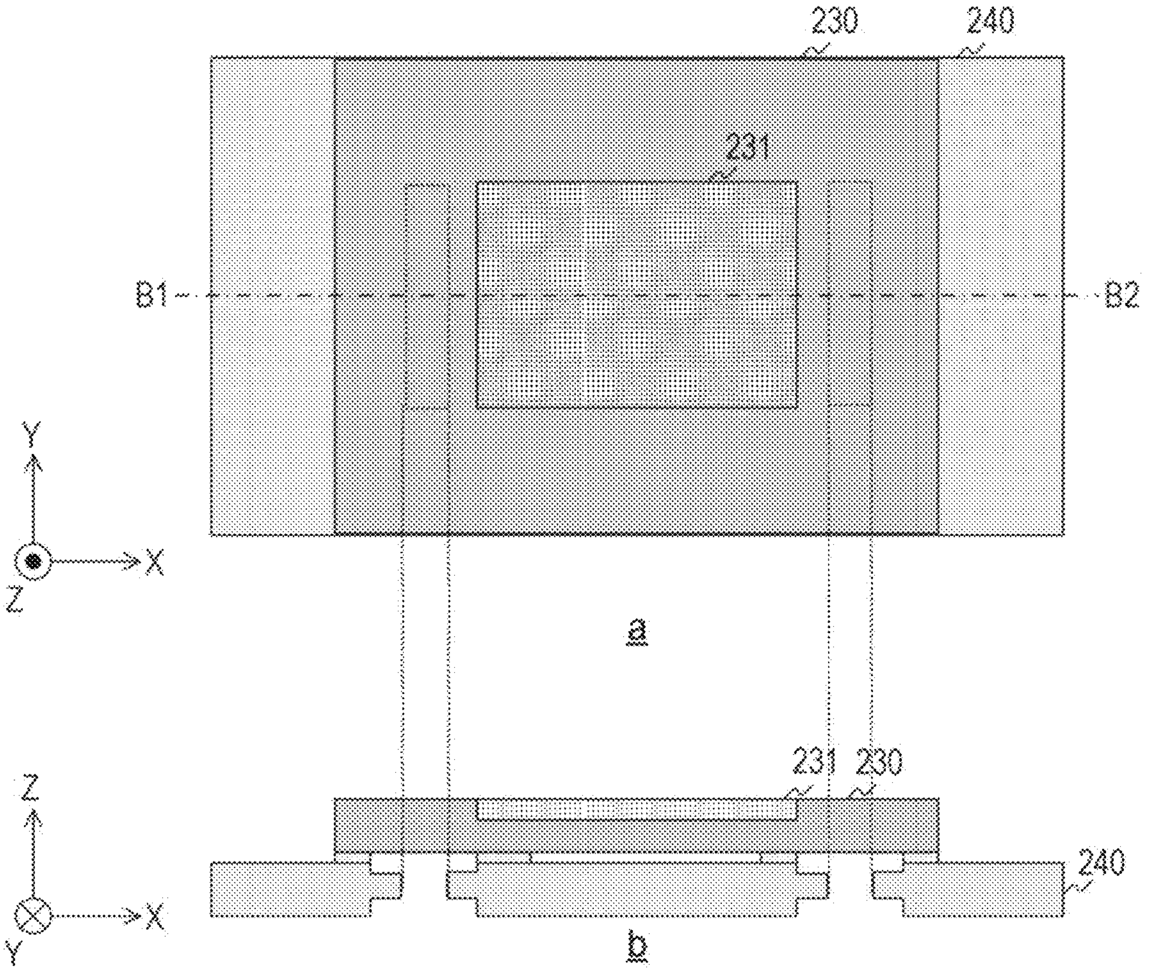
FIG. 35 is an example of a top view and a cross-sectional view when the semiconductor chip is mounted on the substrate according to the fifth modification of the second embodiment of the present technology.

When the semiconductor chip 230 illustrated in FIG. 34 is mounted on the substrate 240 illustrated in FIG. 33, the lower surfaces of the two high-temperature portions are exposed by the openings 246, 247 as illustrated in FIG. 35. It is thereby possible to implement a semiconductor package having highly efficient heat dissipation characteristics.

Note that the shapes, number, and positions of the openings are not limited to those illustrated in FIGS. 32 to 35 and can be appropriately changed according to the high-temperature portions. Further, the second, third, and fourth modifications of the second embodiment can also be applied to the fifth modification of the second embodiment.

As described above, according to the fifth modification of the second embodiment of the present technology, the openings 246, 247 are arranged immediately below the respective high-temperature portions, so that heat dissipation characteristics can be improved.

3. Third Embodiment

The structure of the notch of the first embodiment of the present technology described above can be applied to a fan-out wafer-level package (FOWLP). A third embodiment differs from the first embodiment in that a notch is formed in the FOWLP.

Figure 36:
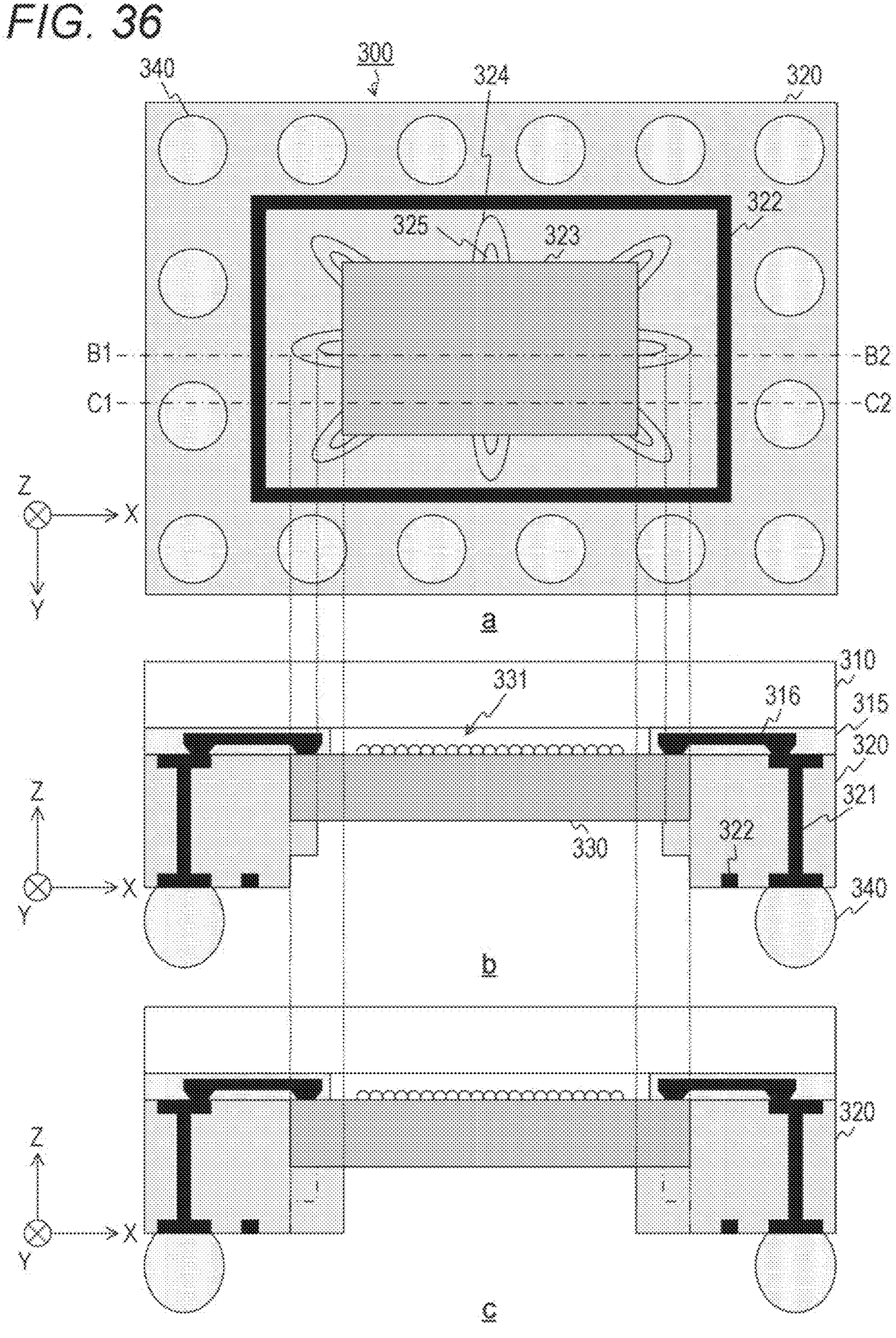
FIG. 36 is an example of a bottom view and a cross-sectional view of a semiconductor package according to a third embodiment of the present technology.

FIG. 36 is an example of a bottom view and a cross-sectional view of a semiconductor package 300 according to the third embodiment of the present technology. (a) in the drawing is an example of a bottom view of the semiconductor package 300. (b) in the drawing is an example of a cross-sectional view taken along line segment B1-B2 of (a) in the drawing, and (c) in the drawing is an example of a cross-sectional view taken along line segment C1-C2 of (a) in the drawing.

The semiconductor package 300 of the third embodiment is an FOWLP and includes a sealing glass 310, a rewiring layer 315, a sealing resin 320, and a semiconductor chip 330.

The configuration of the semiconductor chip 330 is similar to that of the semiconductor chip 230 (solid-state image sensor, etc.) of the second embodiment, and one of both surfaces is a light-receiving surface on which a light receiver 331 is formed. In addition, the light-receiving surface of the semiconductor chip 330 is defined as the front surface, and the front surface side is defined as the upper side. The sealing resin 320 is formed around the semiconductor chip 330.

As illustrated in (a) of the drawing, a predetermined number of external terminals 340 are formed on the lower surface of the sealing resin 320. Further, as illustrated in (a) and (b) of the drawing, an opening 323 is formed immediately below the light receiver 331 on the lower surface of the sealing resin 320. At least a part of the back surface of the semiconductor chip 330 is exposed by the opening 323.

In addition, a predetermined number of outer notches (such as a notch 324) are formed adjacent to a part of the outer periphery of the opening 323. For example, four notches are formed obliquely from the four corners of the opening 323. Moreover, four notches are formed in the X-axis direction or the Y-axis direction from the upper, lower, left, and right of the opening 323. In this manner, a total of eight notches are formed. An inner notch (such as a notch 325) is formed inside each of the outer notches. In addition, when a portion of each of the outer and inner notches adjacent to the outer periphery of the opening 323 is set as a start end, the terminal end on the opposite side has an arc shape.

Each of the notches does not penetrate the sealing resin 320, and the length (depth) of the notch in the Z-axis direction is smaller than the length (thickness) of the sealing resin 320 in the Z-axis direction. Therefore, in the cross-section along line segment B1-B2 passing through the notch, a stage is generated around the opening 323 due to the notch. In addition, the inner notch 325 and the like are deeper than the outer notch 324 and the like. Therefore, there are two stages around the opening 323. Note that it is possible to form only one of the outer and inner notches and have one stage.

On the other hand, as illustrated in (c) of the drawing, no stage is generated in the sealing resin 320 in the cross-section along line segment C1-C2 that does not pass through the notch.

Further, a predetermined number of through vias 321 with one end connected to the external terminal 340 are formed in the sealing resin 320. In addition, on the lower surface of the sealing resin 320, a sealing wiring pattern 322 for connecting a heat dissipation member to be described later is formed.

The rewiring layer 315 is formed on the upper portion of the sealing resin 320, and the sealing glass 310 is mounted on the upper portion of the rewiring layer 315. In the rewiring layer 315, rewiring 316 connecting the through via 321 and the semiconductor chip 330 is formed.

Figure 37:
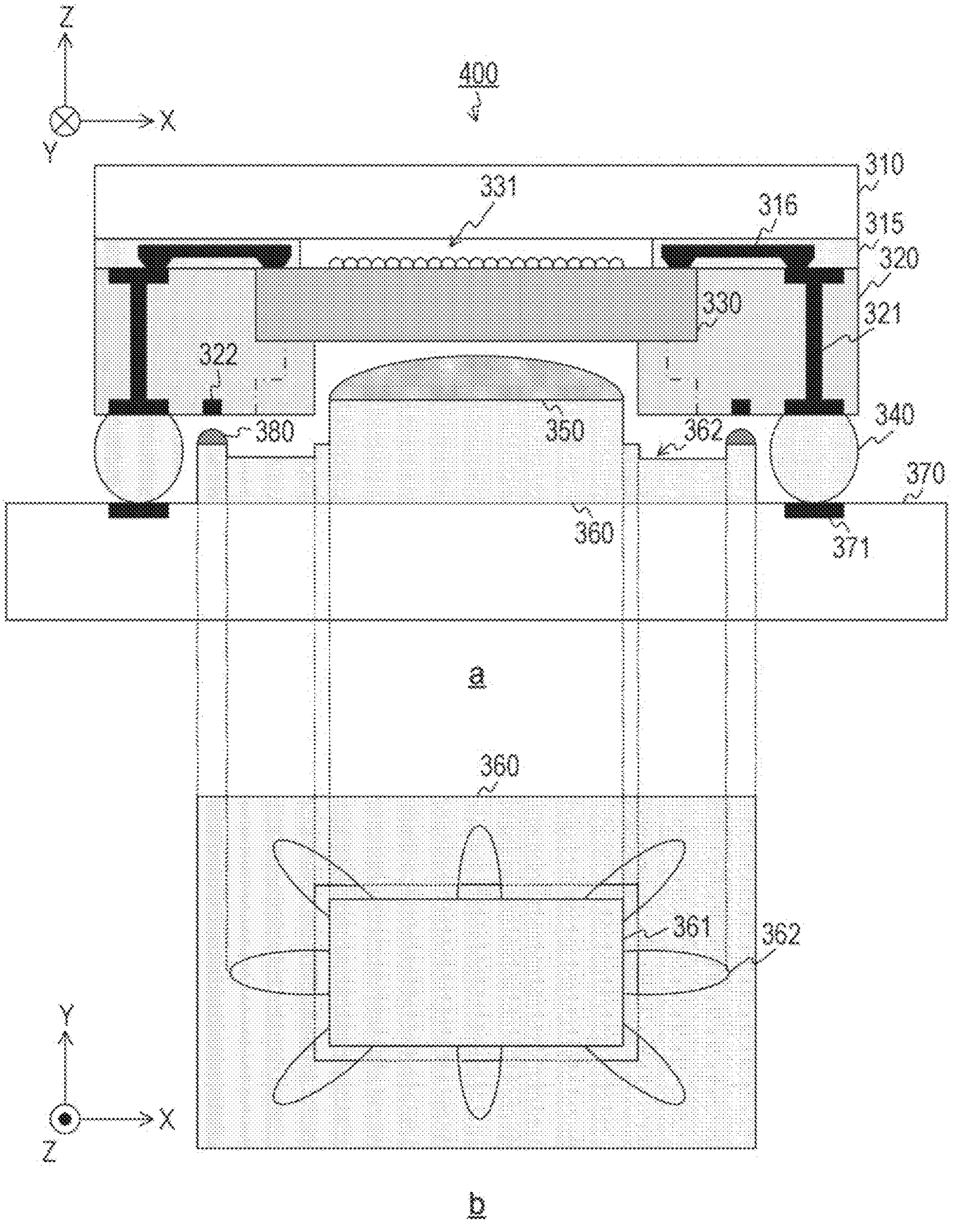
FIG. 37 is an example of a cross-sectional view of a semiconductor device and a top view of a heat dissipation member according to the third embodiment of the present technology.

FIG. 37 is an example of a cross-sectional view of a semiconductor device 400 and a top view of a heat dissipation member 360 according to the third embodiment of the present technology. (a) in the drawing is an example of a cross-sectional view of the semiconductor device 400 immediately before the semiconductor package 300 is mounted on a mounting substrate 370. (b) in the drawing is an example of a top view of the heat dissipation member 360.

As illustrated in (a) of the drawing, a predetermined number of pads 371 for electrically connecting the external terminals 340 are provided on the mounting substrate 370. In addition, the heat dissipation member 360 such as a heat sink is disposed on the upper surface of the mounting substrate 370.

Further, a heat conductive member 350 is applied to the heat dissipation member 360, immediately below the back surface of the semiconductor chip 330. The heat conductive member 350 is similar to the heat conductive member 150 of the first embodiment. In addition, a sealing solder 380 is disposed in the heat dissipation member 360, immediately below sealing wiring pattern 322.

Further, as illustrated in (b) of the drawing, in the heat dissipation member 360, a rectangular protrusion 361 is formed at a position immediately below the back surface. A predetermined number of trenches such as a trench 362 are formed adjacent to at least a part of the outer periphery of the protrusion 361. For example, the trench is formed in substantially the same shape as the shape of the notch as viewed from the Z-axis direction. In a case where a total of eight notches are formed obliquely in the upper, lower, left, and right directions of the opening 323, similarly, a total of eight trenches are formed obliquely in the upper, lower, left, and right directions of the protrusion 361.

Figure 38:
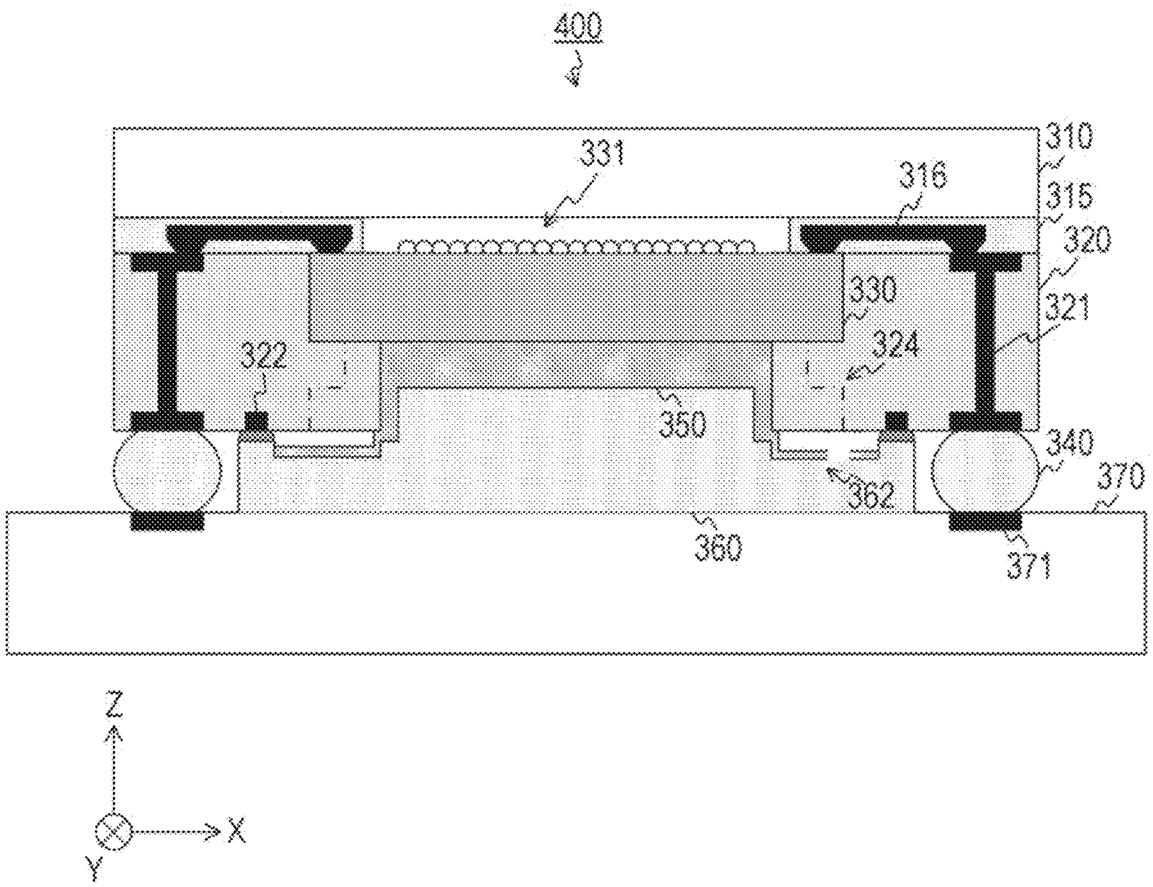
FIG. 38 is an example of a cross-sectional view of the semiconductor device according to the third embodiment of the present technology.

FIG. 38 is an example of a cross-sectional view of the semiconductor device 400 according to the third embodiment of the present technology. At the time of mounting the semiconductor package 300, the heat conductive member 350 spreads on the back surface of the semiconductor chip 330. However, the stages generated due to the notches and the trenches can prevent the outflow of the heat conductive member 350. As a result, a sufficient amount of the heat conductive member 350 can be applied to stabilize heat dissipation characteristics and improve cooling performance. Note that the notch 324 and the like and the trench 362 are examples of an outflow prevention part described in the claims.

Note that the shapes and the number of notches can be appropriately changed according to the shape of the heat dissipation member 360 to be mounted and the characteristics of the heat conductive member 350.

Figure 39:
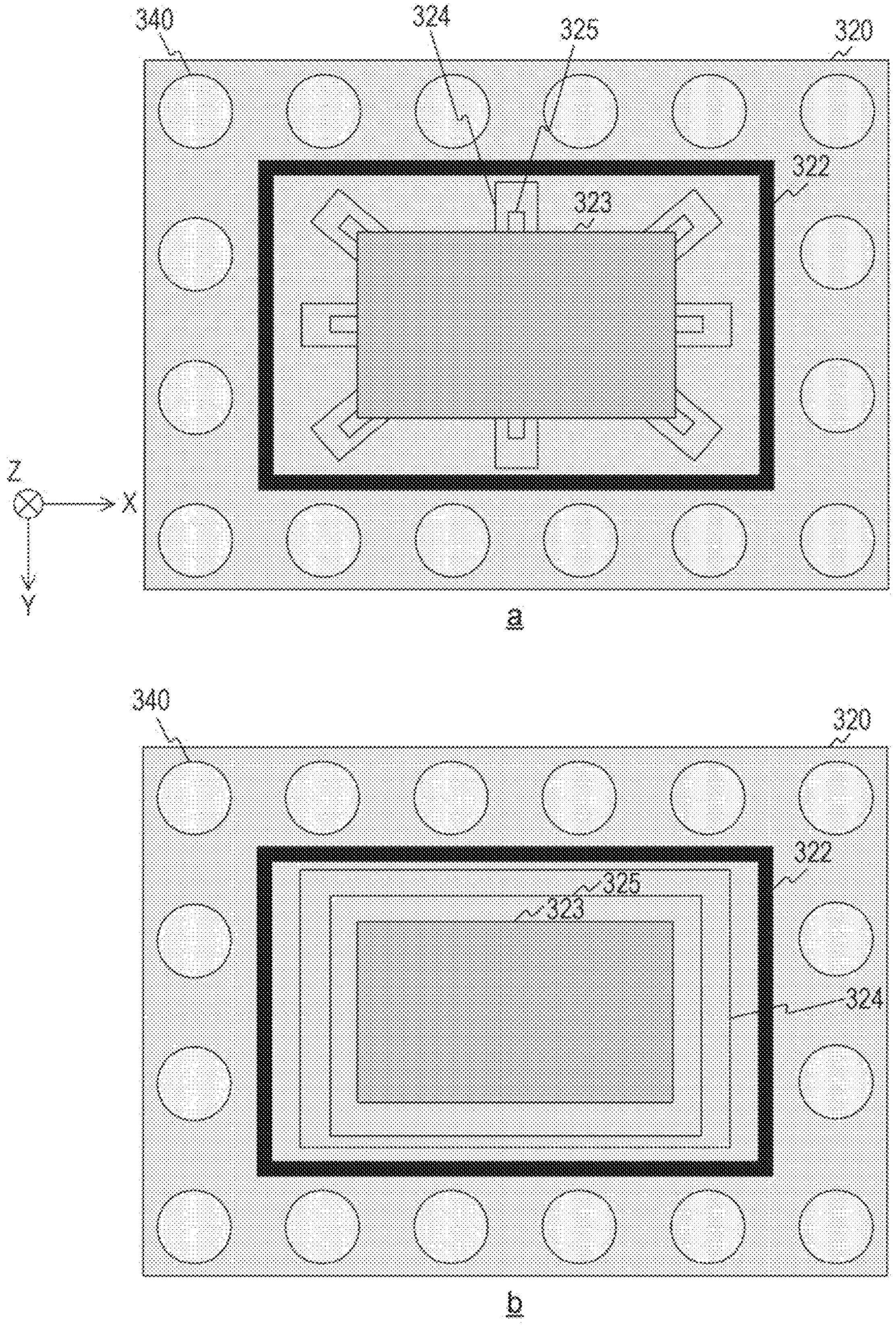
FIG. 39 is an example of a bottom view of the semiconductor package when a shape of a notch is changed according to the third embodiment of the present technology.

For example, the terminal ends of the notches 324, 325 have been in an arc shape, but the terminal ends can also be in the form of a pair of right angles as illustrated in (a) of FIG. 39. In addition, the notches 324, 325 have been formed adjacent to a part of the outer periphery of the opening 323, but the notches 324, 325 may be formed in a region surrounding the outer periphery of the opening 323, as illustrated in (b) of the drawing. For example, the notch 325 is formed so that the outer periphery thereof is a rectangle one size larger than the opening 323, and the notch 324 is formed so that the outer periphery thereof is a rectangle one size larger than the notch 325.

In addition, similarly, the shapes and the number of trenches can be changed appropriately.

Figure 40:
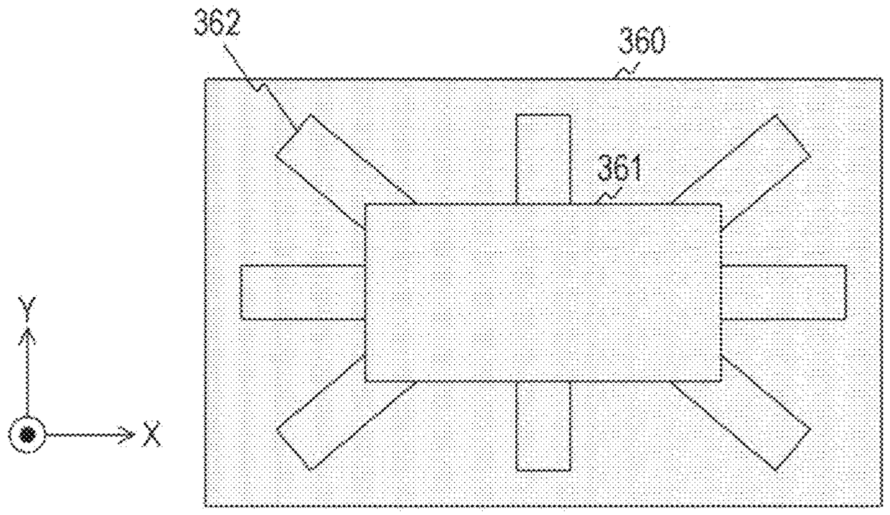
FIG. 40 is another example of a top view of a heat dissipation member according to the third embodiment of the present technology.
Figure 40:
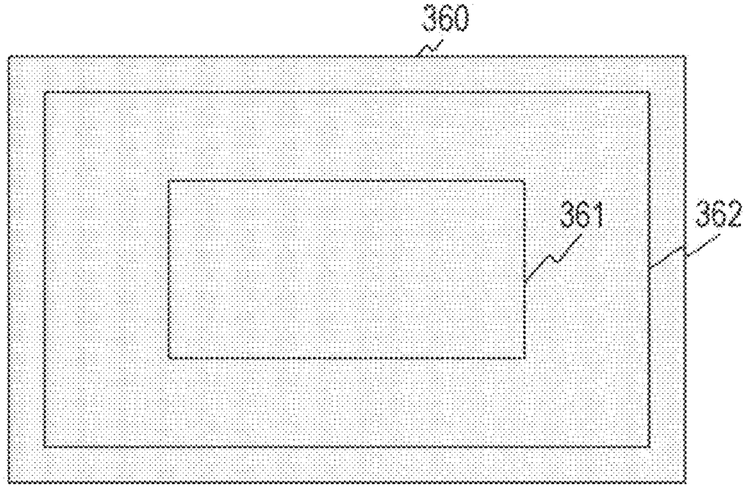

For example, the terminal end of the trench has been in an arc shape, but the terminal end can also be in the form of a pair of right angles as illustrated in (a) of FIG. 40. In addition, the trench has been formed adjacent to a part of the outer periphery of the protrusion 361, but the trench 362 may be formed in a region surrounding the outer periphery of the protrusion 361, as illustrated in (b) of the drawing. For example, the trench 362 is formed so that the outer periphery thereof has a rectangular shape one size larger than the protrusion 361.

In addition, the shape of the trench is substantially the same as the shape of the notch, but may be a different shape. For example, a trench may be formed in a region that does not overlap the notch when viewed from the Z-axis direction.

Figure 41:
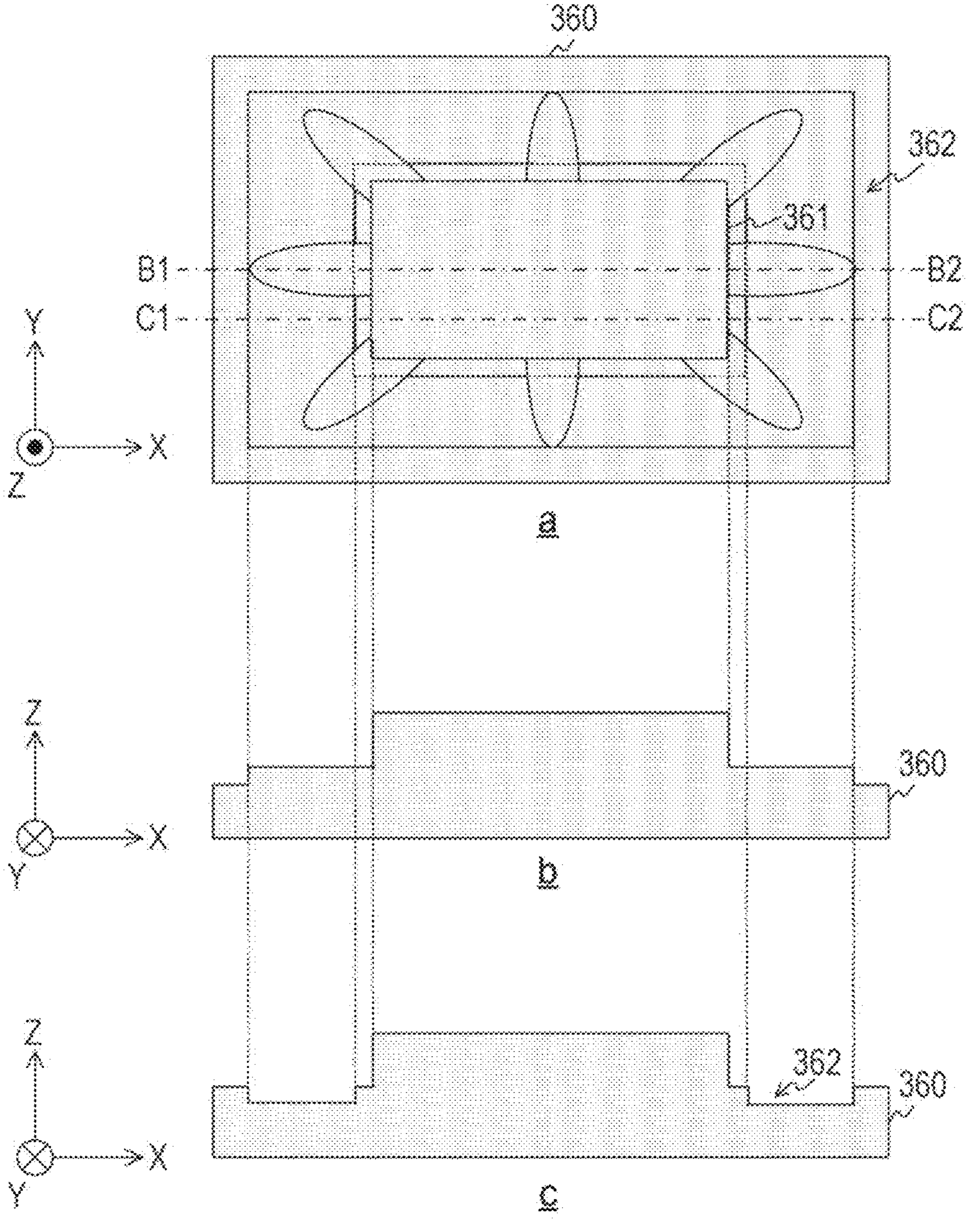
FIG. 41 is an example of a top view and a cross-sectional view of the heat dissipation member with a changed shape according to the third embodiment of the present technology.

(a) in FIG. 41 is a top view of the heat dissipation member 360 when a trench is formed in a region not overlapping the notch. (b) in the drawing is an example of a cross-sectional view taken along line segment B1-B2 of (a) in the drawing, and (c) in the drawing is an example of a cross-sectional view taken along line segment C1-C2 of (a) in the drawing. Note that the configuration of FIG. 41 can also be applied to (a) in FIG. 40.

Figure 42:
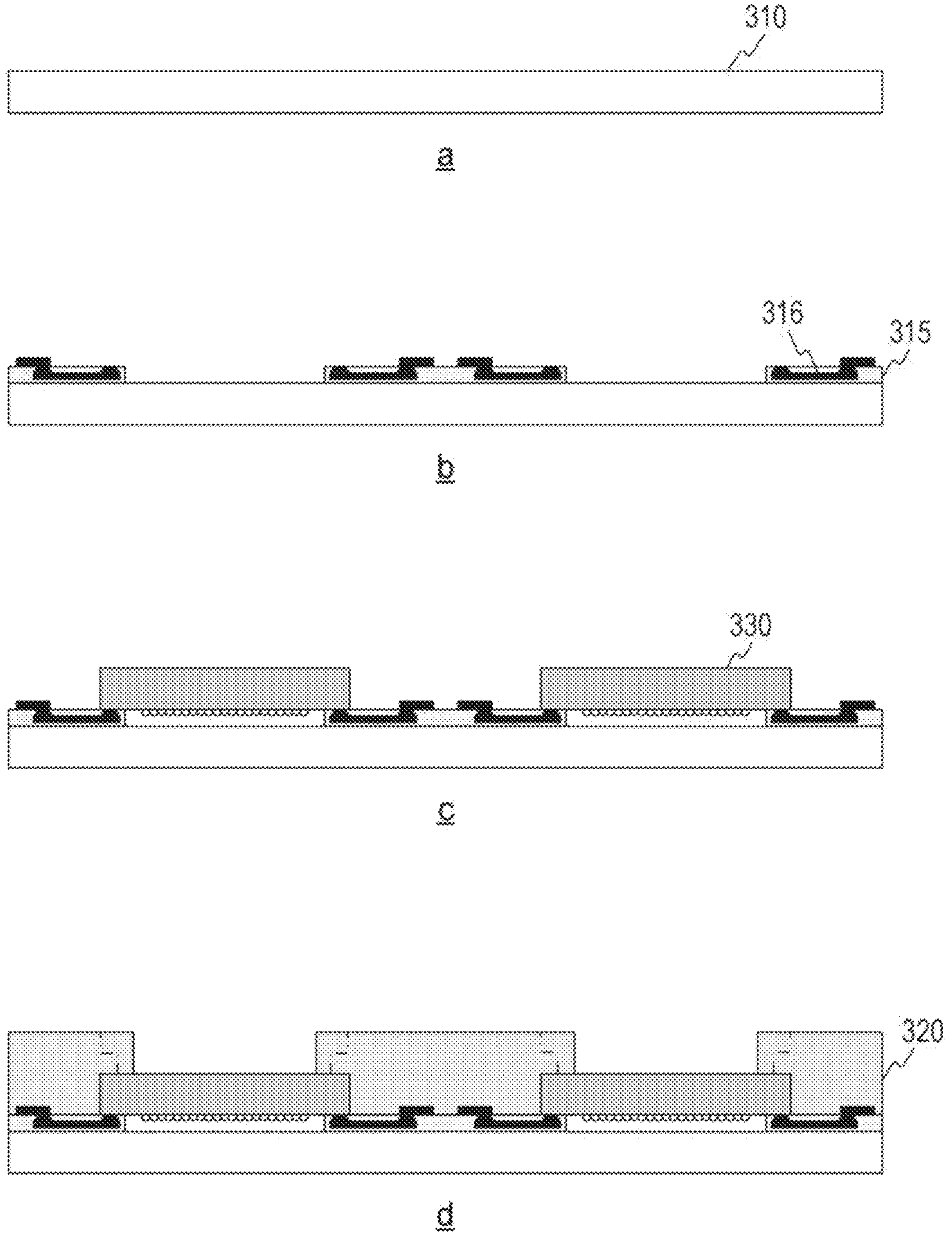
FIG. 42 is a view illustrating an example of a method for manufacturing the semiconductor package up to formation of a sealing resin according to the third embodiment of the present technology.

FIG. 42 is a view illustrating an example of a method for manufacturing the semiconductor package up to the formation of the sealing resin 320 according to the third embodiment of the present technology. The manufacturing system places the sealing glass 310 as illustrated in (a) of the drawing, and forms the rewiring layer 315 as illustrated in (b) of the drawing.

Then, the manufacturing system flip-chips the semiconductor chip 330 as illustrated in (c) of the drawing, and forms the sealing resin 320 by molding (not illustrated) as illustrated in (d) of the drawing.

Figure 43:
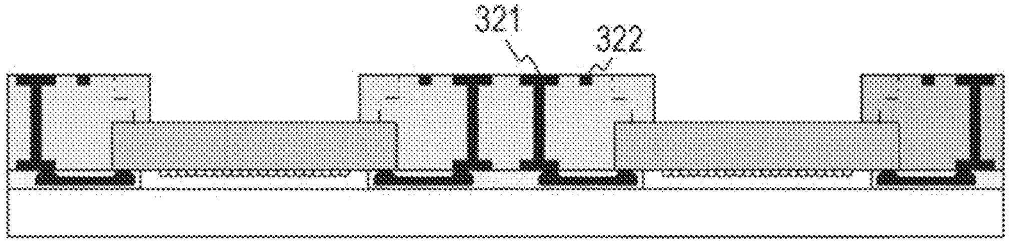
FIG. 43 is a view illustrating an example of a method for manufacturing the semiconductor package up to dicing according to the third embodiment of the present technology.
Figure 43:
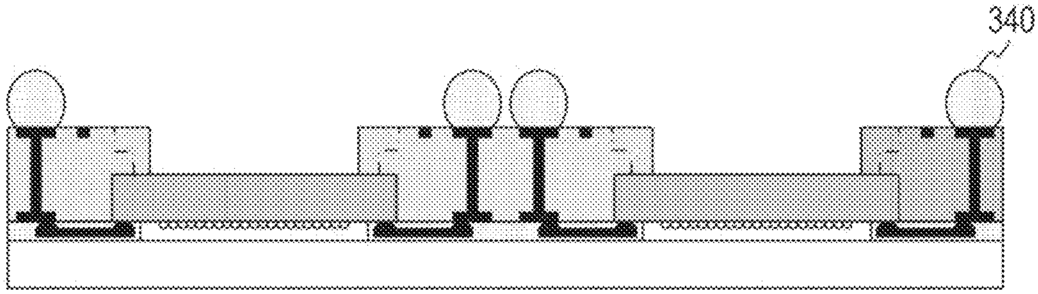
Figure 43:
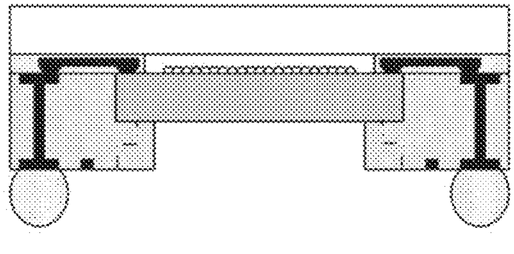

FIG. 43 is a view illustrating an example of a method for manufacturing the semiconductor package up to dicing according to the third embodiment of the present technology. After the formation of the sealing resin 320, the manufacturing system forms the through via 321 and the sealing wiring pattern 322 as illustrated in (a) of the drawing.

Then, the manufacturing system forms the external terminal 340 as illustrated in (b) of the drawing, and obtains individual pieces by dicing as illustrated in (c) of the drawing.

As described above, according to the third embodiment of the present technology, due to the formation of the notches 324, 325 in the FOWLP, the outflow of the heat conductive member 350 can be prevented in the semiconductor device 400 on which the FOWLP is mounted.

First Modification

In the third embodiment of the present technology described above, the semiconductor chip 330 has been sealed with the sealing glass 310, but there is a possibility that light is reflected by the rewiring 316 at the end of the sealing glass 310 to cause ghosting or flare. A semiconductor package 300 according to a first modification of the third embodiment differs from the third embodiment in that a sealing resin 365 is formed around the sealing glass 310.

Figure 44:
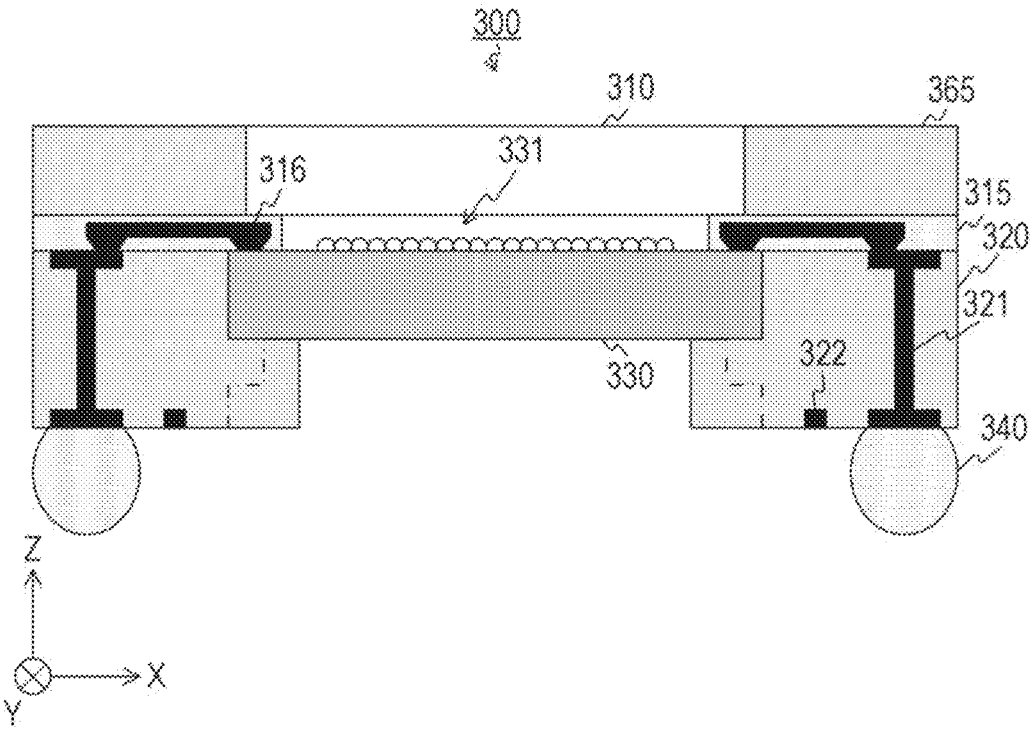
FIG. 44 is an example of a cross-sectional view of a semiconductor package according to a first modification of the third embodiment of the present technology.

FIG. 44 is an example of a cross-sectional view of the semiconductor package 300 according to the first modification of the third embodiment of the present technology. The semiconductor package 300 according to the first modification of the third embodiment differs from the third embodiment in further including the sealing resin 365.

The area of the sealing glass 310 of the first modification of the third embodiment is smaller than that of the third embodiment and larger than that of the light receiver 331. The sealing resin 365 is formed on the upper portion of the rewiring layer 315 around the sealing glass 310. The sealing resin 365 can prevent flare and ghosting.

Figure 45:
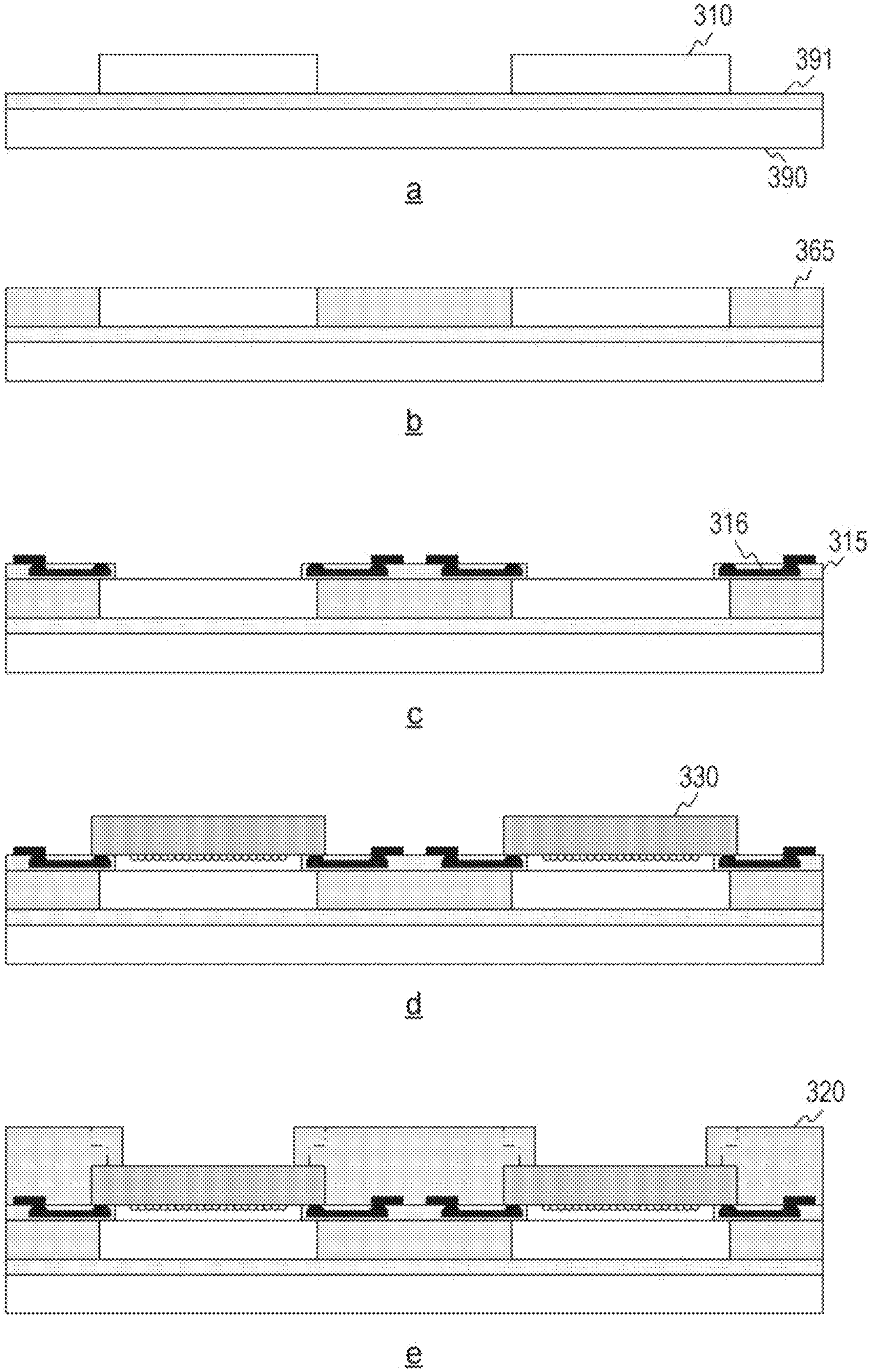
FIG. 45 is a view illustrating an example of a method for manufacturing the semiconductor package up to formation of a sealing resin according to the first modification of the third embodiment of the present technology.

FIG. 45 is a view illustrating an example of a method for manufacturing the semiconductor package 300 up to the formation of the sealing resin 320 according to the first modification of the third embodiment of the present technology. As illustrated in (a) of the drawing, the manufacturing system applies an adhesive 391 onto a support substrate 390 to bond the sealing glass 310.

The manufacturing system forms the sealing resin 365 around the sealing glass 310 as illustrated in (b) of the drawing, and forms the rewiring layer 315 as illustrated in (c) of the drawing.

Then, the manufacturing system flip-chips the semiconductor chip 330 as illustrated in (d) of the drawing, and forms the sealing resin 320 by molding (not illustrated) as illustrated in (e) of the drawing.

Figure 46:
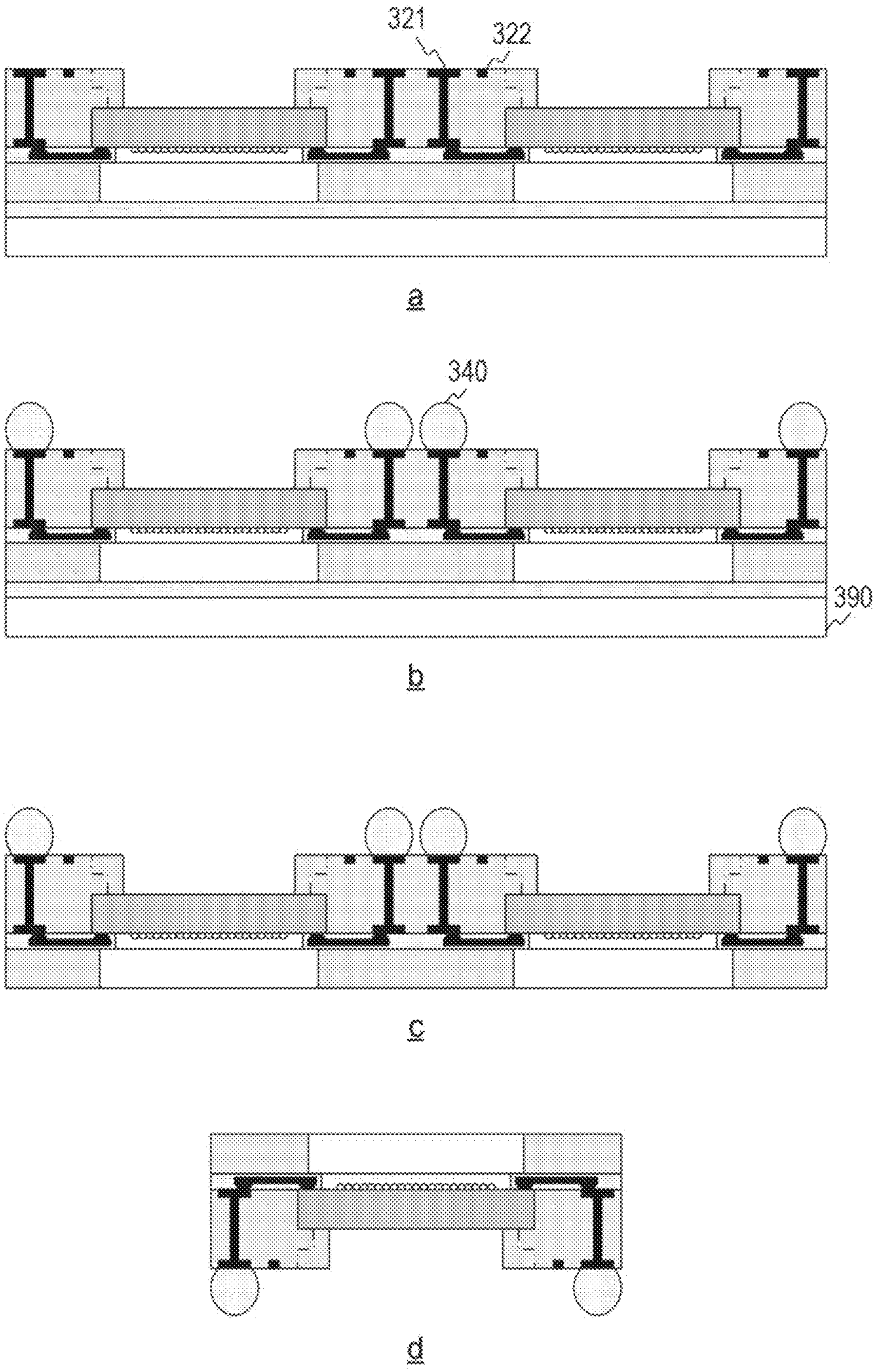
FIG. 46 is a view illustrating an example of a method for manufacturing the semiconductor package up to dicing according to the first modification of the third embodiment of the present technology.

FIG. 46 is a view illustrating an example of a method for manufacturing the semiconductor package up to dicing according to the first modification of the third embodiment of the present technology. After the formation of the sealing resin 320, the manufacturing system forms the through via 321 and the sealing wiring pattern 322 as illustrated in (a) of the drawing.

Then, the manufacturing system forms the external terminal 340 as illustrated in (b) of the drawing, and peels off the support substrate 390 as illustrated in (c) of the drawing. The manufacturing system obtains individual pieces by dicing as illustrated in (d) of the drawing.

As described above, according to the first modification of the third embodiment of the present technology, due to the formation of the sealing resin 365 around the sealing glass 310, ghosting and flare can be prevented.

Second Modification

In the third embodiment of the present technology described above, the through via 321 has been disposed in the sealing resin 320, but this configuration may result in insufficient strength. A semiconductor package 300 according to a second modification of the third embodiment differs from the third embodiment in that the through via 321 is disposed in the substrate.

Figure 47:
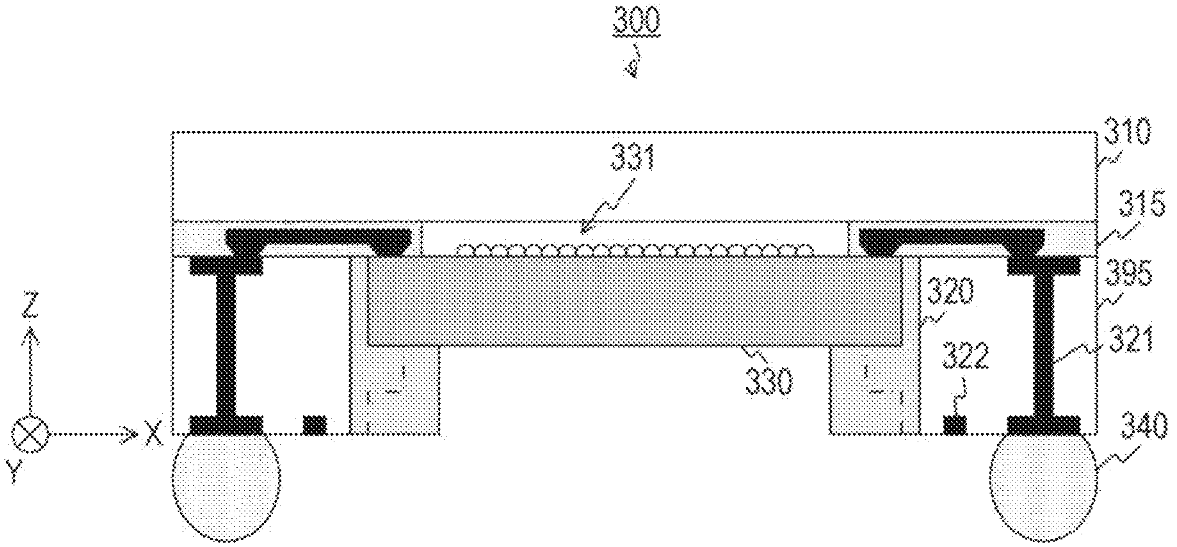
FIG. 47 is an example of a cross-sectional view of a semiconductor package according to a second modification of the third embodiment of the present technology.

FIG. 47 is an example of a cross-sectional view of the semiconductor package 300 according to the second modification of the third embodiment of the present technology. The semiconductor package 300 according to the second modification of the third embodiment differs from the third embodiment in further including a through-via substrate 395.

The sealing resin 320 of the second modification of the third embodiment has a smaller area than that of the third embodiment, and is formed inside the through-via substrate 395. In addition, the through via 321 and the sealing wiring pattern 322 are provided in the through-via substrate 395. With this configuration, the strength can be improved more than in the third embodiment.

Figure 48:
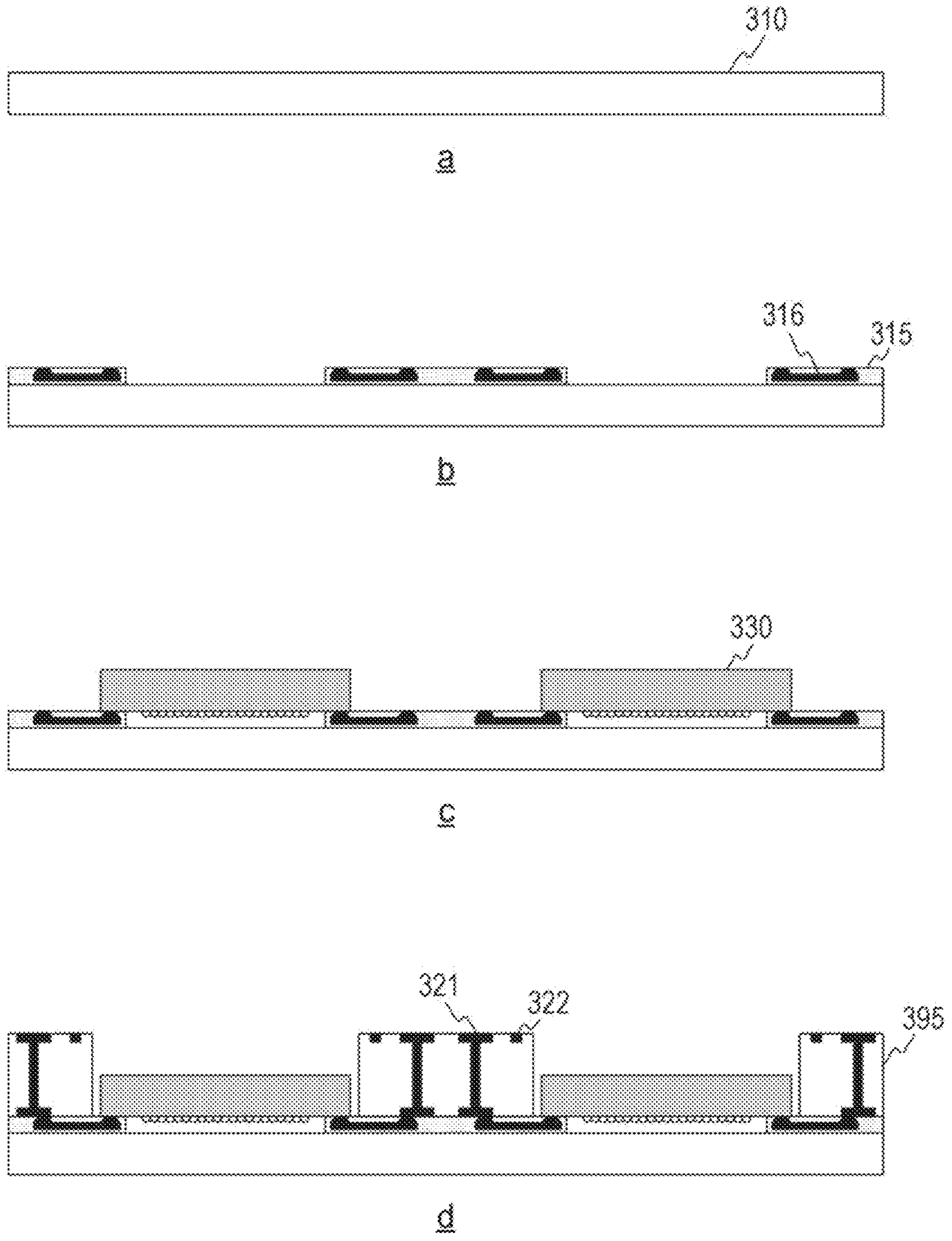
FIG. 48 is a view illustrating an example of a method for manufacturing the semiconductor package up to mounting of a through-via substrate according to the second modification of the third embodiment of the present technology.

FIG. 48 is a view illustrating an example of a method for manufacturing the semiconductor package up to the mounting of the through-via substrate 395 according to the second modification of the third embodiment of the present technology. The manufacturing system places the sealing glass 310 as illustrated in (a) of the drawing, and forms the rewiring layer 315 as illustrated in (b) of the drawing.

Then, the manufacturing system flip-chips the semiconductor chip 330 as illustrated in (c) of the drawing, and mounts the through-via substrate 395 as illustrated in (d) of the drawing.

Figure 49:
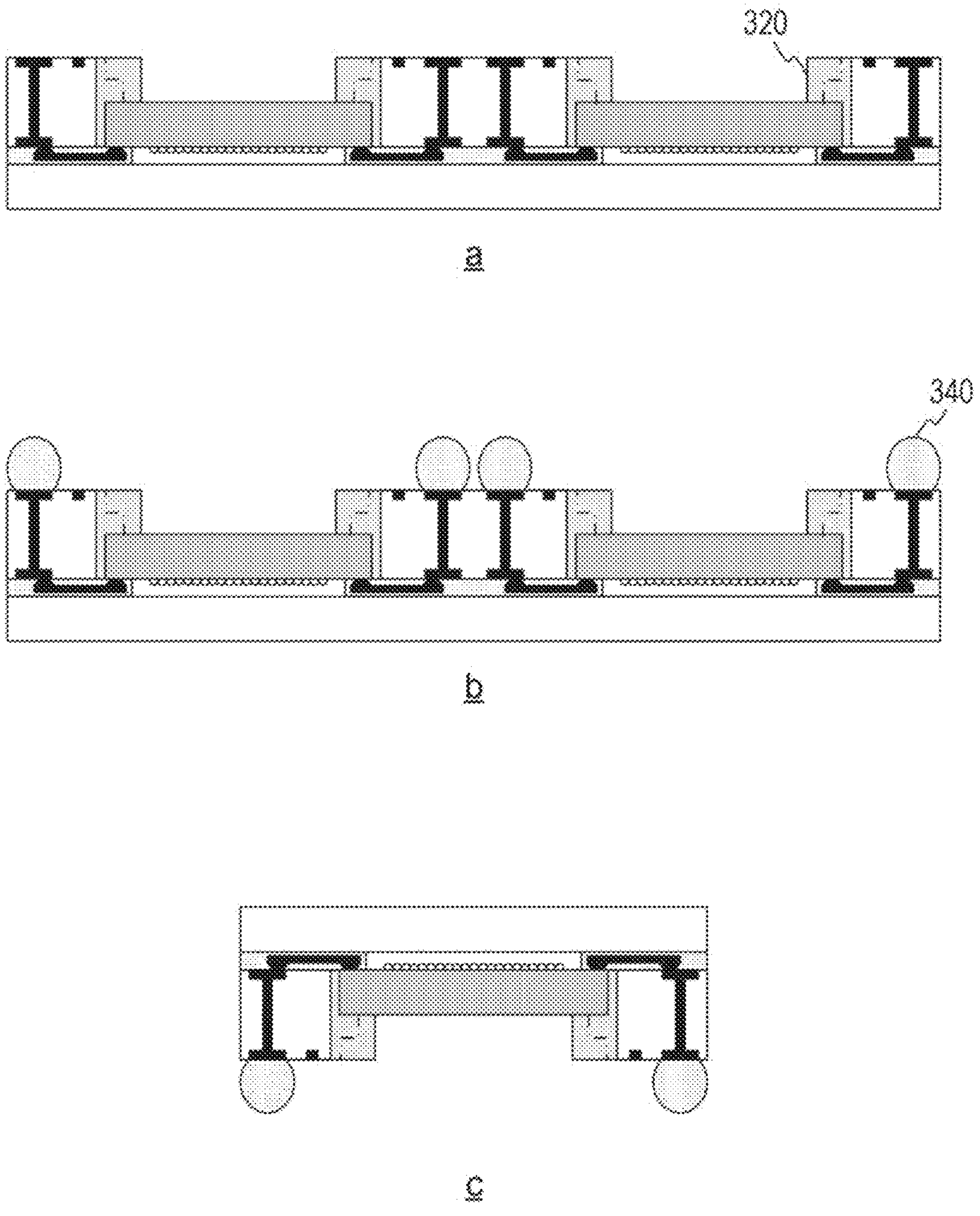
FIG. 49 is a view illustrating an example of a method for manufacturing the semiconductor package up to dicing according to the second modification of the third embodiment of the present technology.

FIG. 49 is a view illustrating an example of a method for manufacturing the semiconductor package up to dicing according to the second modification of the third embodiment of the present technology. After the mounting of the through-via substrate 395, the manufacturing system forms the sealing resin 320 as illustrated in (a) of the drawing, and forms the external terminal 340 as illustrated in (b) of the drawing. Then, the manufacturing system obtains individual pieces by dicing as illustrated in (c) of the drawing.

As described above, according to the second modification of the third embodiment of the present technology, the strength can be improved due to the provision of the through-via substrate 395.

Third Modification

In the second modification of the third embodiment of the present technology described above, the semiconductor chip 330 has been sealed with the sealing glass 310, but there is a possibility that light is reflected by the rewiring 316 at the end of the sealing glass 310 to cause ghosting or flare. A semiconductor package 300 according to a third modification of the third embodiment differs from the second modification of the third embodiment in that the sealing resin 365 is formed around a sealing glass 310.

Figure 50:
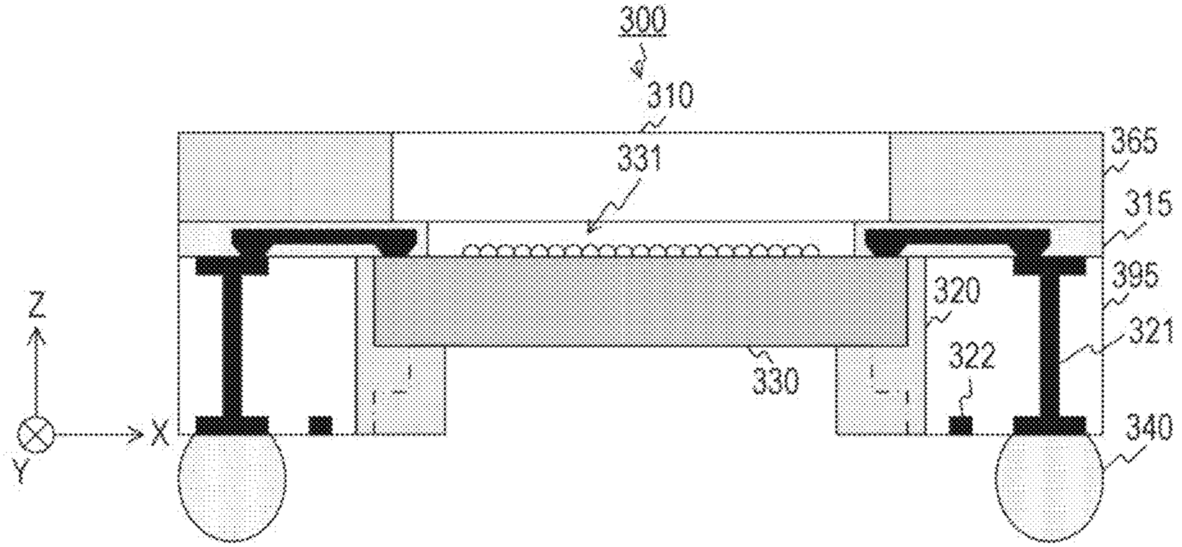
FIG. 50 is an example of a cross-sectional view of a semiconductor package according to a third modification of the third embodiment of the present technology.

FIG. 50 is an example of a cross-sectional view of the semiconductor package 300 according to the third modification of the third embodiment of the present technology. The semiconductor package 300 according to the third modification of the third embodiment differs from the second modification of the third embodiment in further including the sealing resin 365.

The area of the sealing glass 310 of the third modification of the third embodiment is smaller than that of the second modification of the third embodiment and larger than that of the light receiver 331. The sealing resin 365 is formed on the upper portion of the rewiring layer 315 around the sealing glass 310. The sealing resin 365 can prevent flare and ghosting.

Figure 51:
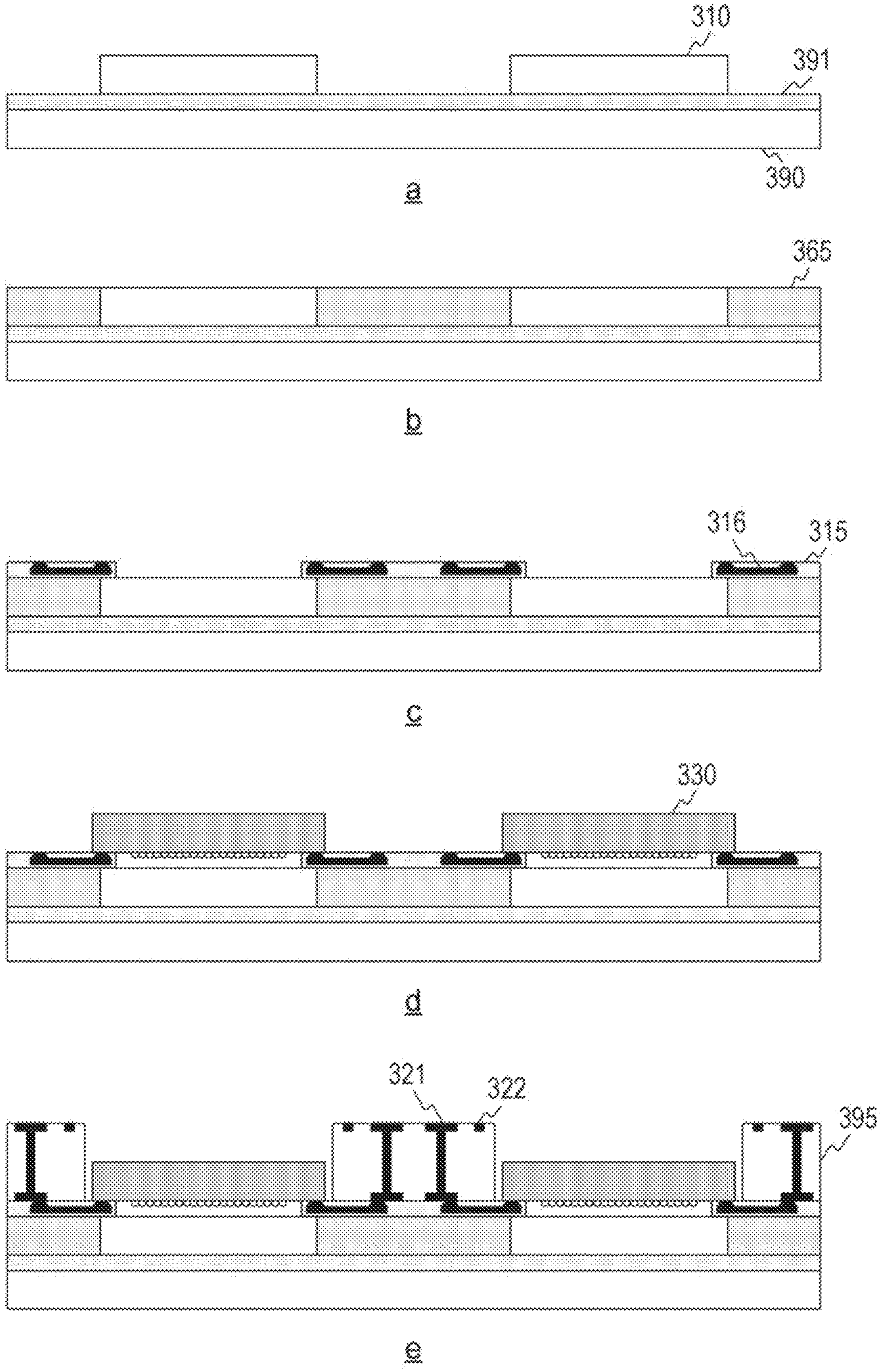
FIG. 51 is a view illustrating an example of a method for manufacturing the semiconductor package up to mounting of a through-via substrate according to the third modification of the third embodiment of the present technology.

FIG. 51 is a view illustrating an example of a method for manufacturing the semiconductor package 300 up to the formation of the sealing resin 320 according to the third modification of the third embodiment of the present technology. As illustrated in (a) of the drawing, the manufacturing system applies an adhesive 391 onto a support substrate 390 to bond the sealing glass 310.

The manufacturing system forms the sealing resin 365 around the sealing glass 310 as illustrated in (b) of the drawing, and forms the rewiring layer 315 as illustrated in (c) of the drawing.

Then, the manufacturing system flip-chips the semiconductor chip 330 as illustrated in (d) of the drawing, and mounts the through-via substrate 395 as illustrated in (e) of the drawing.

Figure 52:
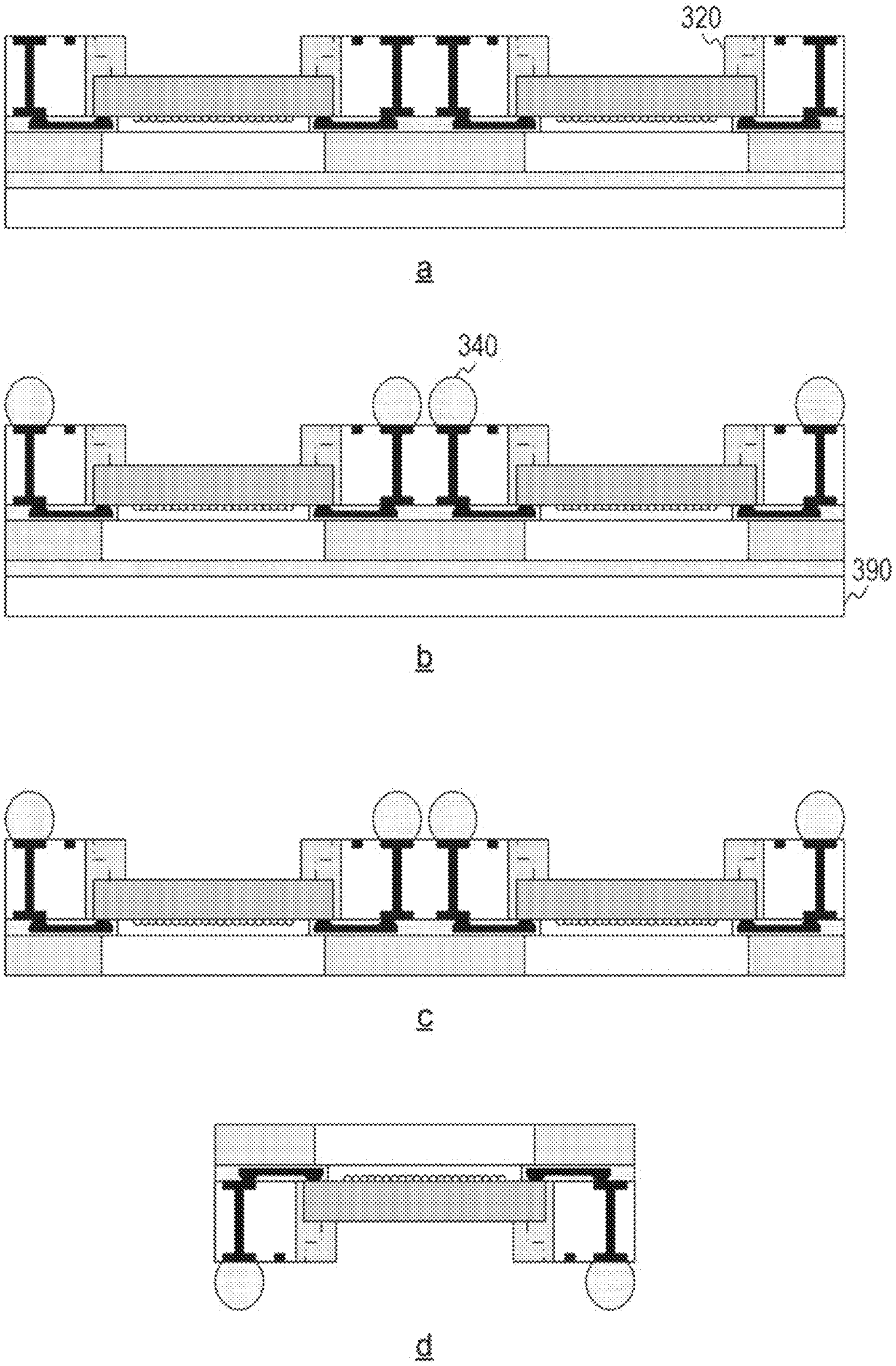
FIG. 52 is a view illustrating an example of a method for manufacturing the semiconductor package up to dicing according to the third modification of the third embodiment of the present technology.

FIG. 52 is a view illustrating an example of a method for manufacturing the semiconductor package up to dicing according to the third modification of the third embodiment of the present technology. After the mounting of the through-via substrate 395, the manufacturing system forms the sealing resin 320 as illustrated in (a) of the drawing, and forms the external terminal 340 as illustrated in (b) of the drawing. Then, the manufacturing system peels the support substrate 390 as illustrated in (c) of the drawing, and obtains individual pieces by dicing as illustrated in (d) of the drawing.

As described above, according to the third modification of the third embodiment of the present technology, due to the formation of the sealing resin 365 around the sealing glass 310, ghosting and flare can be prevented.

4. Fourth Embodiment

In the first embodiment of the present technology described above, the heat dissipation member 160 without a pin has been mounted, but a pin-provided heat dissipation member 160 can also be mounted. A semiconductor package 300 of a fourth embodiment differs from the first embodiment in that the pin-provided heat dissipation member 160 is used.

Figure 53:
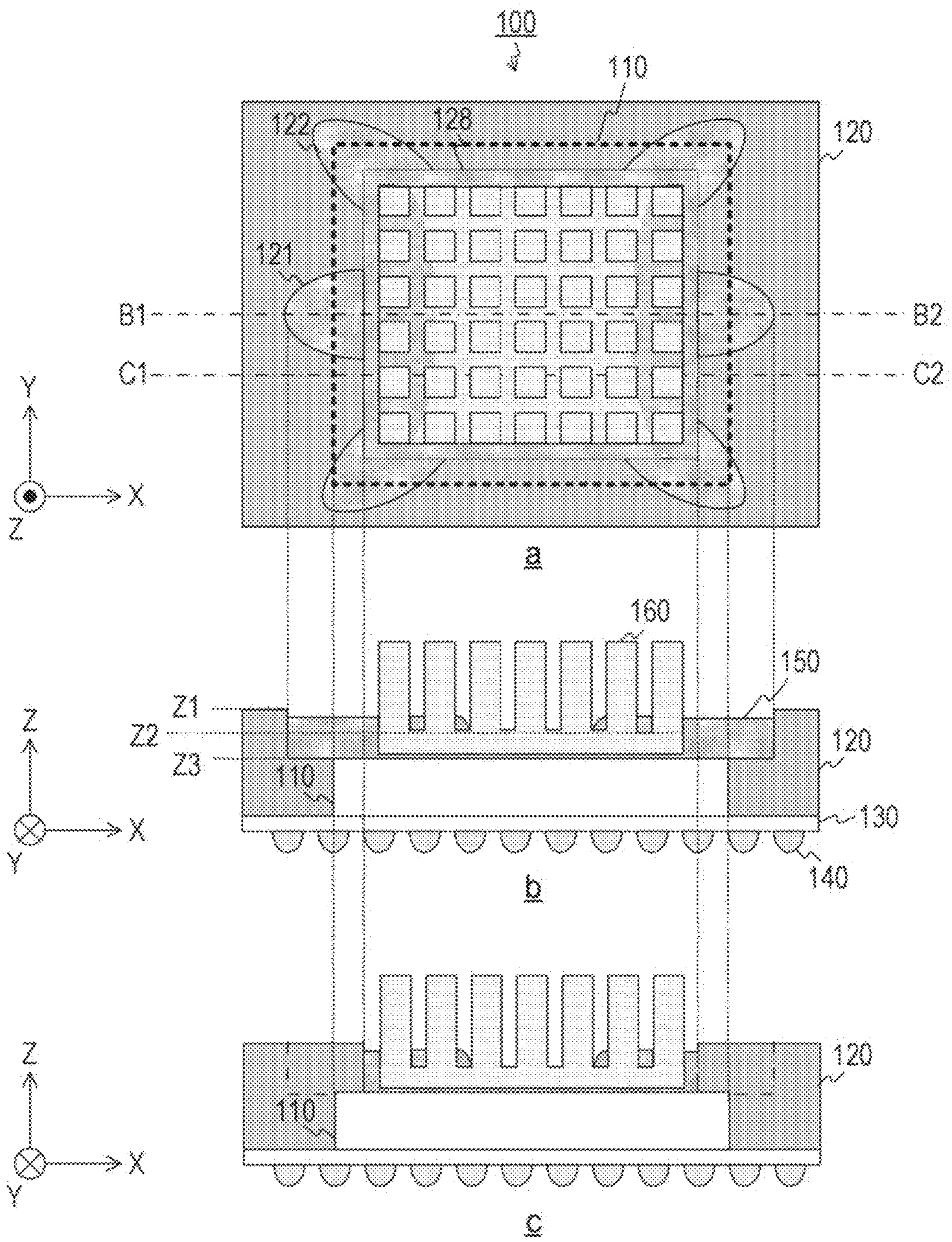
FIG. 53 is an example of a top view and a cross-sectional view of a semiconductor package according to a fourth embodiment of the present technology.

FIG. 53 is an example of a top view and a cross-sectional view of the semiconductor package 100 according to the fourth embodiment of the present technology. (a) in the drawing is an example of a top view of the semiconductor package 100. (b) in the drawing is an example of a cross-sectional view taken along line segment B1-B2 of (a) in the drawing, and (c) in the drawing is an example of a cross-sectional view taken along line segment C1-C2 of (a) in the drawing.

Further, the heat dissipation member 160 of the fourth embodiment has a rectangular shape as viewed in the Z-axis direction, and includes a plurality of pins protruding in the Z-axis direction. In the heat dissipation member 160, a portion of a base to which a pin is attached is hereinafter referred to as a "base". Specifically, a portion below the position of Z2 in the Z-axis direction corresponds to the base, and a portion above Z2 corresponds to the pins. Note that the pin is an example of a protrusion described in the claims.

The position of the front surface of the semiconductor chip 110 in the Z-axis direction is defined as Z3. Further, the position of the upper surface of the sealing resin 120 in the Z-axis direction is defined as Z1. For example, with reference to Z3, the distance from Z3 to Z2 is defined as the base height, and the distance from Z3 to Z1 is defined as the height of the sealing resin 120.

The height of the base of the heat dissipation member 160 is adjusted to be lower than that of the sealing resin 120. By making the height of the base lower than that of the sealing resin 120, it is possible to apply a sufficient amount of the heat conductive member 150 to penetrate between the pins.

Here, a comparative example of a configuration in which the height of the base of the heat dissipation member 160 is about the same as that of the sealing resin 120 or higher than that of the sealing resin 120 is assumed.

Figure 54:
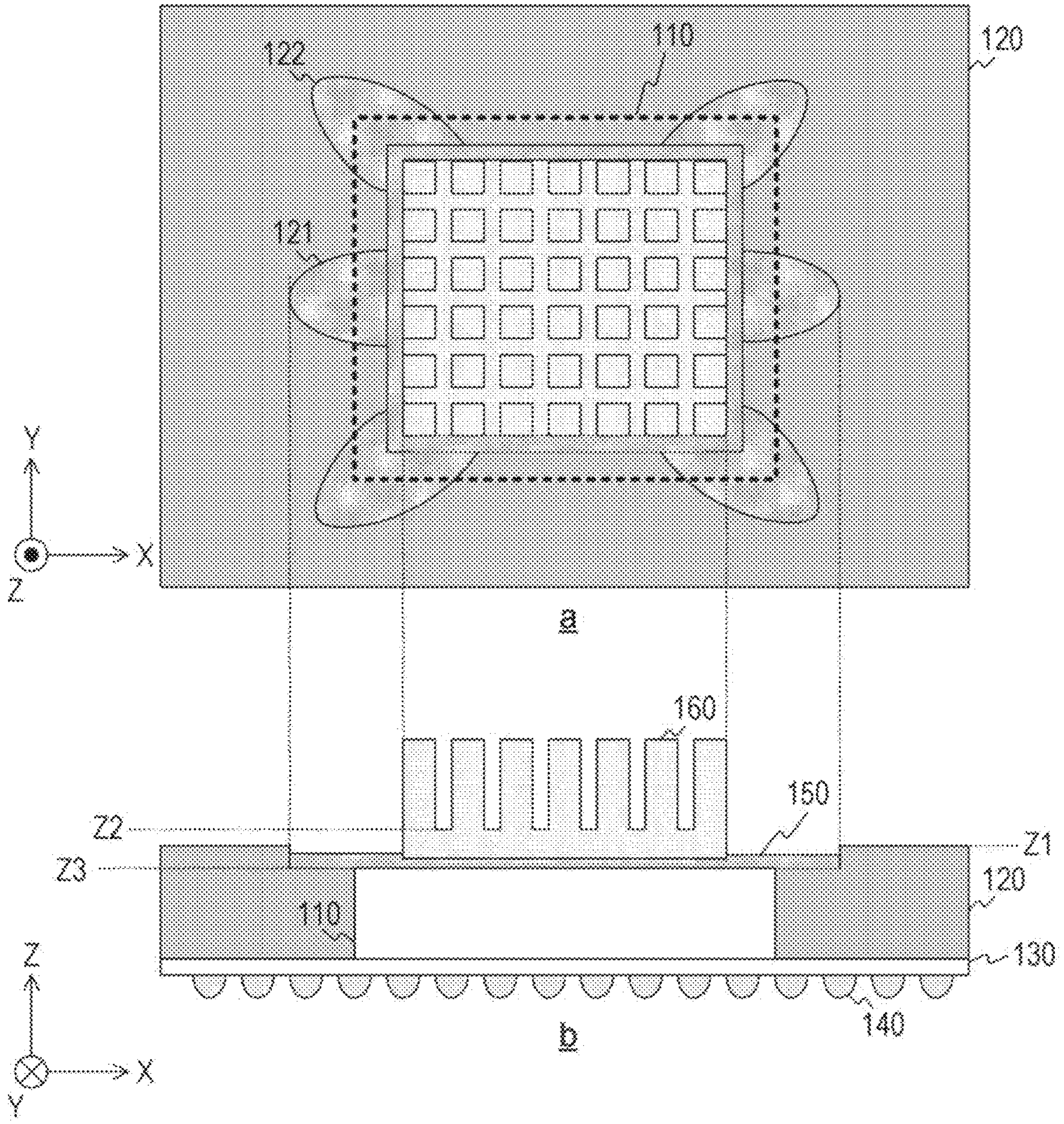
FIG. 54 is an example of a top view and a cross-sectional view of a semiconductor package in a comparative example.

FIG. 54 is an example of a top view and a cross-sectional view of a semiconductor package in a comparative example. (a) in the drawing is an example of a top view of the semiconductor package 100, and (b) in the drawing is an example of a cross-sectional view of the semiconductor package 100.

As illustrated in (b) of the drawing, in the comparative example, the height of the base of the heat dissipation member 160 is higher than that of the sealing resin 120. With this configuration, there is a possibility that the amount of the heat conductive member 150 is insufficient because the heat conductive member 150 does not penetrate between the pins. Hence it is necessary to increase the areas of the notches 121, 122 so that a sufficient amount of the heat conductive member 150 can be applied. In addition, there is a possibility that the size of the semiconductor package 100 also increases according to the enlargement of the notches 121, 122.

Figure 55:
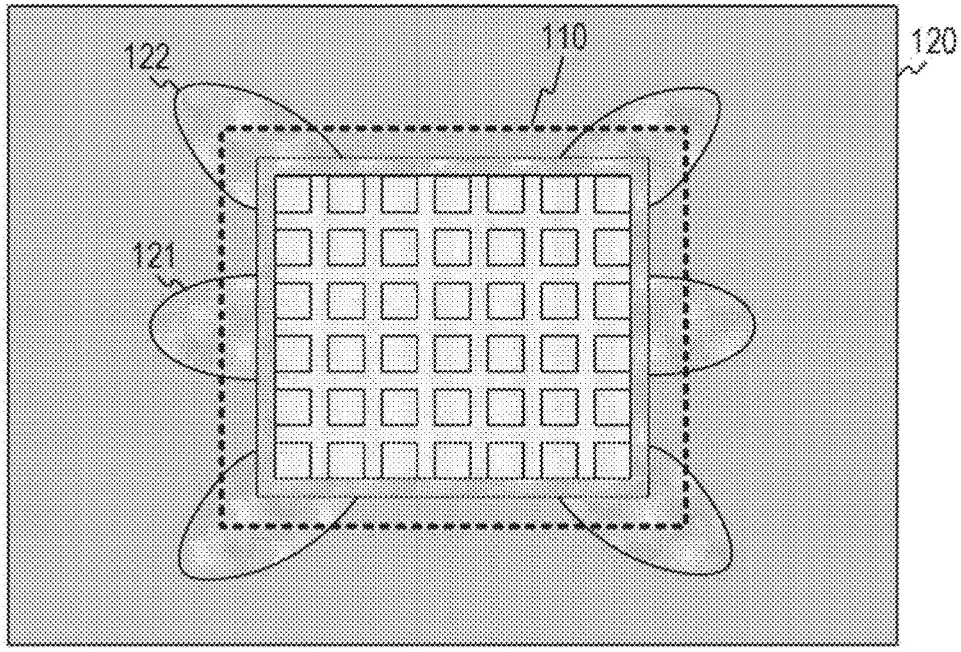
FIG. 55 is an example of a top view of each semiconductor package of the comparative example and the fourth embodiment of the present technology.
Figure 55:
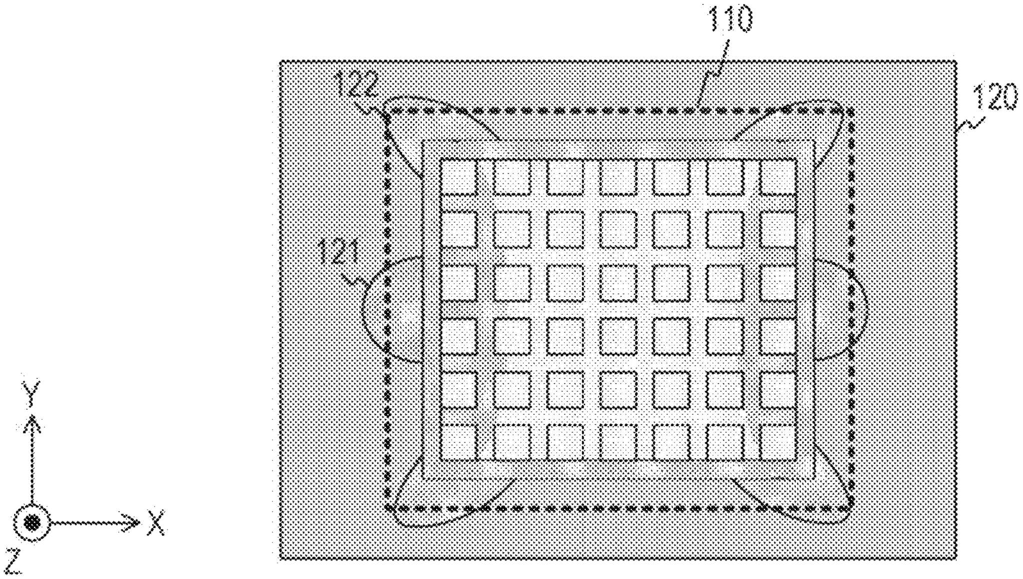

FIG. 55 is an example of a top view of the semiconductor package 100 according to each of the comparative example and the fourth embodiment of the present technology. (a) in the drawing is an example of a top view of the semiconductor package 100 of the comparative example, and (b) in the drawing is an example of a top view of the semiconductor package 100 of the fourth embodiment in which the height of the base is lower than that of the sealing resin 120.

In the comparative example, the areas of the notches 121, 122 need to be increased because the heat conductive member 150 does not penetrate between the pins. The size of the semiconductor package 100 also increases according to the enlargement of the notches 121, 122.

In contrast, in the fourth embodiment, with the height of the base lower than that of the sealing resin 120, the heat conductive member 150 penetrates between the pins, and a sufficient amount of the heat conductive member 150 can be applied. Therefore, it is not necessary to enlarge the notch 121 and the like, and as illustrated in (b) of the drawing, the notch 121 and the like can be made smaller to reduce the size of the semiconductor package 200.

Figure 56:
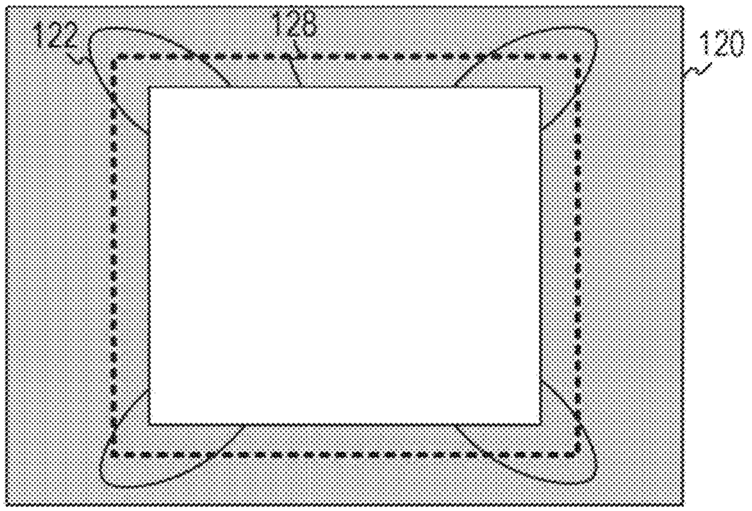
FIG. 56 is a view illustrating an example of a shape of a notch according to the fourth embodiment of the present technology.
Figure 56:
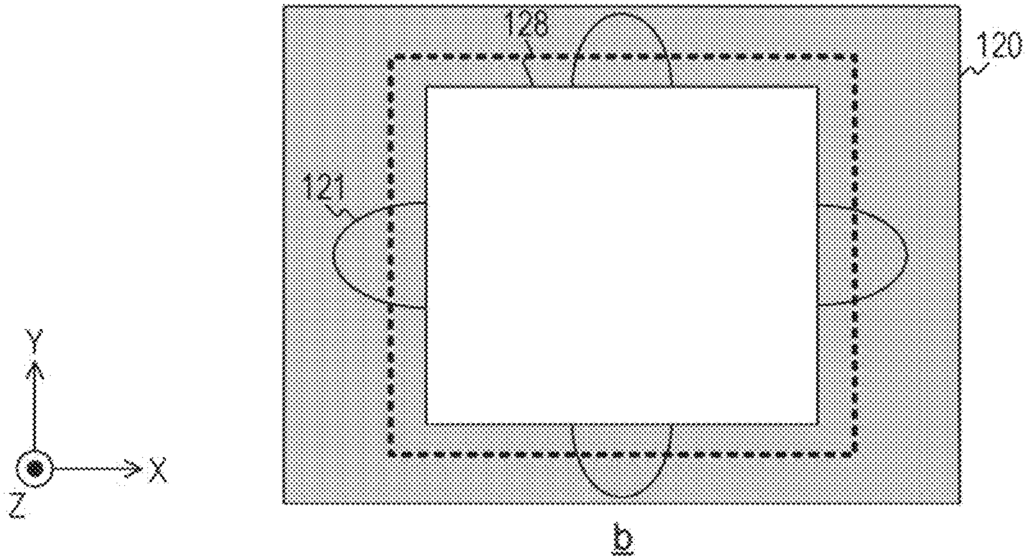

Note that the shapes and the number of notches can be changed appropriately. For example, as illustrated in (a) of FIG. 56, four notches such as the notch 122 can be formed obliquely from the four corners of the opening 128. Alternatively, as illustrated in (b) of the drawing, four notches such as the notch 121 can be formed in the X-axis direction or the Y direction from the upper, lower, left, and right of the opening 128.

Figure 57:
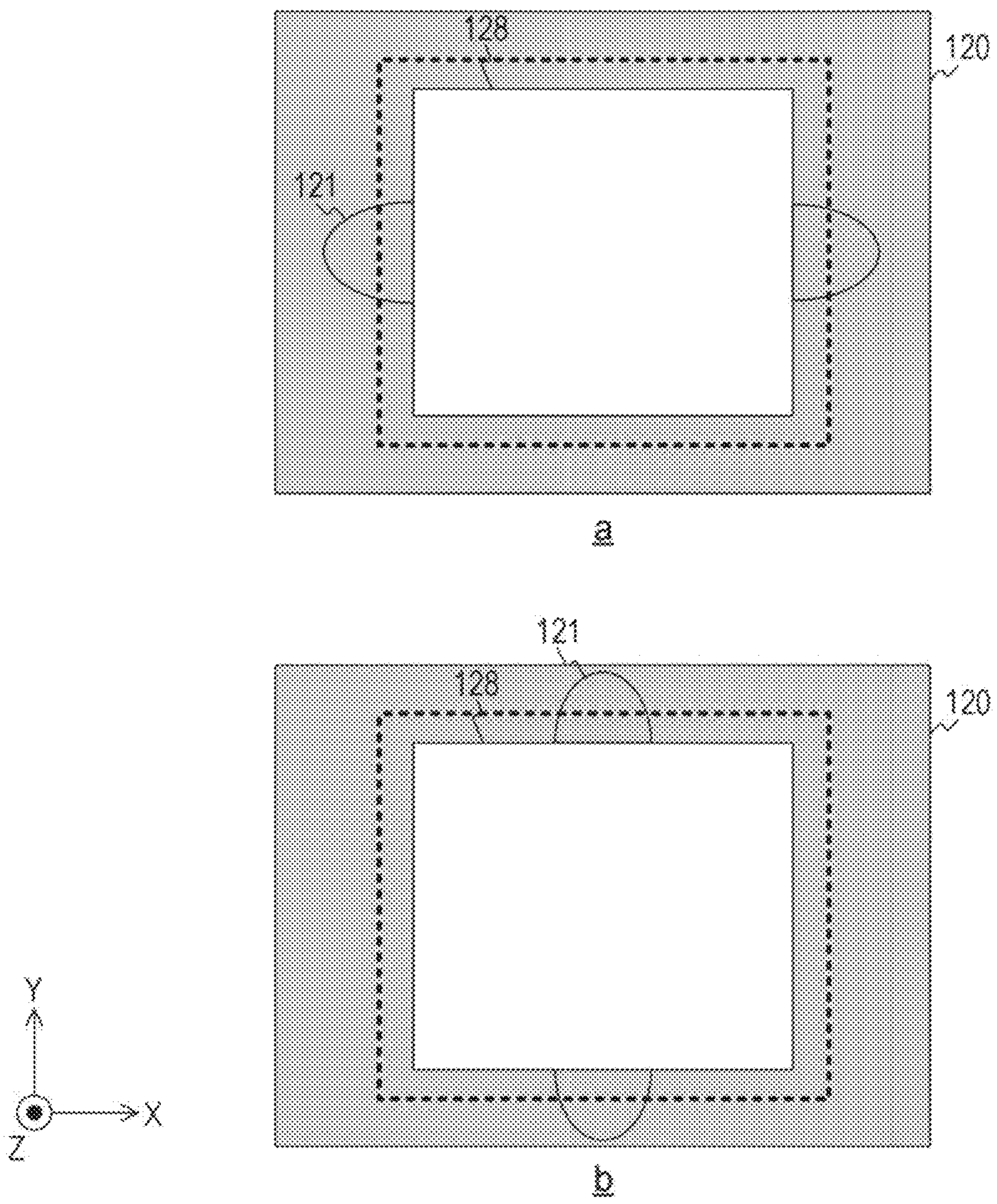
FIG. 57 is a view illustrating another example of the shape of the notch according to the fourth embodiment of the present technology.

Further, as illustrated in (a) of FIG. 57, two notches can be formed in the X-axis direction from the left and right of the opening 128. Alternatively, as illustrated in (b) of the drawing, two notches may be formed in the Y-axis direction from above and below the opening 128.

Figure 58:
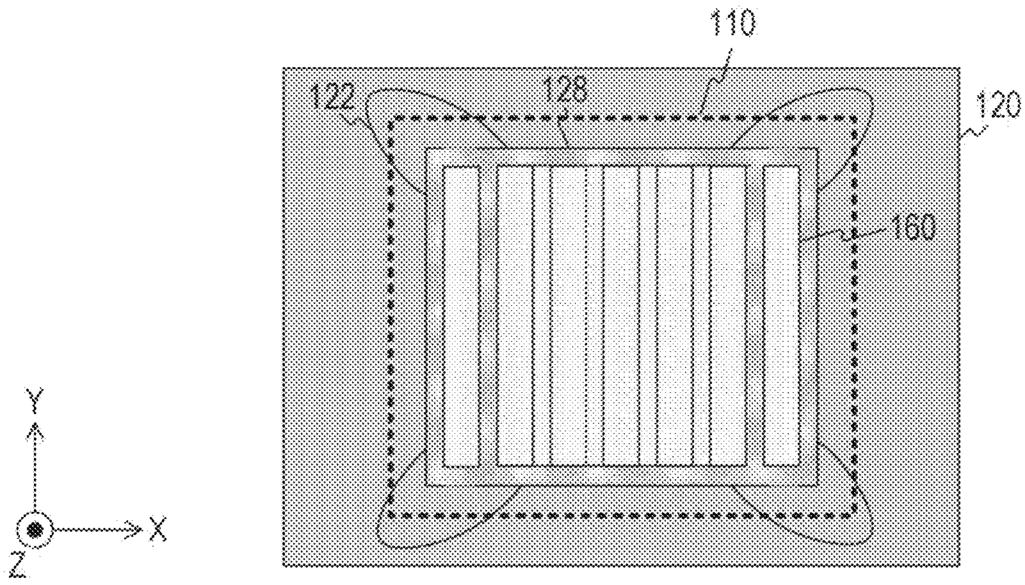
FIG. 58 is a view illustrating an example of a fin-provided heat dissipation member and a fixing resin according to the fourth embodiment of the present technology.
Figure 58:
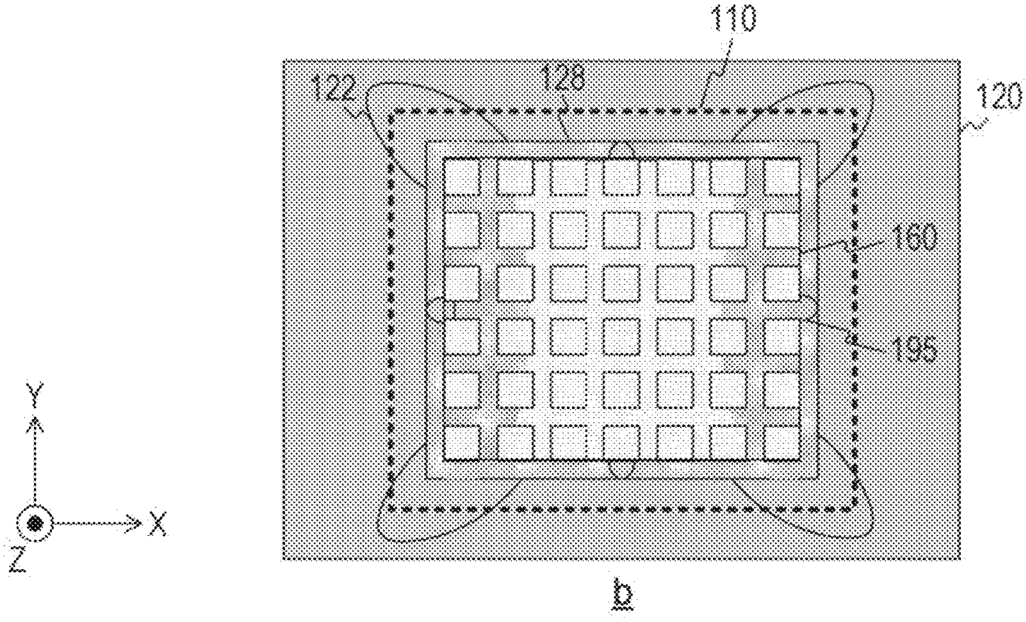

In addition, although the pin-provided heat dissipation member 160 is used, as illustrated in (a) of FIG. 58, it is possible to use a heat dissipation member 160 provided with fins instead of pins. Note that the fin is an example of a protrusion described in the claims.

Further, as illustrated in (b) of the drawing, it is also possible to provide a fixing resin 195 for fixing the position of the heat dissipation member 160.

Figure 59:
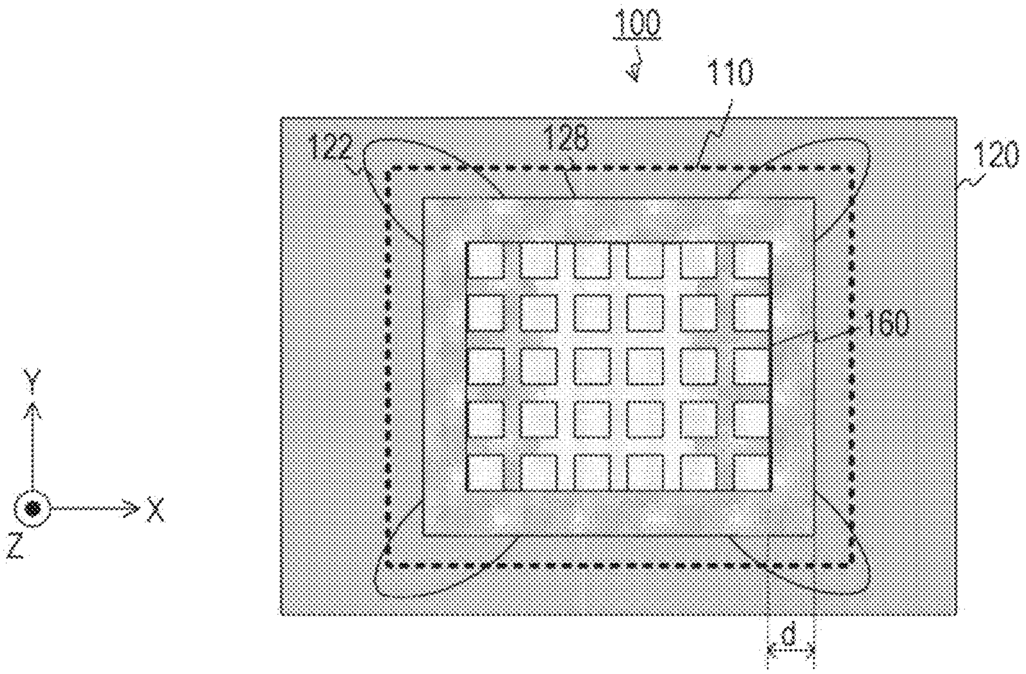
FIG. 59 is a view illustrating an example of the size of the heat dissipation member according to the fourth embodiment of the present technology.

In addition, as illustrated in FIG. 59, a distance d between the outer periphery of the heat dissipation member 160 and the outer periphery of the opening 128 can be sufficiently increased to reduce the size of the heat dissipation member 160.

As described above, according to the fourth embodiment of the present technology, the size of the semiconductor package 100 can be reduced because the height of the base is lower than that of the sealing resin 120.

Modification

In the fourth embodiment of the present technology described above, the heat dissipation member 160 has been a rectangular shape. However, there is a possibility that the amount of the heat conductive member 150 is insufficient when the area of the heat dissipation member 160 is large. A semiconductor package 100 according to a modification of the fourth embodiment differs from the fourth embodiment in that the four corners of the heat dissipation member 160 are reduced.

Figure 60:
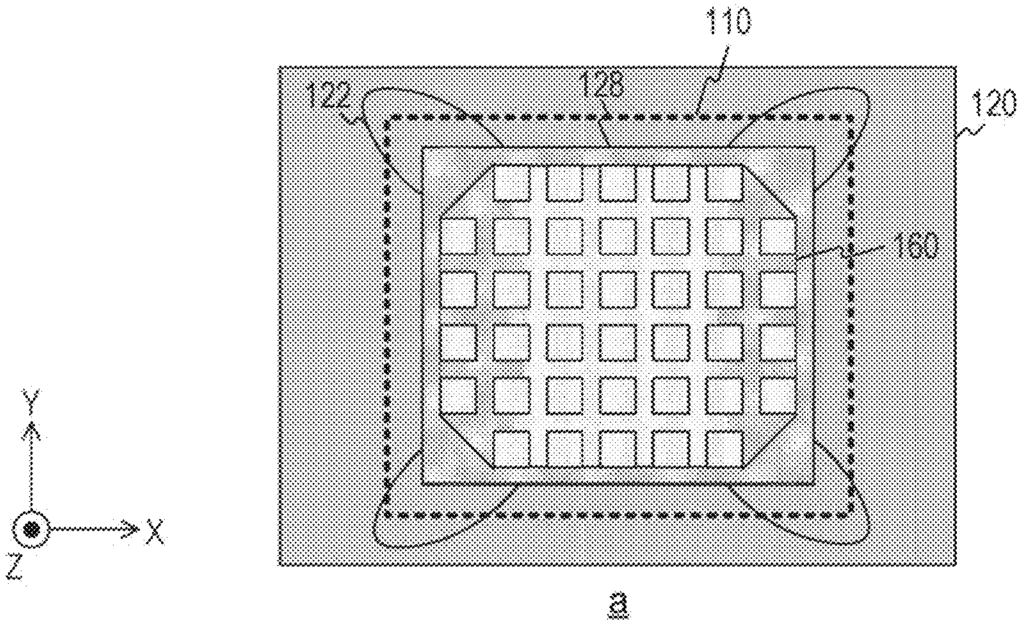
FIG. 60 is a view illustrating an example of a top view of a semiconductor package according to a first modification of the fourth embodiment of the present technology.
Figure 60:
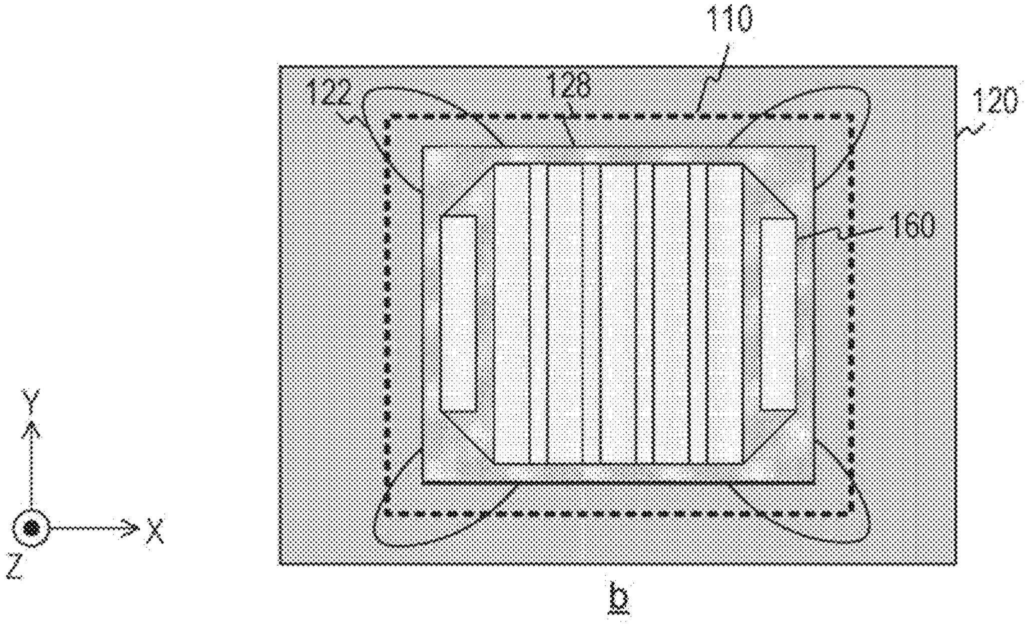

FIG. 60 is a view illustrating an example of a top view of the semiconductor package 100 according to the modification of the fourth embodiment of the present technology. (a) in the drawing illustrates a top view when the pin-provided heat dissipation member 160 is provided, and (b) in the drawing illustrates a top view when the fin-provided heat dissipation member 160 is provided.

The semiconductor package 100 according to the modification of the fourth embodiment differs from the fourth embodiment in that the four corners of the heat dissipation member 160 are reduced. In the case of the pin-provided heat dissipation member 160, as illustrated in (a) of the drawing, the pins at the four corners are reduced, and the shape of the heat dissipation member 160 is an octagon when viewed from the Z-axis direction. The reduction of the four corners enables a larger amount of heat conductive member 150.

Note that as illustrated in (b) of the drawing, the four corners of the fin-provided heat dissipation member 160 can be reduced.

Figure 61:
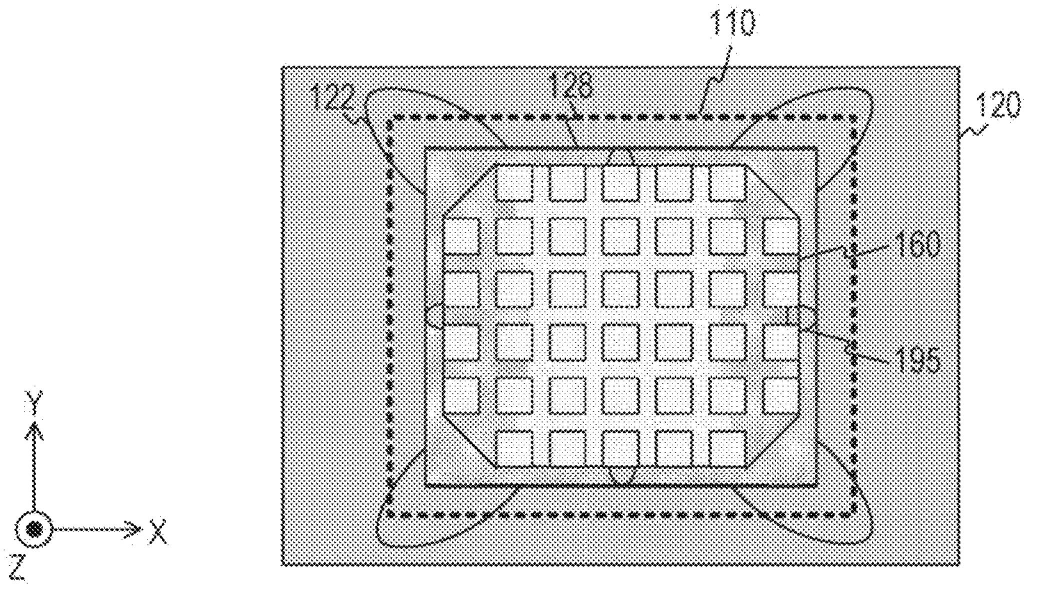
FIG. 61 is a view illustrating an example of a top view of the semiconductor package provided with a fixing resin according to the first modification of the fourth embodiment of the present technology.

In addition, as illustrated in FIG. 61, the four corners can be reduced, and the fixing resin 195 can be further provided.

As described above, according to the modification of the fourth embodiment of the present technology, due to the reduction in the four corners of the heat dissipation member 160, the amount of the heat conductive member 150 can be increased.

5. Fifth Embodiment

In the first embodiment of the present technology described above, the notch 121 and the like have been formed adjacent to the opening 128 and the like. However, there is a possibility that the heat conductive member 150 flows out to the outside when the amount of the heat conductive member 150 is large. A semiconductor package 100 of a fifth embodiment differs from the first embodiment in that a trench is formed in a notch.

Figure 62:
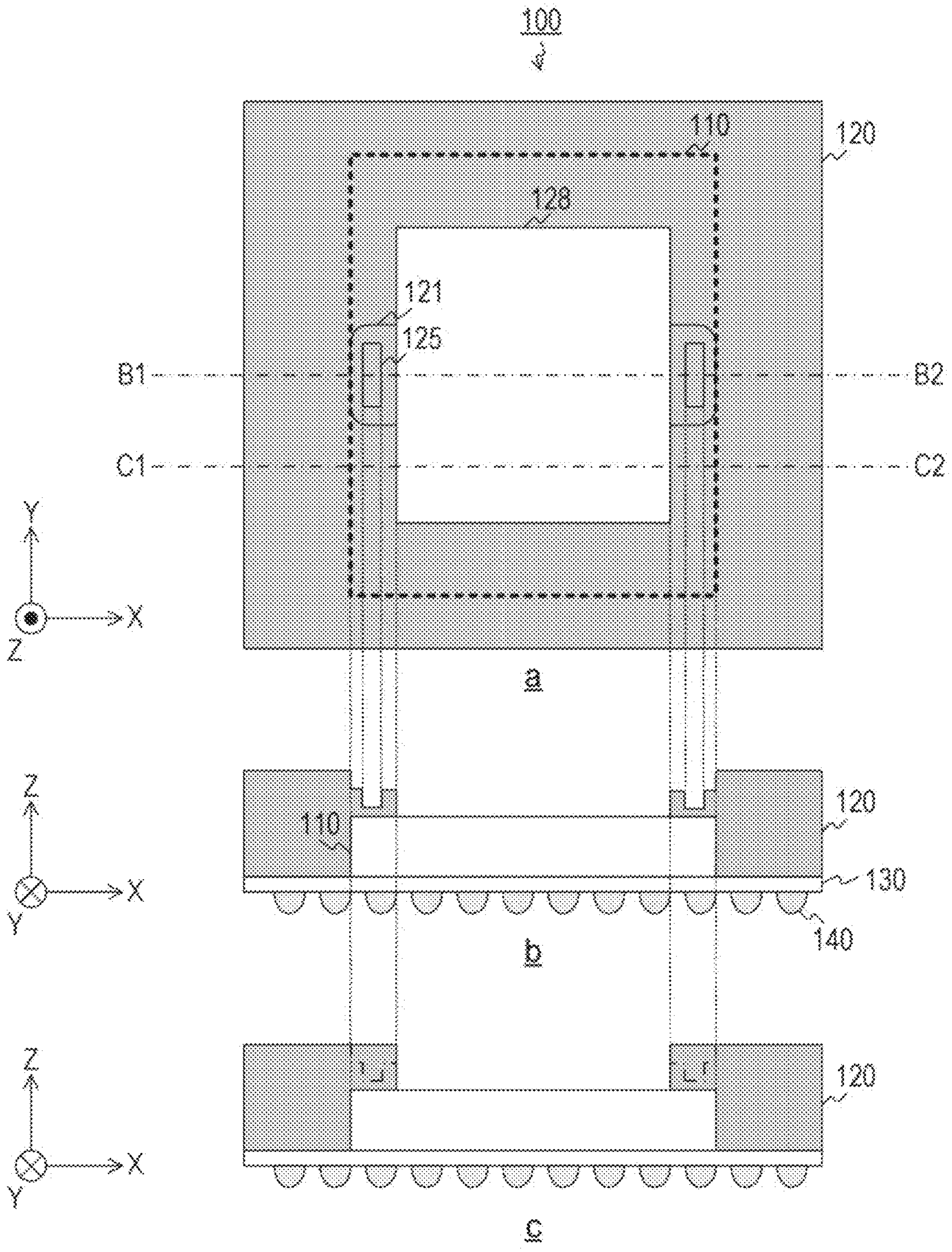
FIG. 62 is an example of a top view and a cross-sectional view of a semiconductor package according to a fifth embodiment of the present technology.

FIG. 62 is an example of a top view and a cross-sectional view of the semiconductor package 100 according to the fifth embodiment of the present technology. (a) in the drawing is an example of a top view of the semiconductor package 100. (b) in the drawing is an example of a cross-sectional view taken along line segment B1-B2 of (a) in the drawing, and (c) in the drawing is an example of a cross-sectional view taken along line segment C1-C2 of (a) in the drawing.

In the semiconductor package 100 of the fifth embodiment, only the semiconductor chip 110 is mounted, and two notches (such as a notch 121) are formed in the X-axis direction each adjacent to a part of the opening 128. In addition, a trench such as a trench 125 is formed in each of the notches. This trench is formed, for example, inside the outer periphery of the semiconductor chip 110 (the thick dotted line in (a) of the drawing).

Figure 63:
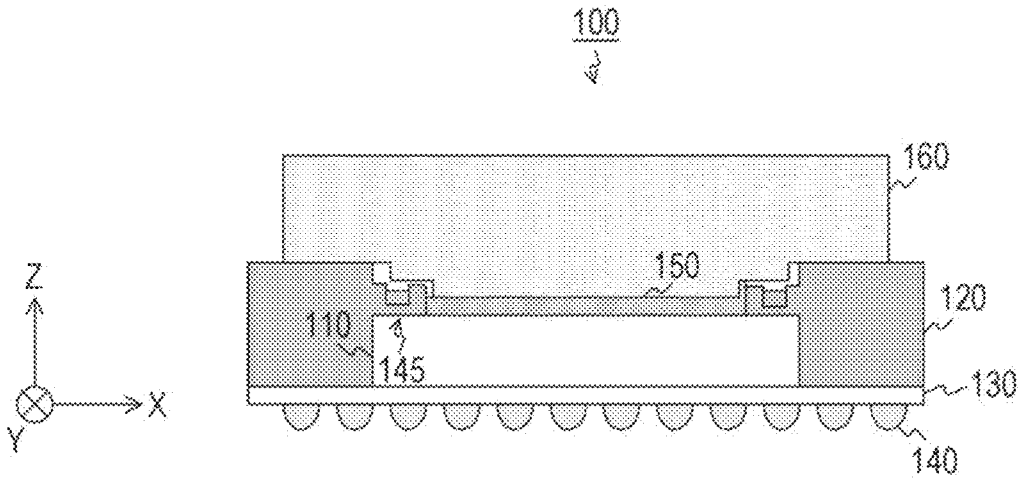
FIG. 63 is an example of a cross-sectional view of the semiconductor package on which a heat dissipation member is mounted according to the fifth embodiment of the present technology.

FIG. 63 is an example of a cross-sectional view of the semiconductor package 100 mounted with the heat dissipation member 160 according to the fifth embodiment of the present technology. By providing the trench in the notch, the space below the heat dissipation member 160 is widened, and even in a case where the amount of the heat conductive member 150 is large, it is possible to reliably prevent the outflow of the heat conductive member 150 to the outside.

Note that a protrusion may be formed in the heat dissipation member 160, and the protrusion may be inserted into the trench via the heat conductive member 150. This can increase the contact area between the sealing resin 120 and the heat dissipation member 160, thereby increasing the amount of heat dissipated.

Figure 64:
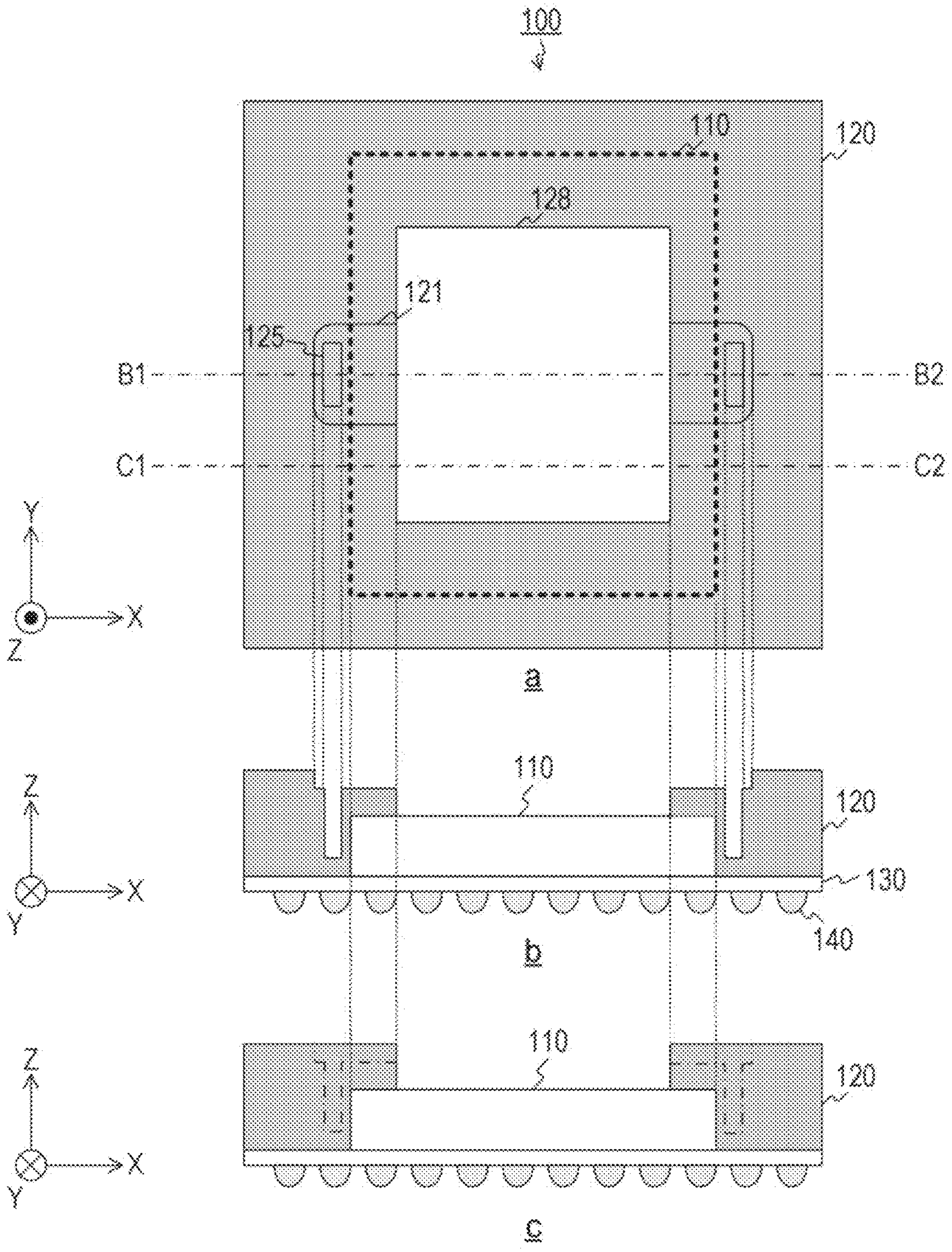
FIG. 64 is an example of a top view and a cross-sectional view of the semiconductor package in which a position of a trench is changed according to the fifth embodiment of the present technology.

Note that although the trench is formed inside the outer periphery of the semiconductor chip 110, the trench may be formed outside the outer periphery of the semiconductor chip 110 as illustrated in FIG. 64. In this case, as illustrated in (b) of the drawing, the bottom of the trench can be made lower than the back surface of the semiconductor chip 110. In other words, the trench can be made deeper.

Figure 65:
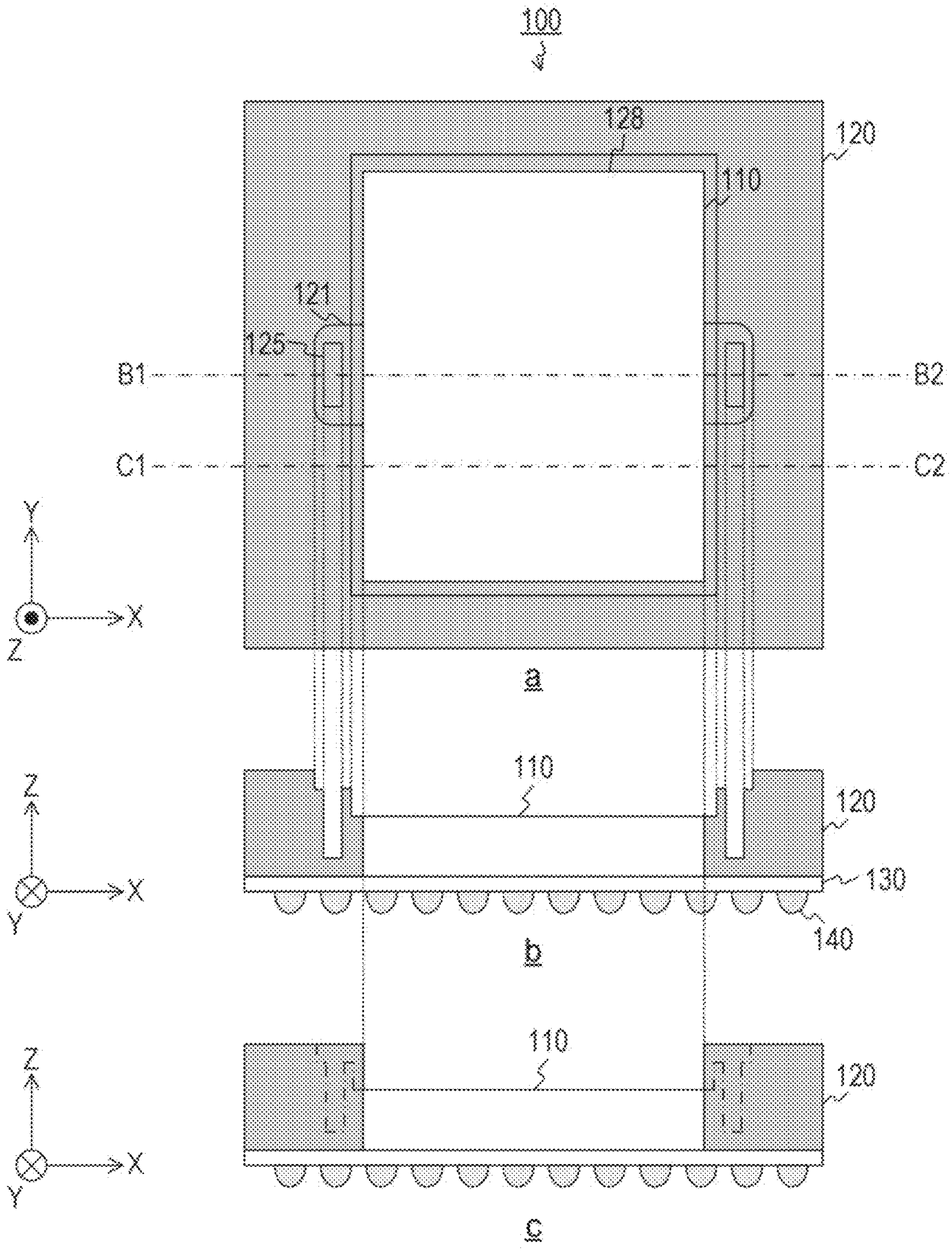
FIG. 65 is an example of a top view and a cross-sectional view of the semiconductor package in which the entire back surface of a semiconductor chip is exposed according to the fifth embodiment of the present technology.

Further, as illustrated in FIG. 65, the entire back surface of the semiconductor chip 110 can be exposed.

Figure 66:
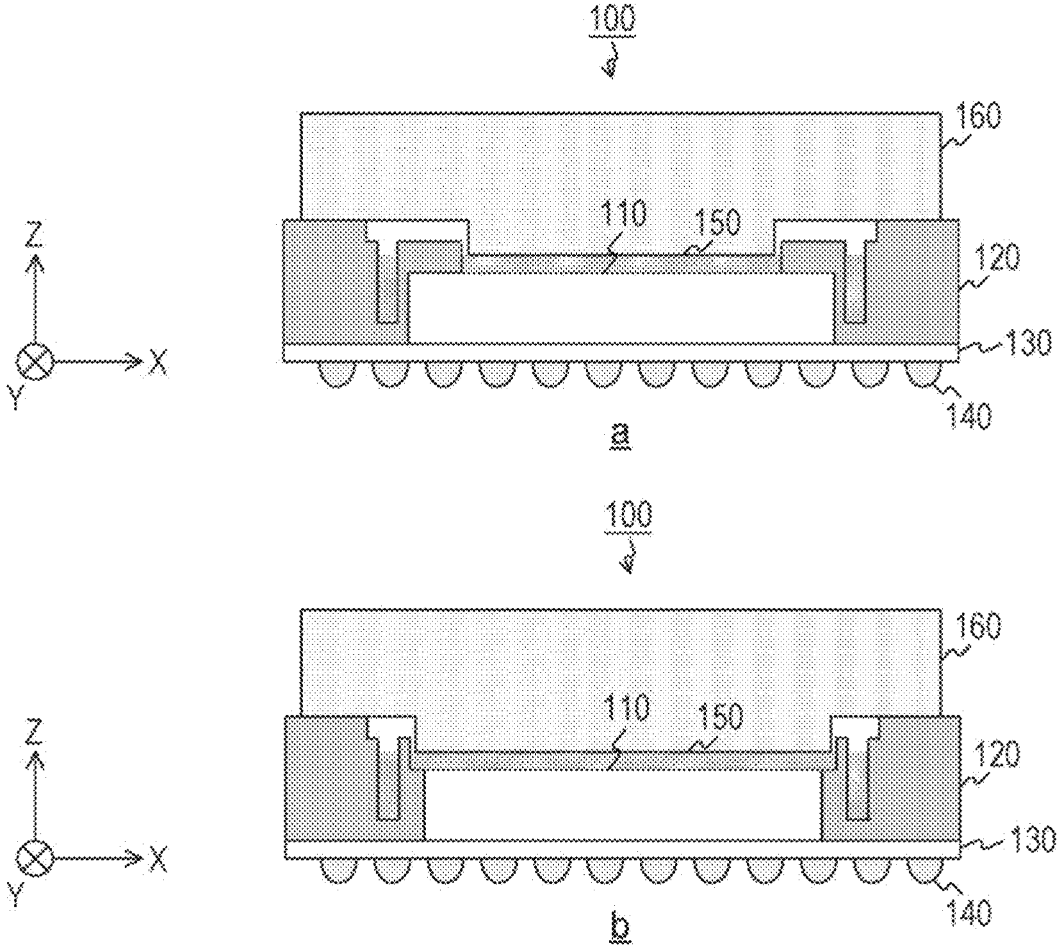
FIG. 66 is another example of a cross-sectional view of the semiconductor package on which a heat dissipation member is mounted according to the fifth embodiment of the present technology.

(a) in FIG. 66 is an example of a cross-sectional view when the heat dissipation member 160 is mounted on the semiconductor package 100 of FIG. 64. (b) in FIG. 66 is an example of a cross-sectional view when the heat dissipation member 160 is mounted on the semiconductor package 100 of FIG. 65. Note that in this drawing, a protrusion may be formed in the heat dissipation member 160, and the protrusion may be inserted into the trench via the heat conductive member 150.

As described above, according to the fifth embodiment of the present technology, due to the formation of the trench in the notch, the outflow of the heat conductive member 150 can be prevented reliably.

Modification

In the fifth embodiment of the present technology described above, the notch 121 has been formed adjacent to a part of the outer periphery of the opening 128, but the notch 121 can also be formed in a region surrounding the opening 128. A semiconductor package 100 according to a modification of the fifth embodiment differs from the fifth embodiment in that the notch 121 is formed in a region surrounding the opening 128.

Figure 67:
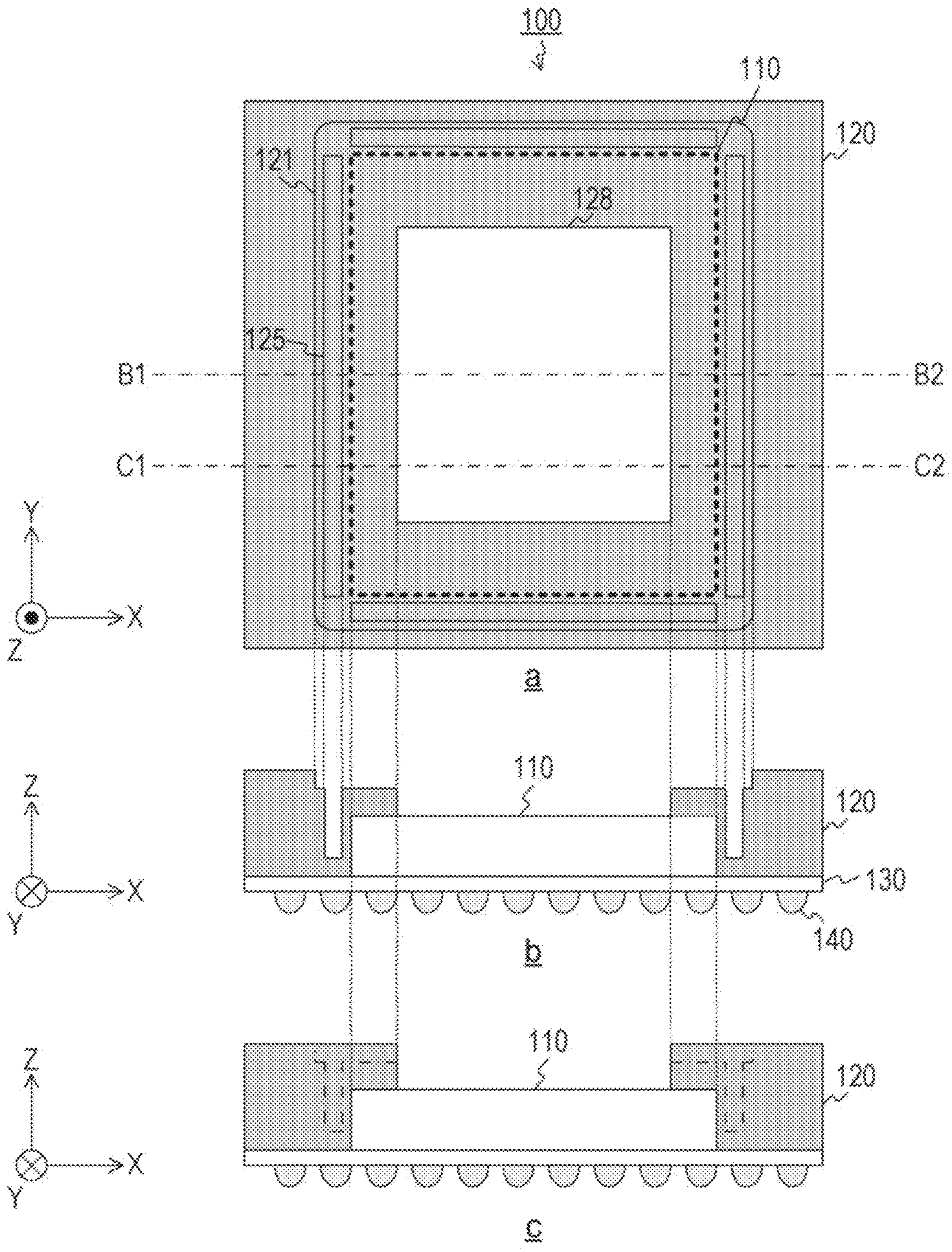
FIG. 67 is an example of a top view and a cross-sectional view of a semiconductor package according to a modification of the fifth embodiment of the present technology.

FIG. 67 is an example of a top view and a cross-sectional view of the semiconductor package 100 according to the modification of the fifth embodiment of the present technology. The semiconductor package 100 according to the modification of the fifth embodiment differs from the fifth embodiment in that the notch 121 is formed in a region surrounding the opening 128. As a result, the number and area of trenches can be increased. For example, four trenches (a trench 125, etc.) having substantially the same lengths as the sides of the semiconductor chip 110 can be arranged on the upper, lower, left, and right of the opening 128.

Figure 68:
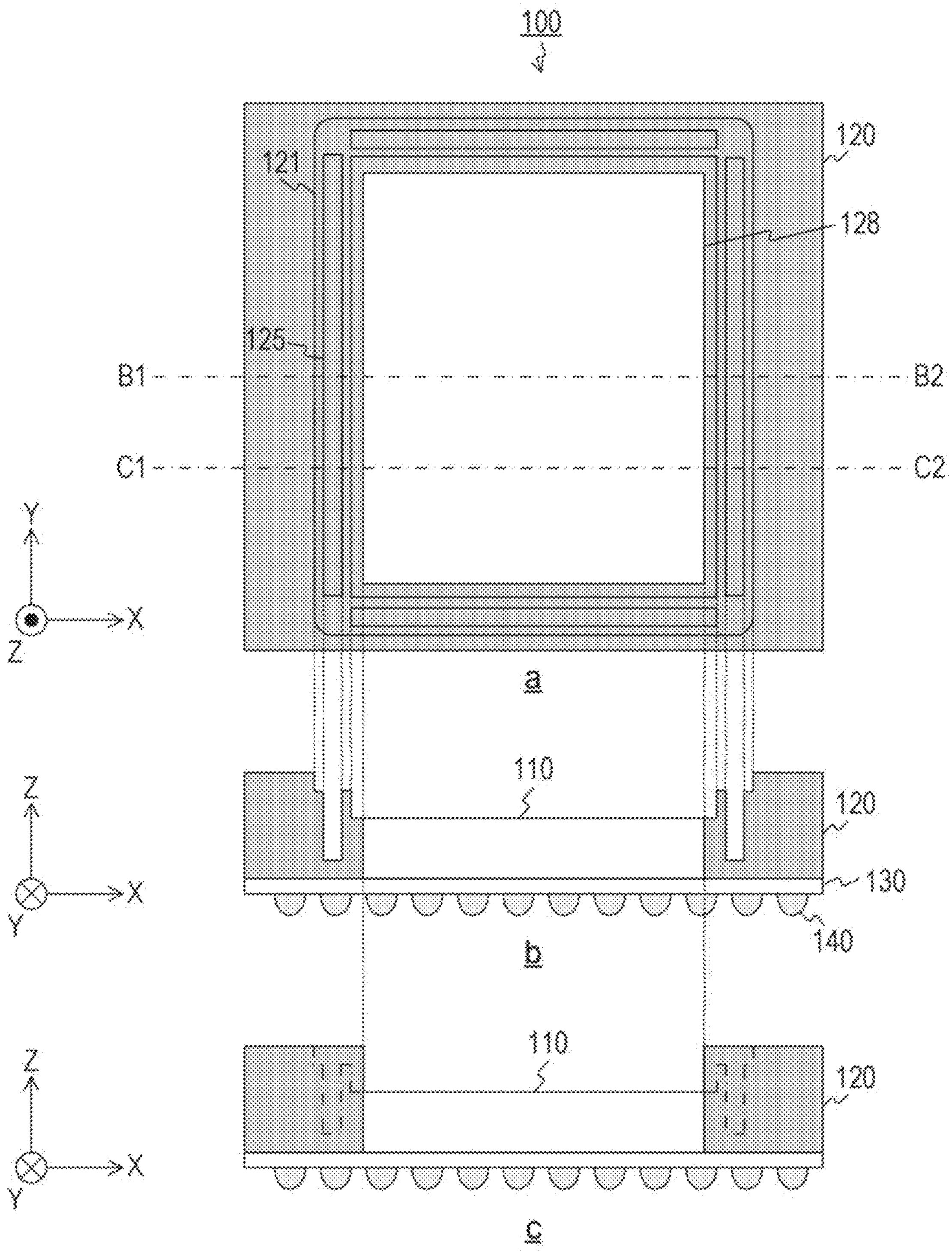
FIG. 68 is an example of a top view and a cross-sectional view of the semiconductor package in which the entire back surface of a semiconductor chip is exposed according to the modification of the fifth embodiment of the present technology.

Note that as illustrated in FIG. 68, the entire back surface of the semiconductor chip 110 can be exposed.

Figure 69:
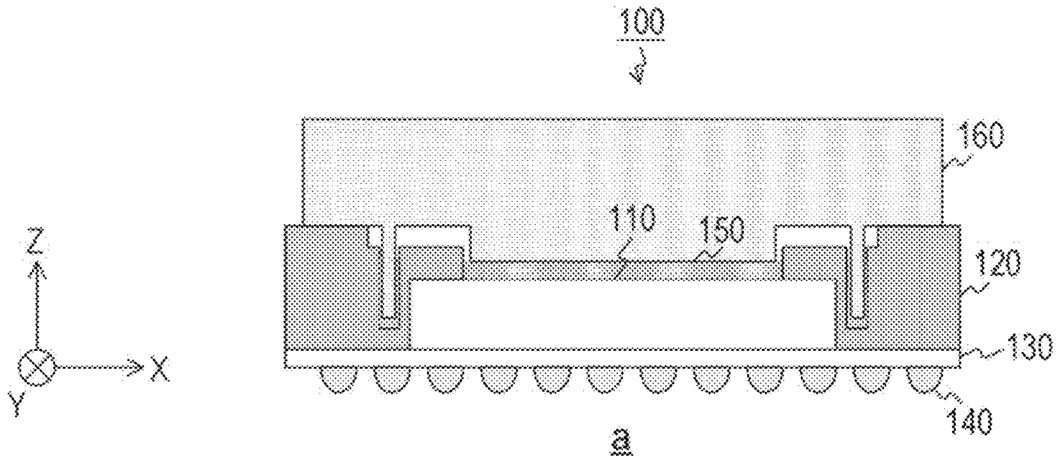
FIG. 69 is an example of a cross-sectional view of the semiconductor package on which a heat dissipation member is mounted according to the modification of the fifth embodiment of the present technology.
Figure 69:
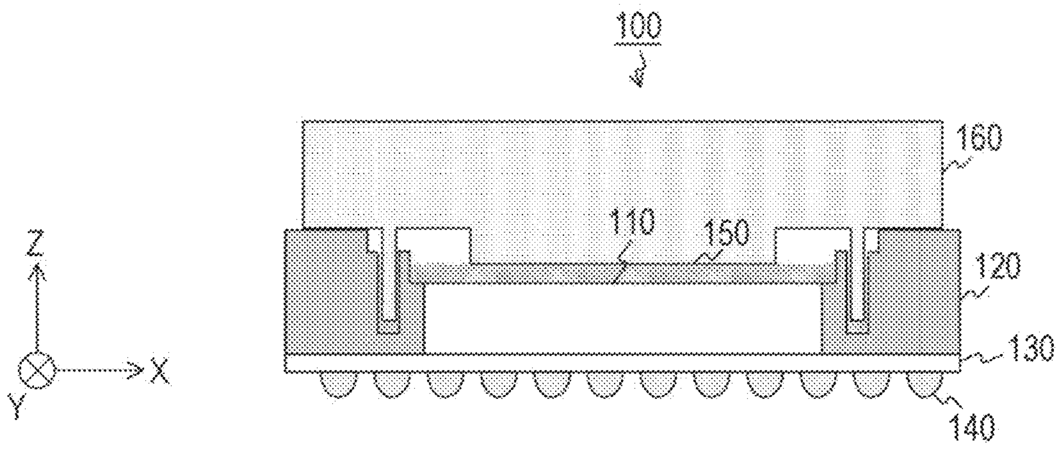

(a) in FIG. 69 is an example of a cross-sectional view when the heat dissipation member 160 is mounted on the semiconductor package 100 of FIG. 67. (b) in FIG. 69 is an example of a cross-sectional view when the heat dissipation member 160 is mounted on the semiconductor package 100 of FIG. 68. Note that (a) in the drawing, a protrusion is formed in the heat dissipation member 160, and the protrusion is inserted into the trench via the heat conductive member 150.

As described above, according to the modification of the fifth embodiment of the present technology, due to the formation of the notch 121 in the region surrounding the opening 128, the number and area of trenches can be increased.

6. Sixth Embodiment

In the first embodiment of the present technology described above, the semiconductor chips 110, 111 have been sealed with the sealing resin 120. However, when the semiconductor package 100 is mounted on the substrate, a difference in thermal expansion coefficient between the semiconductor chip 110 or the like and the substrate may cause stress at a joint therebetween. There is a possibility that this stress lowers the connection reliability. A semiconductor package 100 of a sixth embodiment differs from the first embodiment in that two layers of sealing resins with different elastic moduli are formed.

Figure 70:
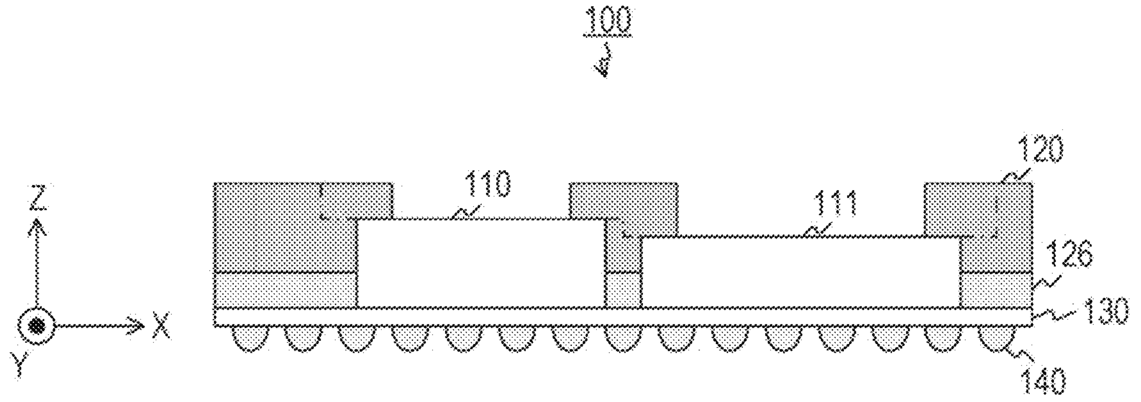
FIG. 70 is an example of a cross-sectional view of a semiconductor package according to a sixth embodiment of the present technology.
Figure 70:
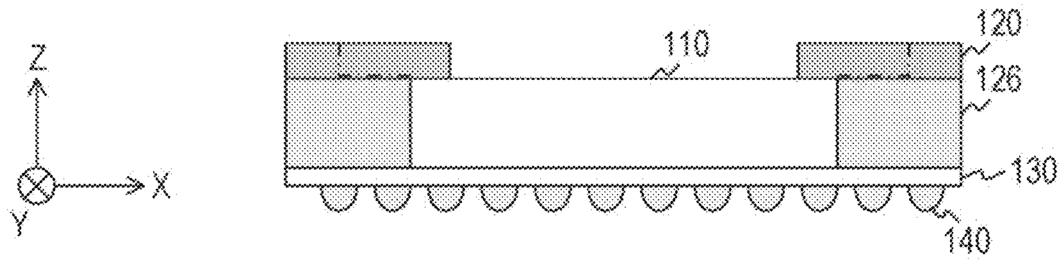
Figure 70:
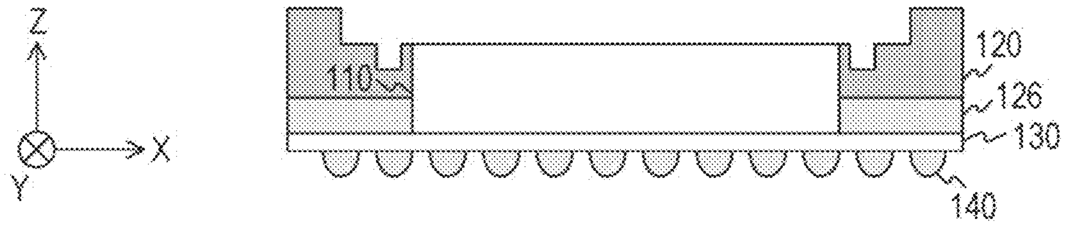

FIG. 70 is an example of a cross-sectional view of the semiconductor package 100 according to the sixth embodiment of the present technology. (a) in the drawing is an example of a cross-sectional view of the semiconductor package 100 provided with the semiconductor chips 110, 111.

The semiconductor package 100 of the sixth embodiment differs from the first embodiment in that a sealing resin 126 is further formed.

The sealing resin 126 is formed on the upper surface of the wiring layer 130. A sealing resin 120 is stacked on the upper portion of the sealing resin 126. In the upper sealing resin 120, a notch is formed as in the first embodiment.

The elastic modulus of the lower sealing resin 126 is assumed to be lower than that of the upper sealing resin 120. Note that the sealing resin 120 is an example of a first sealing resin described in the claims, and the sealing resin 126 is an example of a second sealing resin described in the claims.

By making the elastic modulus of the lower sealing resin 126 lower than that of the upper sealing resin 120, it is possible to reduce stress applied to the external terminal 140 and the substrate (not illustrated). This can improve the reliability of the connection to the substrate.

As the sealing resins 120, 126, for example, a thermosetting resin such as an epoxy resin is used. In the epoxy resin, the elastic modulus is only required to be changed by changing, for example, the chemical structure or molecular weight of the base epoxy resin, or the particle size or content of filler (carbon, silica, etc.) contained in the resin.

Note that as illustrated in (b) of the drawing, the two-layer structure of the sealing resins 120, 126 can also be applied to the semiconductor package 100 provided with only the semiconductor chip 110.

Further, as illustrated in (c) of the drawing, the two-layer structure of the sealing resins 120, 126 can also be applied to the semiconductor package 100 in which the entire back surface of the semiconductor chip 110 is exposed.

Figure 71:
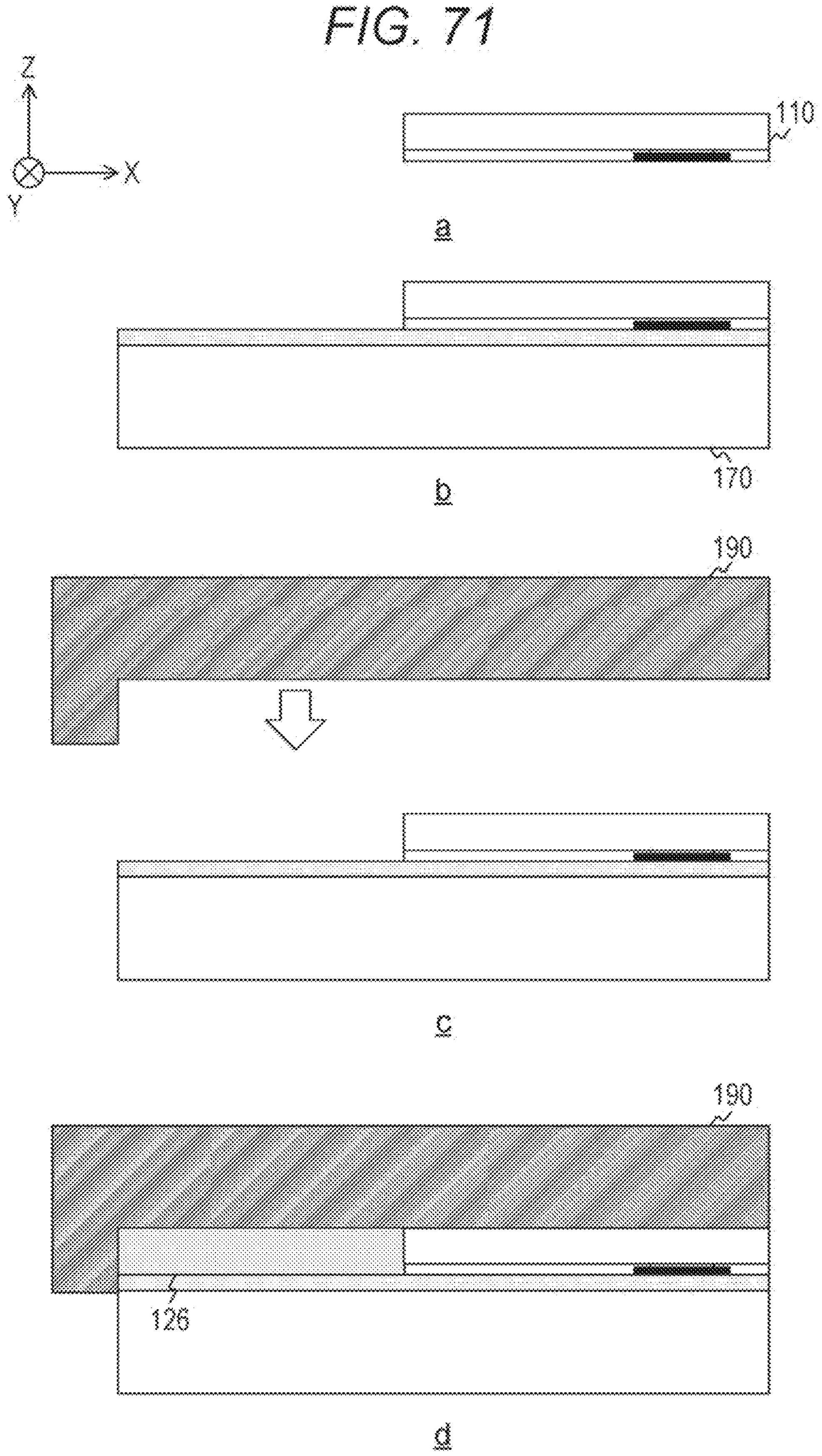
FIG. 71 is a view illustrating an example of a method for manufacturing the semiconductor package up to the first formation of a sealing resin according to the sixth embodiment of the present technology.

FIG. 71 is a view illustrating an example of a method for manufacturing the semiconductor package up to the formation of the first sealing resin 126 according to the sixth embodiment of the present technology. As illustrated in (a)

of the drawing, first, the manufacturing system manufactures a semiconductor chip (semiconductor chip 110, etc.) to be mounted.

Next, the manufacturing system attaches the semiconductor chip to the support 170 as illustrated in (b) of the drawing, and sets a sealing jig 190 as illustrated in (c) of the drawing. Details of the shape of the sealing jig 190 will be described later. Then, as illustrated in (d) of the drawing, the manufacturing system fills a space in the sealing jig 190 with the sealing resin 126.

Figure 72:
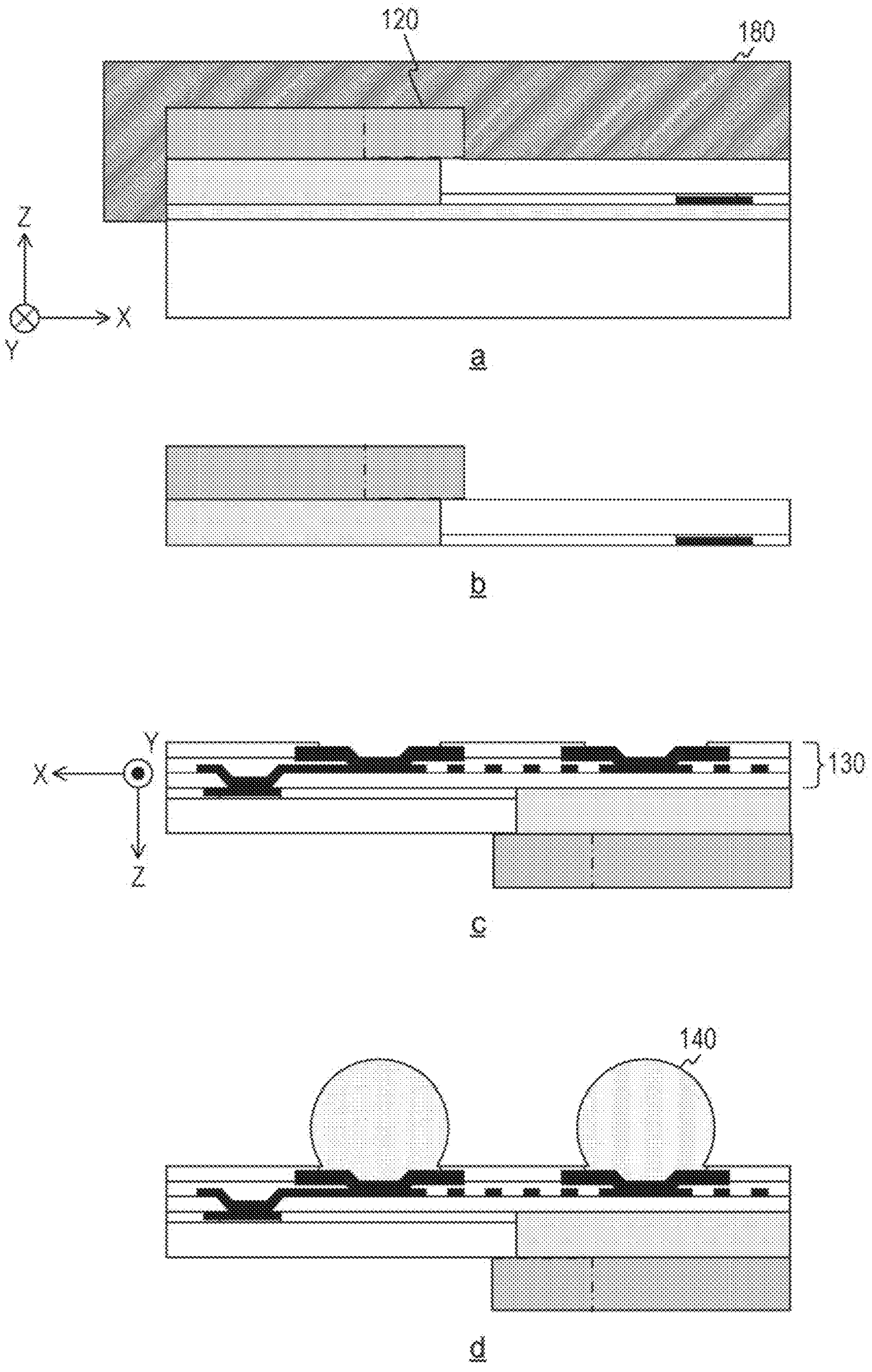
FIG. 72 is a view illustrating an example of a method for manufacturing the semiconductor package up to formation of an external terminal according to the sixth embodiment of the present technology.

FIG. 72 is a view illustrating an example of a method for manufacturing the semiconductor package 100 up to the formation of the external terminal 140 according to the sixth embodiment of the present technology. As illustrated in (a) of the drawing, the manufacturing system replaces the sealing jig 190 with the sealing jig 180 and performs filling of the sealing resin 120.

The manufacturing system removes the support 170 as illustrated in (b) of the drawing, and forms the wiring layer 130 as illustrated in (c) of the drawing. Then, as illustrated in (d) of the drawing, the manufacturing system forms the external terminal 140 on the wiring layer 130, and performs a subsequent step such as the mounting of the heat dissipation member 160.

Figure 73:
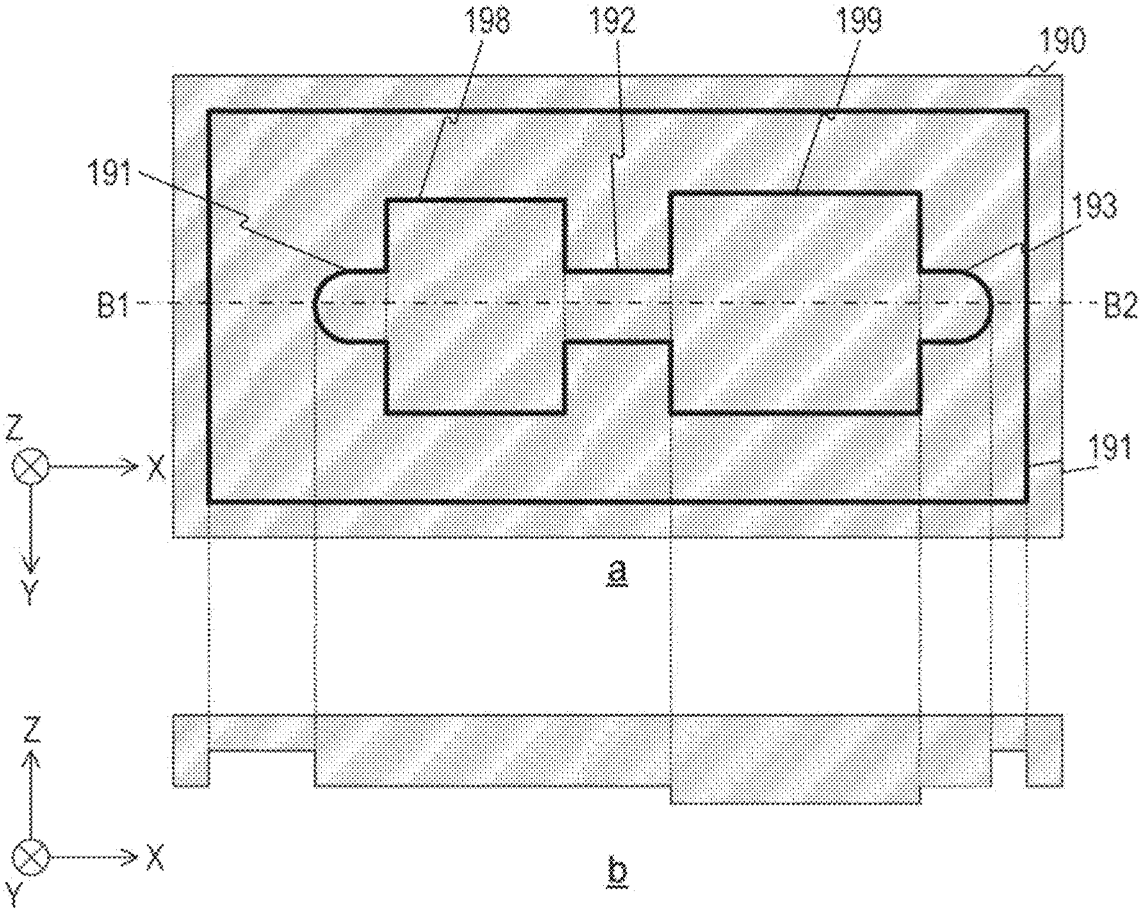
FIG. 73 is a view illustrating an example of a bottom view and a cross-sectional view of a sealing jig according to the sixth embodiment of the present technology.

FIG. 73 is a view illustrating an example of a bottom view and a cross-sectional view of the sealing jig 190 according to the sixth embodiment of the present technology. (a) in the drawing is an example of a bottom view of the sealing jig 190, and (b) in the drawing is an example of a cross-sectional view of the sealing jig 190.

Protrusions 198, 199 are formed in the sealing jig 190, and openings 128, 129 are formed by these protrusions. Further, protrusions 191, 192, 193 are formed in the X-axis direction adjacent to the outer peripheries of protrusions 198, 198. The protrusion 191 is formed on the left side of the protrusion 198, and the protrusion 193 is formed on the right side of the protrusion 199. The protrusion 192 is formed between the protrusions 198, 199. The sealing resin 126 is filled between the protrusions 191, 192, 193 and the support 170.

As described above, according to the sixth embodiment of the present technology, since the elastic modulus of the lower sealing resin 126 is lower than that of the upper sealing resin 120, the stress applied to the external terminal 140 and the substrate can be reduced to improve the connection reliability.

Modification

In the sixth embodiment of the present technology described above, the two-layer sealing resin has been formed by the sealing jigs 190, 180, but this configuration requires two sealing jigs. A semiconductor package 100 according to a modification of the sixth embodiment differs from the sixth embodiment in that a manufacturing method is simplified using a polyester-modified epoxy resin as a lower sealing resin.

Figure 74:
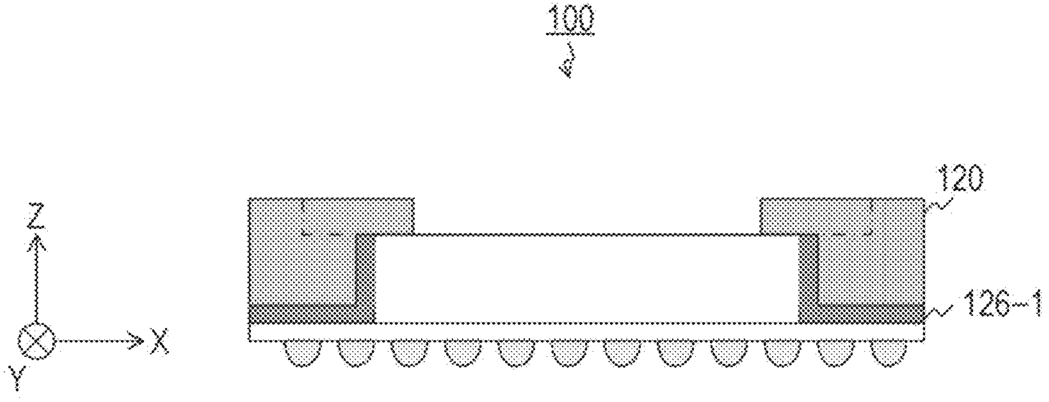
FIG. 74 is an example of a cross-sectional view of a semiconductor package according to a modification of the sixth embodiment of the present technology.

FIG. 74 is an example of a cross-sectional view of the semiconductor package 100 according to the modification of the sixth embodiment of the present technology.

The semiconductor package 100 according to the modification of the sixth embodiment differs from the sixth embodiment in that the polyester-modified epoxy resin 126-1 is used as a lower sealing resin. The elastic modulus of the polyester-modified epoxy resin 126-1 is assumed to be lower than that of the upper sealing resin 120 as in the sixth embodiment.

Figure 75:
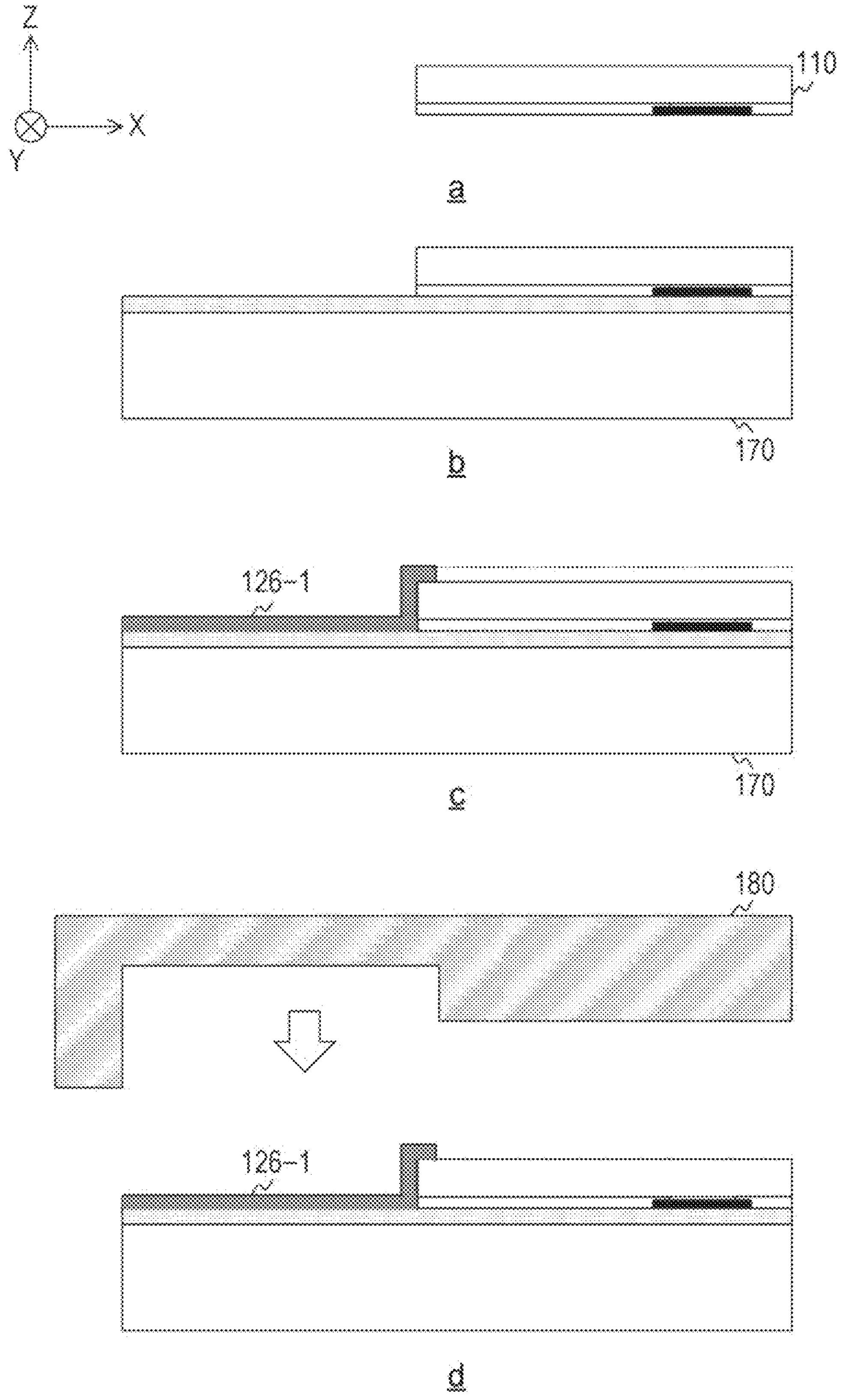
FIG. 75 is a view illustrating an example of a method for manufacturing the semiconductor package up to setting of a sealing jig according to the modification of the sixth embodiment of the present technology.

FIG. 75 is a view illustrating an example of a method for manufacturing the semiconductor package 100 up to the setting of the sealing jig 180 in the modification of the sixth embodiment of the present technology. The manufacturing system manufactures a semiconductor chip (such as the semiconductor chip 110) to be mounted as illustrated in (a) of the drawing, and attaches the semiconductor chip to the support 170 as illustrated in (b) of the drawing.

Then, as illustrated in (c) of the drawing, a polyester-modified epoxy resin 126-1 is applied and cured. The thickness of the polyester-modified epoxy resin 126-1 is, for example, 50 to 100 micrometers (μm). In the application, a spin coating method, potting, spraying, or the like is used. The polyester-modified epoxy resin 126-1 applied to the back surface of the semiconductor chip is removed by etching. The dotted line in the drawing indicates the front surface of the polyester-modified epoxy resin 126-1 before removal. Note that the polyester-modified epoxy resin 126-1 applied to the back surface of the semiconductor chip may not be removed.

Next, the manufacturing system sets the sealing jig 180 as illustrated in (d) of the drawing.

Figure 76:
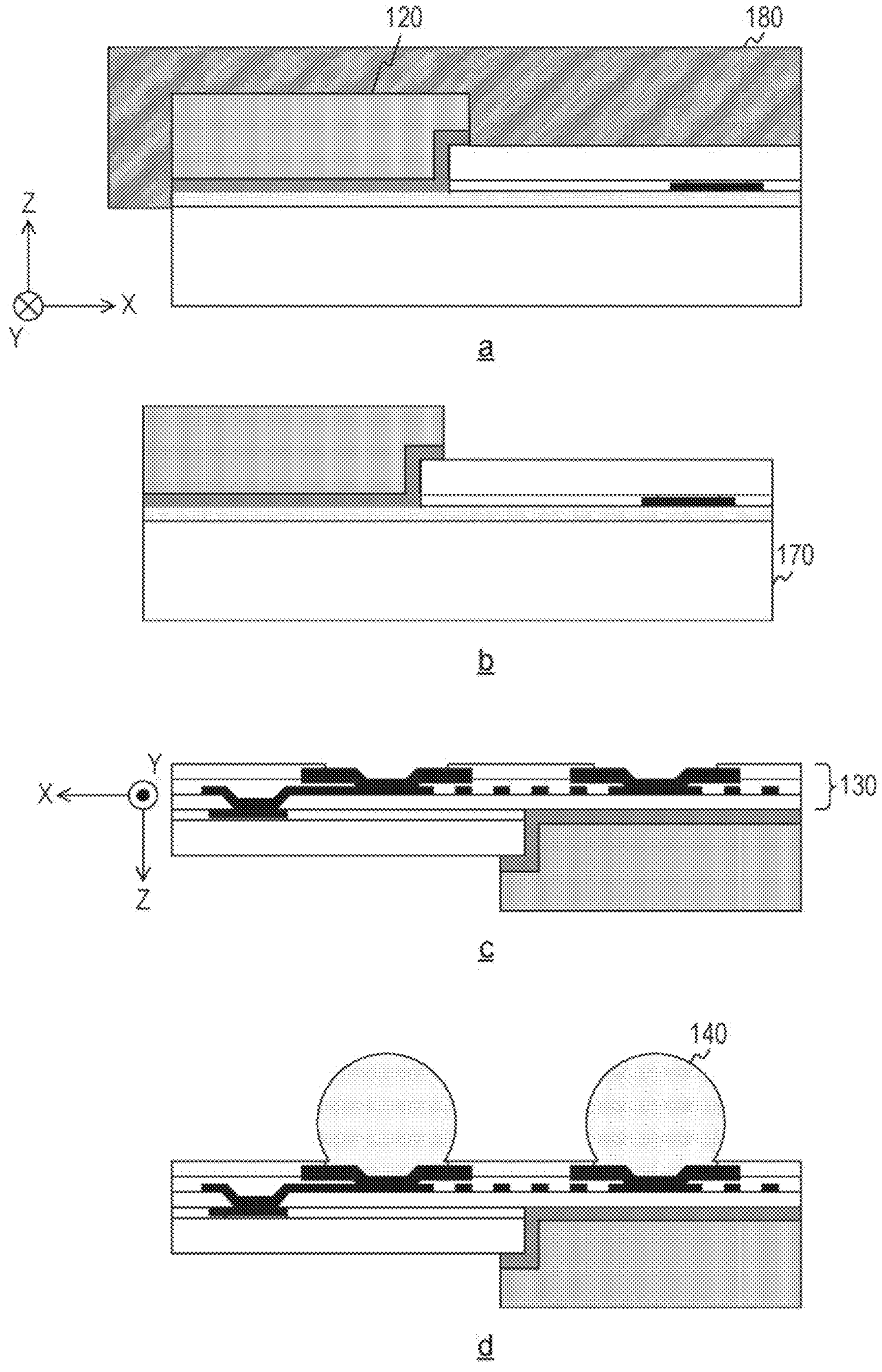
FIG. 76 is a view illustrating an example of a method for manufacturing the semiconductor package up to formation of an external terminal according to the modification of the sixth embodiment of the present technology.

FIG. 76 is a view illustrating an example of a method for manufacturing the semiconductor package 100 up to the formation of the external terminal 140 according to the first embodiment of the present technology. The manufacturing system fills a space in the sealing jig 180 with the sealing resin 120 as illustrated in (a) of the drawing, and removes the sealing jig 180 as illustrated in (b) of the drawing.

Then, as illustrated in (c) of the drawing, the manufacturing system removes the support 170 to form the wiring layer 130. Then, as illustrated in (d) of the drawing, the manufacturing system forms the external terminal 140 on the wiring layer 130, and performs a subsequent step such as the mounting of the heat dissipation member 160.

As illustrated in FIGS. 75 and 76, with the polyester-modified epoxy resin 126-1 being applied at the time of manufacturing, only one sealing jig is required, and the manufacturing method can be simplified more than in the sixth embodiment in which two sealing jigs are required.

As described above, according to the modification of the sixth embodiment of the present technology, since the method of applying the polyester-modified epoxy resin 126-1 at the time of manufacturing is used, the manufacturing method can be simplified

7. Seventh Embodiment

In the first embodiment of the present technology described above, the notch 121 or the like has been provided in the sealing resin 120 to prevent the outflow of the heat conductive member 150, but a trench or the like can be further provided in a heat dissipation member 160. A semiconductor package 100 according to a seventh embodiment differs from the first embodiment in that a trench or the like is formed in the heat dissipation member 160.

Figure 77:
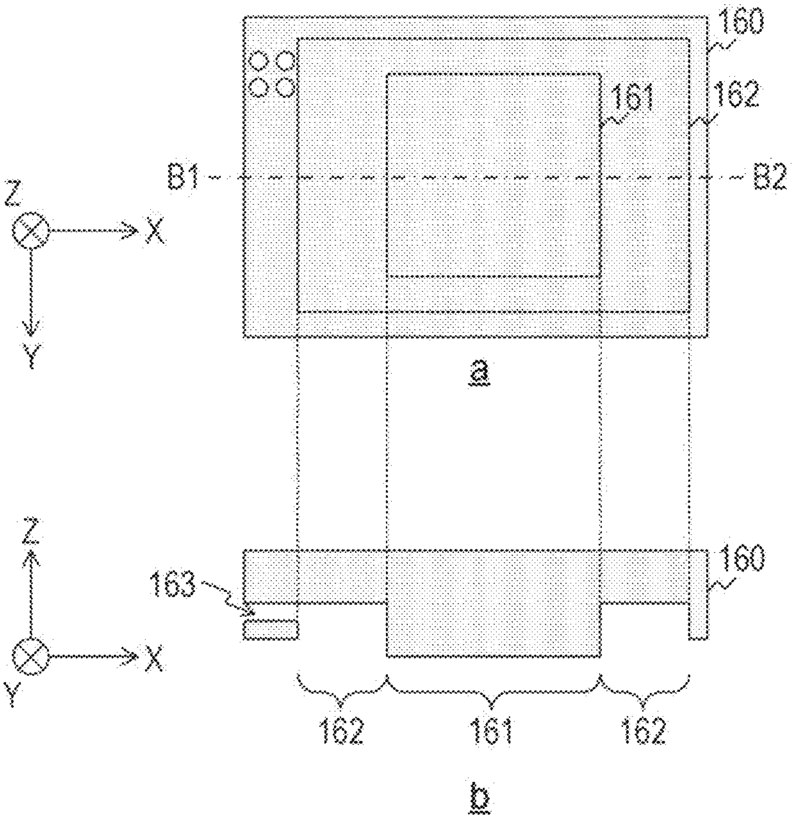
FIG. 77 is an example of a bottom view and a cross-sectional view of a heat dissipation member according to a seventh embodiment of the present technology.

FIG. 77 is an example of a bottom view and a cross-sectional view of the heat dissipation member 160 according to the seventh embodiment of the present technology. (a) in the drawing is an example of a bottom view of the heat dissipation member 160, and (b) in the drawing is an example of a cross-sectional view of the heat dissipation member 160.

In the heat dissipation member 160 in the seventh embodiment, a rectangular protrusion 161 is formed. In addition, a trench 162 is formed around the protrusion 161. A venting port 163 is formed in a part of the outer periphery of the trench 162.

The material of the heat dissipation member 160 is metal, ceramic-based, or diamond-based. Molybdenum (MO) and copper-tungsten (Cu—W) are used as the metal. Alternatively, Cu, Cu—Mo, or Cu composites (so-called CPC composites) are used. In addition, as the ceramic-based, aluminum nitride (ALN) or aluminum-silicon carbide (Al—SiC) is used.

Figure 78:
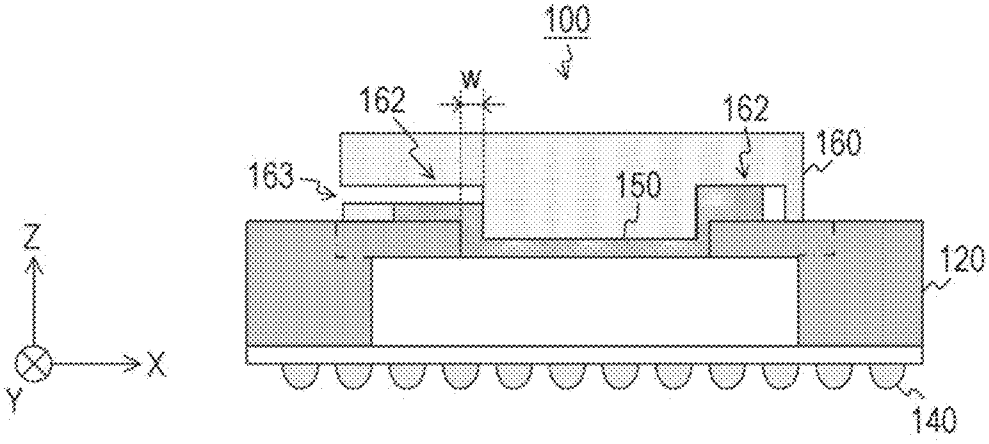
FIG. 78 is an example of a cross-sectional view of a semiconductor package on which a heat dissipation member is mounted according to the seventh embodiment of the present technology.

FIG. 78 is an example of a cross-sectional view of the semiconductor package 100 mounted with the heat dissipation member 160 according to the seventh embodiment of the present technology. In the sealing resin 120 of the seventh embodiment, a notch 121 (not illustrated) and the like are formed as in the first embodiment.

In addition, the area of the protrusion 161 of the heat dissipation member 160 when viewed from the Z-axis direction is slightly smaller that of than the exposed back surface. Thus, a narrow gap with a width w is generated between the side surface of the protrusion 161 and the sealing resin 120. When the heat dissipation member 160 is mounted, the heat conductive member 150 crawls up along the side surface of the protrusion 161 through the gap, and flows into the trench 162 of the heat dissipation member 160. As a result, the heat conductive member 150 is held in the trench 162 by an amount that cannot be solely prevented by the notch, thereby enabling prevention of the outflow of the heat conductive member 150 without an influence from the peripheral structure of the semiconductor chip 110. Note that the trench 162 is an example of a holding part described in the claims.

In addition, when the venting port 163 is provided, the space generated by the trench 162 is depressurized, so that the crawling up of the heat conductive member 150 can be promoted. Note that in a case where the pressure reduction is unnecessary, the venting port 163 may not be provided.

In addition, forming the trench 162 enables an increase in the contact area between the heat dissipation member 160 and the heat conductive member 150, thereby improving the adhesive strength of the heat dissipation member 160.

As described above, according to the seventh embodiment of the present technology, due to the formation of the trenches 162 in the heat dissipation member 160, the outflow of the heat conductive member 150 can be prevented without an influence from the peripheral structure of the semiconductor chip 110.

First Modification

In the seventh embodiment of the present technology described above, the trench 162 has been formed in order to hold the heat conductive member 150, but the shapes, positions, and number of mechanisms for holding the heat conductive member 150 can be changed appropriately. A semiconductor package 100 according to a first modification of the seventh embodiment differs from the seventh embodiment in that a cavity is formed in a heat dissipation member 160.

Figure 79:
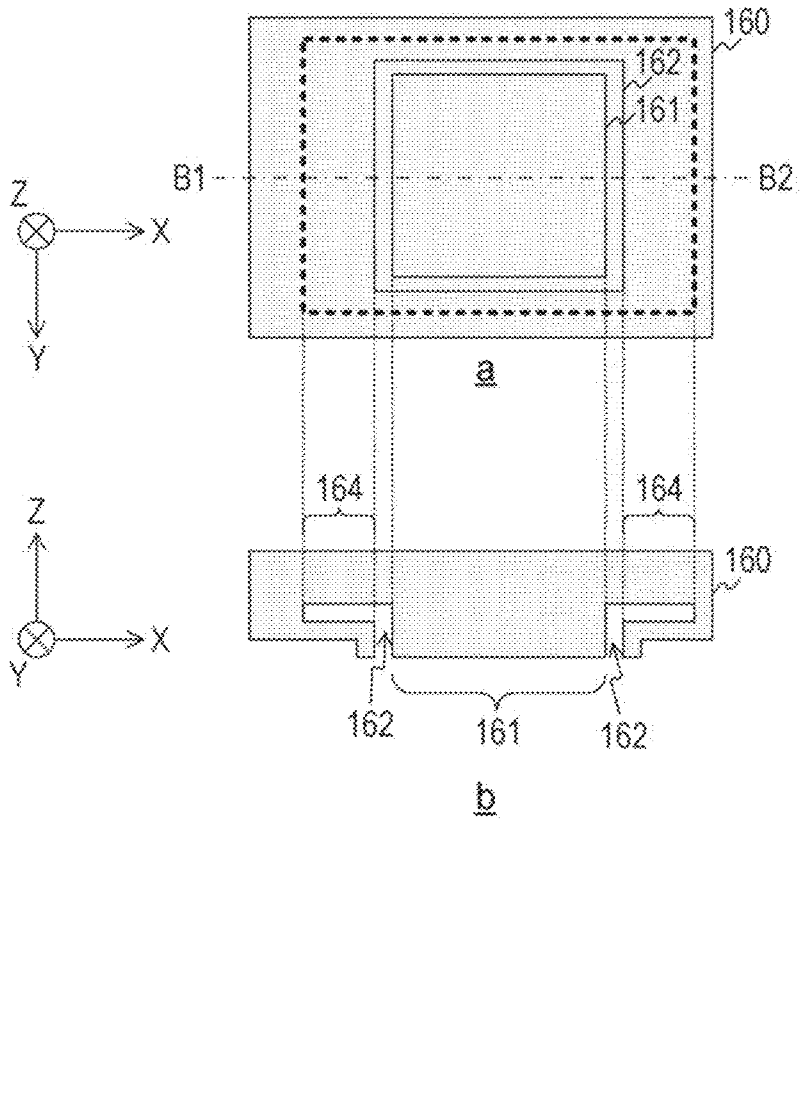
FIG. 79 is an example of a bottom view and a cross-sectional view of a heat dissipation member according to a first modification of the seventh embodiment of the present technology.

FIG. 79 is an example of a bottom view and a cross-sectional view of the heat dissipation member 160 according to the first modification of the seventh embodiment of the present technology. (a) in the drawing is an example of a bottom view of the heat dissipation member 160. (b) in the drawing is an example of a cross-sectional view taken along line segment B1-B2 of (a) in the drawing.

In the first modification of the seventh embodiment, the width of the trench 162 around the protrusion 161 is narrower than that in the seventh embodiment. In addition, a cavity 164 is formed around the trench 162, and a part of the side surface of the trench 162 and the cavity 164 are continuous inside the heat dissipation member 160. The thick dotted line in (a) of the drawing indicates the outer periphery of the cavity 164.

Figure 80:
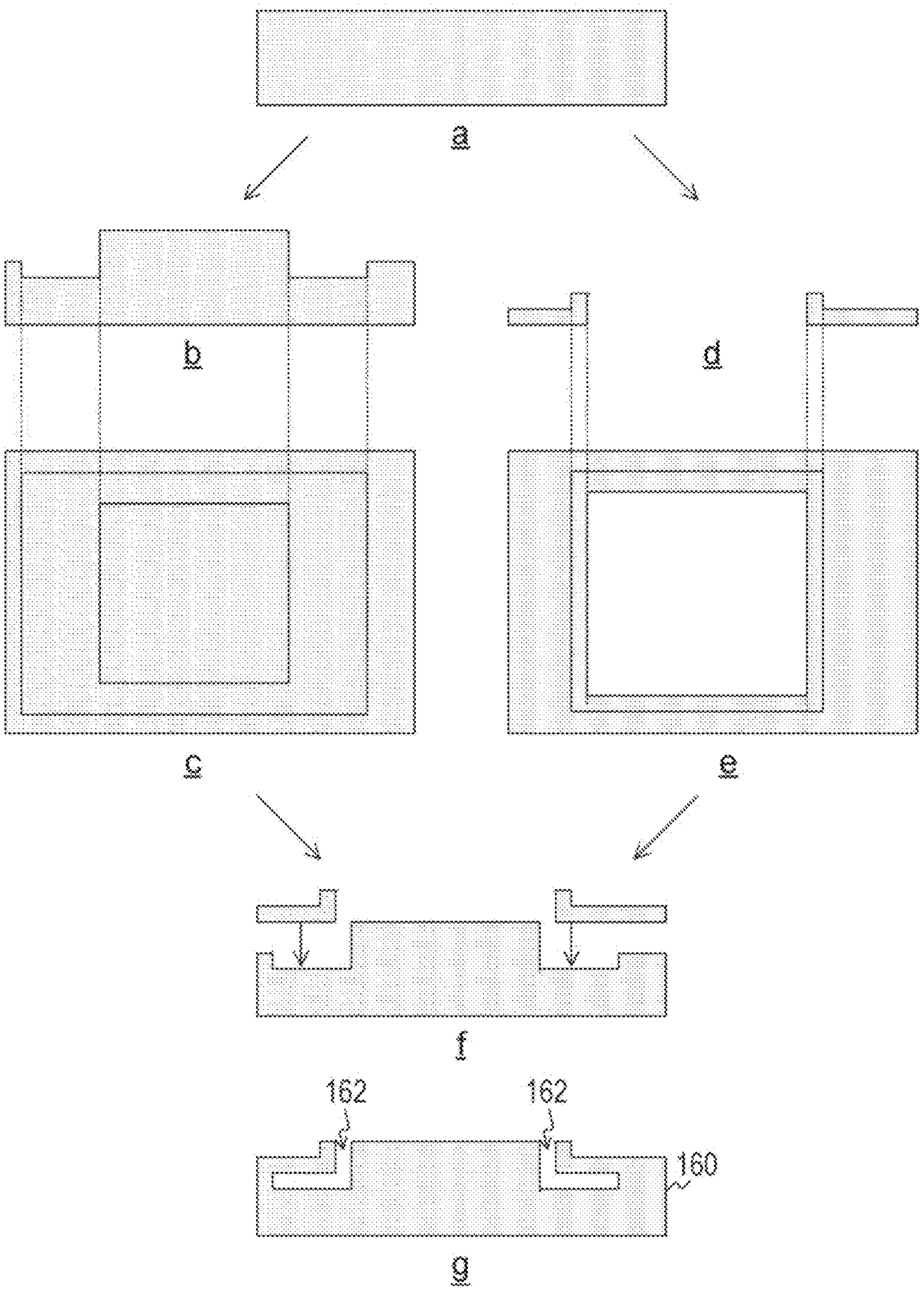
FIG. 80 is a view illustrating an example of a method for manufacturing the heat dissipation member according to the first modification of the seventh embodiment of the present technology.

FIG. 80 is a view illustrating an example of a method for manufacturing the heat dissipation member 160 according to the first modification of the seventh embodiment of the present technology. (a) in the drawing is a cross-sectional view of a rectangular parallelepiped member for manufacturing the heat dissipation member 160.

The manufacturing system cuts out a base part and a frame part from a rectangular parallelepiped member. (b) in the drawing illustrates a cross-sectional view of the base part, and (c) in the drawing illustrates a top view of the base part. The base part has a shape obtained by hollowing a region in which the cavity 164 is formed.

Further, (d) in the drawing is an example of a cross-sectional view of the frame part, and (e) in the drawing is an example of a top view of the frame part.

The manufacturing system bonds the frame part to the base part as illustrated in (f) of the drawing. At this time, as illustrated in (g) of the drawing, the trench 162 is formed between the base part and the frame part, and the heat dissipation member 160 is manufactured.

Figure 81:
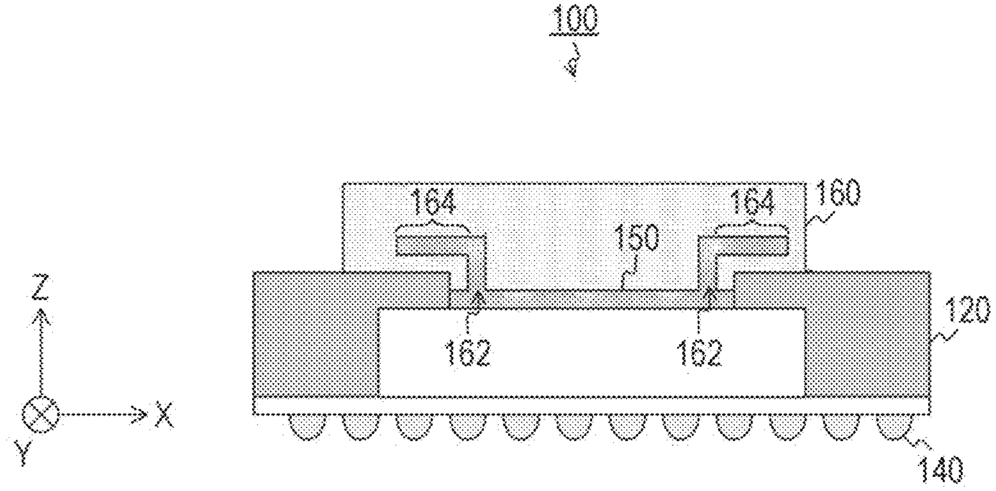
FIG. 81 is an example of a cross-sectional view of a semiconductor package on which the heat dissipation member is mounted according to the first modification of the seventh embodiment of the present technology.

FIG. 81 is an example of a cross-sectional view of a semiconductor package 100 on which the heat dissipation member 160 is mounted according to the first modification of the seventh embodiment of the present technology. As illustrated in the drawing, the heat conductive member 150 crawls up the trench 162 and is held in the cavity 164. Note that the cavity 164 is an example of a holding part described in the claims.

As described above, according to the first modification of the seventh embodiment of the present technology, due to the formation of the thin trench 162 and the cavity 164 in the heat dissipation member 160, the heat conductive member 150 can be held in the cavity 164.

Second Modification

In the seventh embodiment of the present technology described above, the trench 162 has been formed in order to hold the heat conductive member 150, but the shapes, positions, and number of mechanisms for holding the heat conductive member 150 can be changed appropriately. A semiconductor package 100 according to a second modification of the seventh embodiment differs from the seventh embodiment in that a cavity and a through hole are formed in a heat dissipation member 160.

Figure 82:
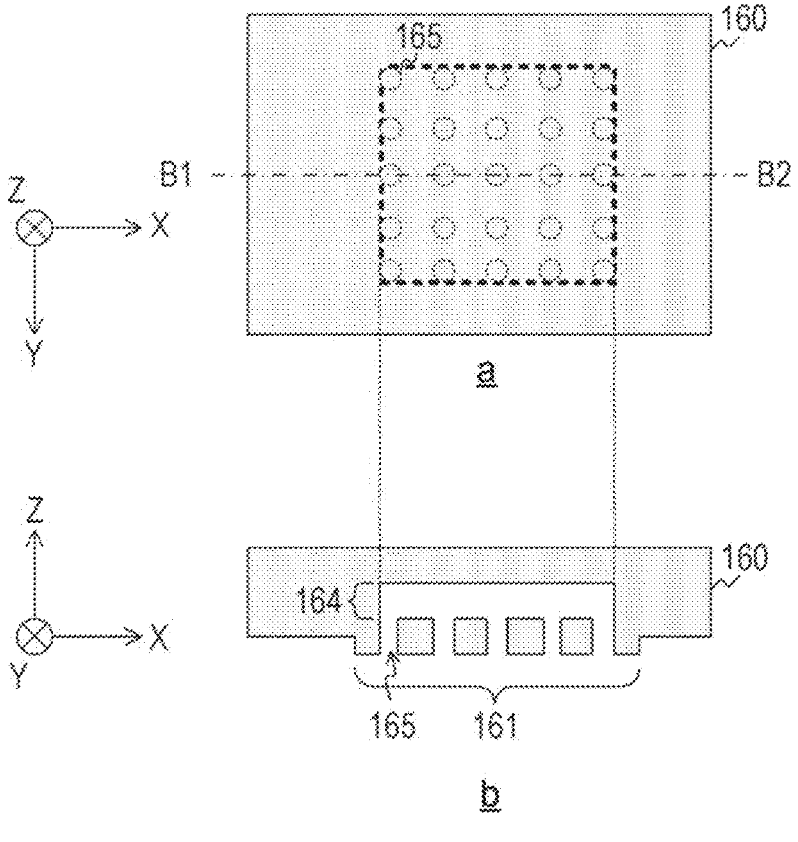
FIG. 82 is an example of a bottom view and a cross-sectional view of a heat dissipation member according to a second modification of the seventh embodiment of the present technology.

FIG. 82 is an example of a bottom view and a cross-sectional view of the heat dissipation member 160 according to the second modification of the seventh embodiment of the present technology. (a) in the drawing is an example of a bottom view of the heat dissipation member 160. (b) in the drawing is an example of a cross-sectional view taken along line segment B1-B2 of (a) in the drawing.

In the heat dissipation member 160 according to the second modification of the seventh embodiment, instead of the trench 162, a cavity 164 and a plurality of through holes (such as through holes 165) penetrating from the surface of the protrusion 161 to the cavity 164 is formed. The heat conductive member 150 crawls up through these through holes and is held in the cavity 164.

As described above, according to the second modification of the seventh embodiment of the present technology, due to the formation of the plurality of through-holes and the cavity 164 in the heat dissipation member 160, the heat conductive member 150 can be held in the cavity 164.

Third Modification

In the seventh embodiment of the present technology described above, the trench 162 has been formed in order to hold the heat conductive member 150, but the shapes, positions, and number of mechanisms for holding the heat conductive member 150 can be changed appropriately. A semiconductor package 100 according to a third modification of the seventh embodiment differs from the seventh embodiment in that a vertical hole is formed in a heat dissipation member 160.

Figure 83:
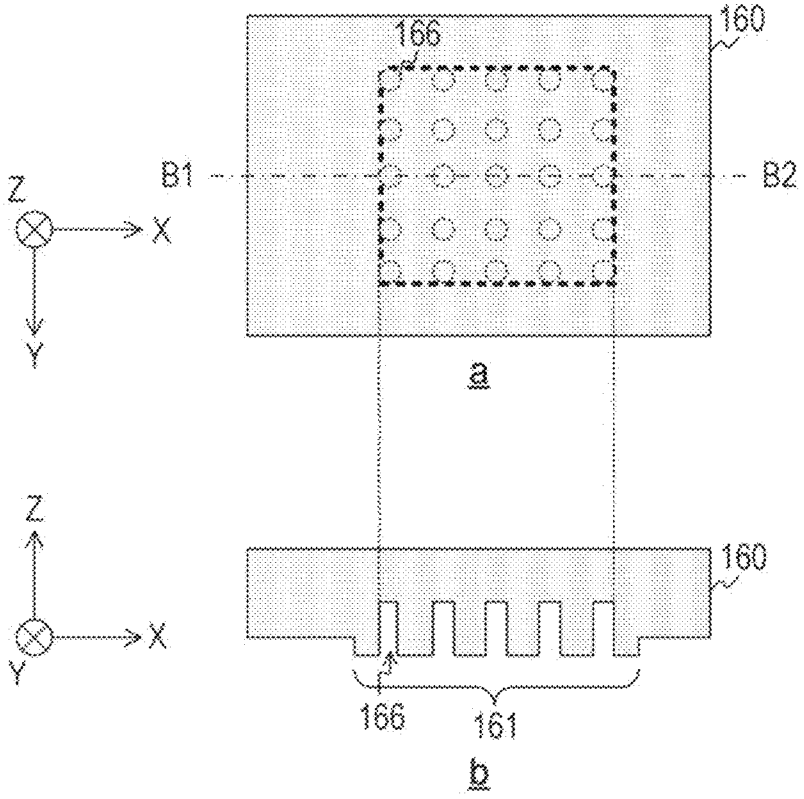
FIG. 83 is an example of a bottom view and a cross-sectional view of a heat dissipation member according to a third modification of the seventh embodiment of the present technology.

FIG. 83 is an example of a bottom view and a cross-sectional view of the heat dissipation member 160 according to the third modification of the seventh embodiment of the present technology. (a) in the drawing is an example of a bottom view of the heat dissipation member 160. (b) in the drawing is an example of a cross-sectional view taken along line segment B1-B2 of (a) in the drawing.

In the heat dissipation member 160 according to the third modification of the seventh embodiment, instead of the trench 162, a plurality of cylindrical vertical holes (vertical holes 166, etc.) not penetrating the heat dissipation member 160 is formed. These vertical holes are formed in the Z-axis direction from the surface of the protrusion 161. The heat conductive members 150 is held in these vertical holes.

Figure 84:
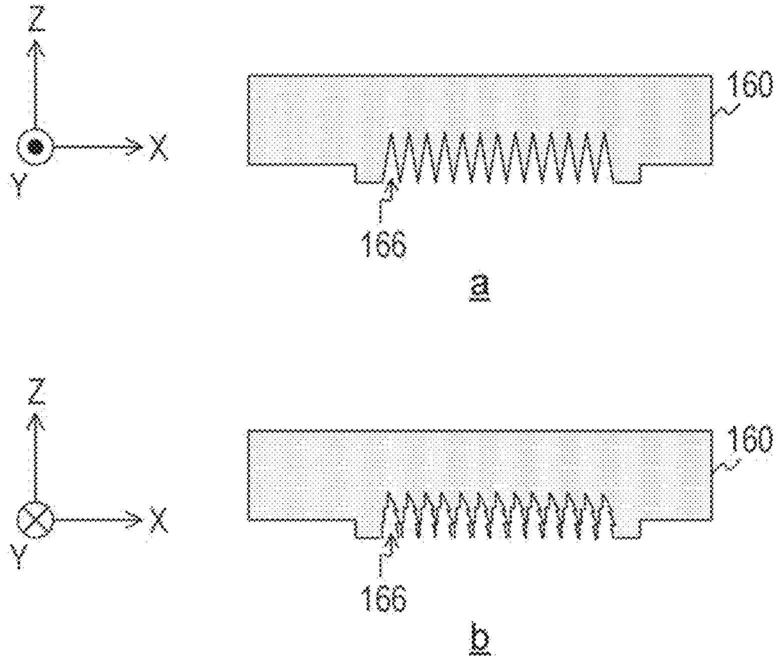
FIG. 84 is an example of a cross-sectional view of a heat dissipation member according to the third modification of the seventh embodiment of the present technology.

Note that as illustrated in (a) of FIG. 84, the shape of the vertical hole 166 and the like may be conical. Further, as illustrated in (b) of the drawing, the side surface of the cone can be processed into a saw shape. This can enhance the adhesive force of the heat dissipation member 160.

As described above, according to the third modification of the seventh embodiment of the present technology, due to the formation of the plurality of vertical holes in the heat dissipation member 160, the heat conductive member 150 can be held in those vertical holes.

8. Example of Application to Mobile Body

The technology according to the present disclosure (present technology) can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a ship, and a robot.

Figure 85:
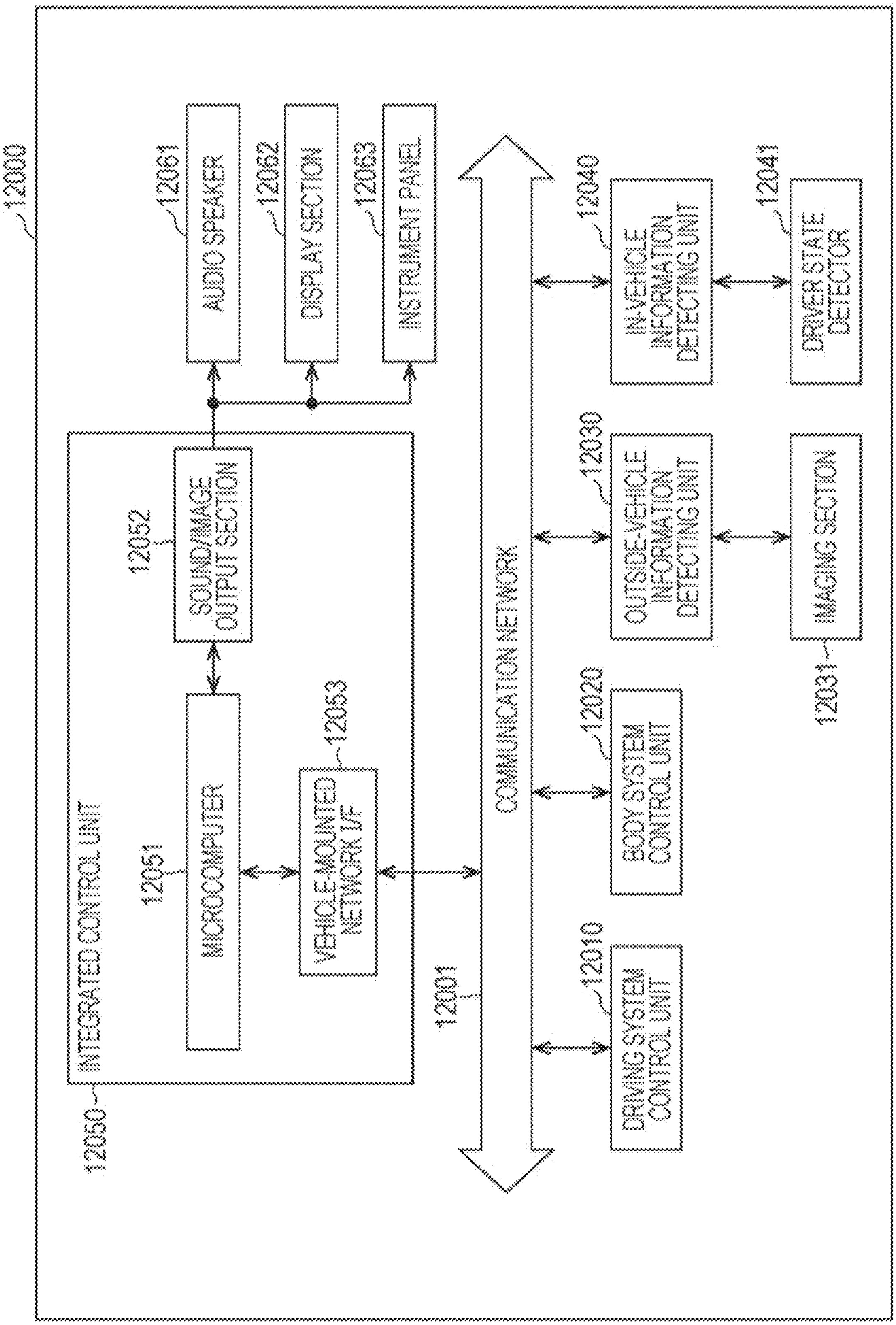
FIG. 85 is a block diagram illustrating a schematic configuration example of a vehicle control system.

FIG. 85 is a block diagram illustrating a schematic configuration example of a vehicle control system that is an example of a mobile body control system to which the technology according to the present disclosure can be applied.

The vehicle control system 12000 includes a plurality of electronic control units connected to each other via a communication network 12001. In the example illustrated in FIG. 85, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as functional component of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Further, the microcomputer 12051 can output a control command to the body system control unit 12020 on the basis of the information about the outside of the vehicle acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 85, an audio speaker 12061, a display section 12062, and an instrument panel 12063 are illustrated as the output device. The display section 12062 may, for example, include at least one of an on-board display and a head-up display.

Figure 86:
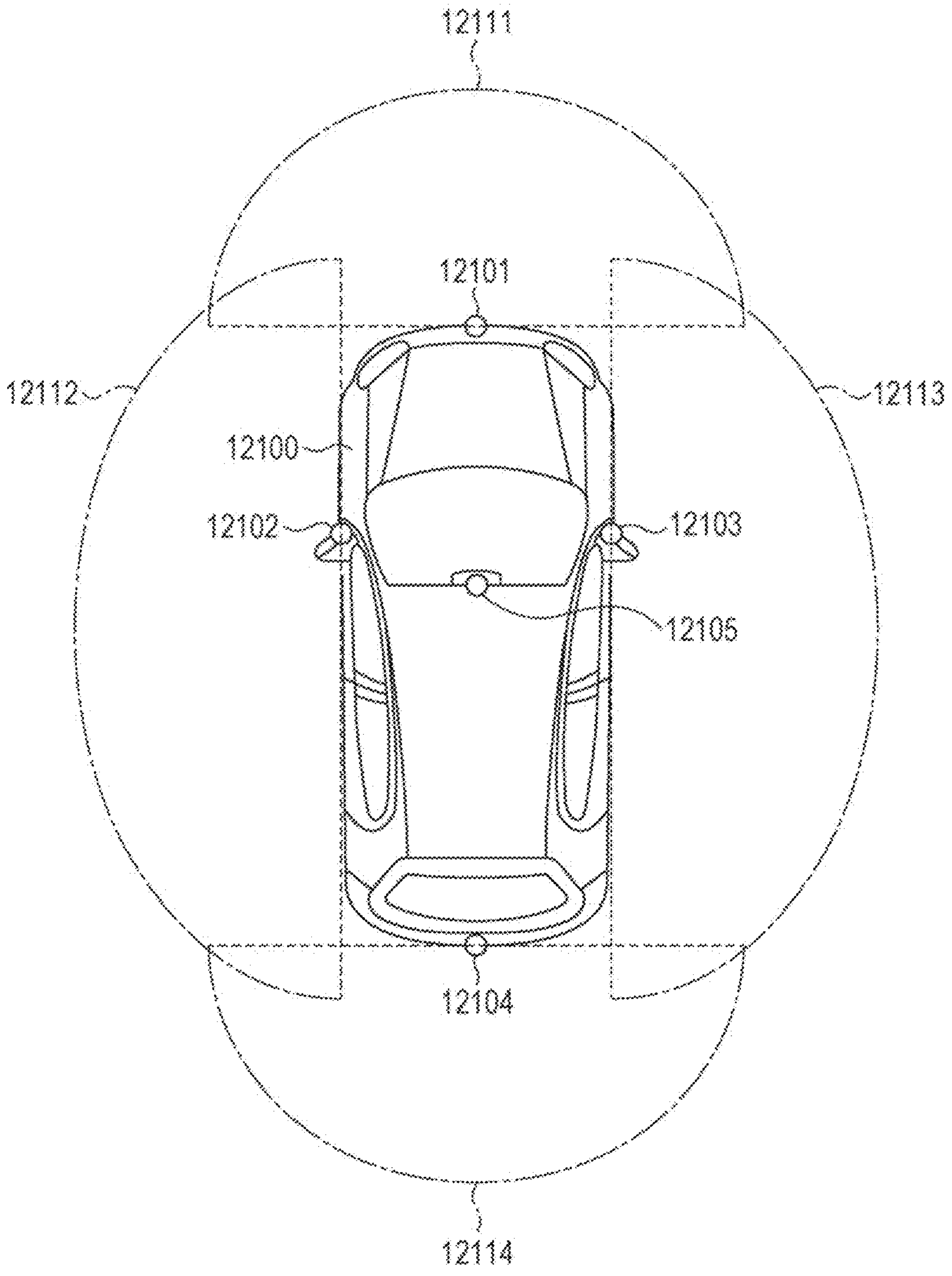
FIG. 86 is an explanatory diagram illustrating an example of an installation position of an imaging section.

FIG. 86 is a view illustrating an example of the installation position of the imaging section 12031.

In FIG. 86, the imaging section 12031 includes imaging sections 12101, 12102, 12103, 12104, 12105.

The imaging sections 12101, 12102, 12103, 12104, 12105 are, for example, provided at positions on a front nose, sideview mirrors, a rear bumper, and a back door of a vehicle 12100, and on an upper portion of a windshield within the interior of the vehicle, and other positions. The imaging section 12101 provided to the front nose and the imaging section 12105 provided to the upper portion of the windshield within the interior of the vehicle obtain mainly an image of the front of the vehicle 12100. The imaging sections 12102, 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 86 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology of the present disclosure can be applied has been described above. The technology of the present disclosure can be applied to, for example, the imaging section 12031 among the components described above. Specifically, the semiconductor package 200 in FIG. 10 can be applied to the imaging section 12031. By applying the technology according to the present disclosure to the imaging section 12031, the outflow of the heat conductive member can be prevented to improve the reliability of the system using the semiconductor package 200.

Note that the above embodiments show examples for embodying the present technology, and matters in the embodiments and matters specifying the invention in the claims have correspondence relationships. Similarly, the matters specifying the invention in the claims and matters having the same names in the embodiments of the present technology have correspondence relationships. However, the present technology is not limited to the embodiments and can be embodied by making various modifications to the embodiments without departing from the gist thereof.

Note that effects described in the present specification are merely examples and are not limited, and there may also be other effects.

Note that the present technology may also have a following configuration.

(1) A semiconductor device including:

a first semiconductor chip;

a heat dissipation member;

a heat conductive member disposed between a chip plane of the first semiconductor chip and the heat dissipation member; and an outflow prevention part that prevents outflow of the heat conductive member from the chip plane.

(2) The semiconductor device according to (1) above, further including a first sealing resin configured to seal the first semiconductor chip, in which the outflow prevention part is formed in the first sealing resin.

(3) The semiconductor device according to (2) above, in which the first sealing resin is formed with a first opening that exposes at least a part of a chip plane of the first semiconductor chip, and the outflow prevention part includes a first notch adjacent to at least a part of an outer periphery of the first opening.

(4) The semiconductor device according to (3) above, further including a second semiconductor chip, in which the first sealing resin is formed with a second opening that exposes at least a part of a chip plane of the second semiconductor chip, and the outflow prevention part further includes a second notch formed between the first opening and the second opening.

(5) The semiconductor device according to (3) above, in which a predetermined number of trenches are formed in the first notch.

(6) The semiconductor device according to (5) above, in which each of the trenches is formed outside an outer periphery of the chip plane.

(7) The semiconductor device according to (2) above, in which one of both surfaces of the semiconductor chip is a light-receiving surface, the heat conductive member is disposed between the other of the both surfaces of the first semiconductor chip and the heat dissipation member, and the outflow prevention part includes a notch formed in the first sealing resin and a trench formed in the heat dissipation member.

(8) The semiconductor device according to (7) above, further including:

a sealing glass that transmits light to the light-receiving surface; and a second sealing resin formed around the sealing glass.

(9) The semiconductor device according to (7) or (8) above, further including a through-via substrate in which a through via is formed, in which the first sealing resin is formed inside the through-via substrate.

(10) The semiconductor device according to (2) above, in which the heat dissipation member includes a base having a plate shape and a plurality of protrusions protruding from the base in a direction perpendicular to the chip plane, and a height of the base from the chip plane is lower than a height of the first sealing resin from the chip plane.

(11) The semiconductor device according to (2) above, further including:

a second sealing resin having a lower elastic modulus than an elastic modulus of the first sealing resin; and a wiring layer in which an external terminal is provided on one of both surfaces and the second sealing resin and the first semiconductor chip are stacked on the other of the both surfaces, in which the first sealing resin is stacked on the second sealing resin.

(12) The semiconductor package according to (1) above, further including a substrate on which the first semiconductor chips are stacked and in which an opening that exposes a part of the chip plane is formed, in which one of both surfaces of the first semiconductor chip is a light-receiving surface, and the other of the both surfaces is the chip plane, and the outflow prevention part includes a notch formed in the substrate.

(13) The semiconductor device according to (12) above, in which the notch is formed by at least one of processing of a base material of the substrate, processing of a solder resist, patterning for a wiring pattern, or silk printing.

(14) The semiconductor device according to (12) or (13) above, in which the notch is formed on each of both surfaces of the substrate.

(15) The semiconductor device according to (14) above, in which a shape of the notch differs between one and the other of both surfaces of the substrate.

(16) The semiconductor device according to any one of (12) to (15) above, in which the notch is formed adjacent to a part of an outer periphery of the opening.

(17) The semiconductor device according to any one of (12) to (15) above, in which the notch is formed in a region surrounding an outer periphery of the opening.

(18) The semiconductor device according to any one of (12) to (16) above, in which a predetermined electronic component is mounted on the substrate.

(19) The semiconductor device according to (1) above, further including a first sealing resin configured to seal the first semiconductor chip, in which the outflow prevention part is formed in each of the first sealing resin and the heat dissipation member.

(20) The semiconductor device according to (19) above, in which the outflow prevention part further includes a holding part formed in the heat dissipation member, and the holding part holds the heat conductive member.

REFERENCE SIGNS LIST

100, 200, 300 Semiconductor package
110, 111, 230, 235, 330 Semiconductor chip
120, 126, 280, 320, 365 Sealing resin
121 to 124, 243, 243-1, 243-2, 248-1, 248-2, 249-1, 249-2, 324, 325 Notch
125, 162, 362 Trench
126-1 Polyester-modified epoxy resin
128, 129, 242, 246, 247, 323 Opening
130 Wiring layer
140, 241, 340 External terminal
150, 250, 350 Heat conductive member
160, 260, 360 Heat dissipation member
161, 181 to 183, 188, 189, 191 to 193, 198, 199, 361 Protrusion
163 Venting port
164 Cavity
165 Through hole
166 Vertical hole
170 Support
180, 190 Sealing jig
195 Fixed resin
210, 310 Sealing glass
220 Frame
225 Wire
231, 331 Light receiver
240 Substrate
244 Solder resist
245 Wiring
270 Electronic component
315 Rewiring layer
316 Rewiring
321 Through via
322 Sealing wiring pattern
370 Mounting substrate
371 Pad
380 Sealing solder
390 Support substrate
391 Adhesive
395 Through-via substrate
400 Semiconductor device
12031 Imaging section

What is claimed is:

1. A semiconductor device, comprising:

a first semiconductor chip;

a heat dissipation member;

a heat conductive member disposed between a chip plane of the first semiconductor chip and the heat dissipation member;

an outflow prevention part that prevents outflow of the heat conductive member from the chip plane; and a first sealing resin configured to seal the first semiconductor chip, wherein the outflow prevention part is formed in the first sealing resin, wherein the first sealing resin is formed with a first opening that exposes at least a part of a chip plane of the first semiconductor chip, and wherein the outflow prevention part includes a first notch adjacent to at least a part of an outer periphery of the first opening.

2. The semiconductor device according to claim 1, further comprising a second semiconductor chip, wherein the first sealing resin is formed with a second opening that exposes at least a part of a chip plane of the second semiconductor chip, and the outflow prevention part further includes a second notch formed between the first opening and the second opening.

3. The semiconductor device according to claim 1, wherein a predetermined number of trenches are formed in the first notch.

4. The semiconductor device according to claim 3, wherein each of the trenches is formed outside an outer periphery of the chip plane.

5. The semiconductor device according to claim 1, further comprising:

a second sealing resin having a lower elastic modulus than an elastic modulus of the first sealing resin; and a wiring layer in which an external terminal is provided on a first surface of the wiring layer and the second sealing resin and the first semiconductor chip are stacked on a second surface of the wiring layer, wherein the first sealing resin is stacked on the second sealing resin.

6. The semiconductor device according to claim 1, wherein the outflow prevention part is formed in each of the first sealing resin and the heat dissipation member.

7. The semiconductor device according to claim 6, wherein the outflow prevention part further includes a holding part formed in the heat dissipation member, and the holding part holds the heat conductive member.

8. A semiconductor device, comprising:

a first semiconductor chip;

a heat dissipation member;

a heat conductive member disposed between a chip plane of the first semiconductor chip and the heat dissipation member;

an outflow prevention part that prevents outflow of the heat conductive member from the chip plane; and a first sealing resin configured to seal the first semiconductor chip, wherein the outflow prevention part is formed in the first sealing resin, wherein a first surface of the semiconductor chip is a light-receiving surface, wherein the heat conductive member is disposed between the first surface and a second surface of the first semiconductor chip and the heat dissipation member, and wherein the outflow prevention part includes a notch formed in the first sealing resin and a trench formed in the heat dissipation member.

9. The semiconductor device according to claim 8, further comprising:

a sealing glass that transmits light to the light-receiving surface; and a second sealing resin formed around the sealing glass.

10. The semiconductor device according to claim 8, further comprising a through-via substrate in which a through via is formed, wherein the first sealing resin is formed inside the through-via substrate.

11. The semiconductor device according to claim 8, further comprising:

a second sealing resin having a lower elastic modulus than an elastic modulus of the first sealing resin; and a wiring layer in which an external terminal is provided on a first surface of the wiring layer and the second sealing resin and the first semiconductor chip are stacked on a second surface of the wiring layer, wherein the first sealing resin is stacked on the second sealing resin.

12. A semiconductor device, comprising:

a first semiconductor chip;

a heat dissipation member;

a heat conductive member disposed between a chip plane of the first semiconductor chip and the heat dissipation member;

an outflow prevention part that prevents outflow of the heat conductive member from the chip plane; and a first sealing resin configured to seal the first semiconductor chip, wherein the outflow prevention part is formed in the first sealing resin, wherein the heat dissipation member includes:

a base having a plate shape; and a plurality of protrusions protruding from the base in a direction perpendicular to the chip plane, and wherein a height of the base from the chip plane is lower than a height of the first sealing resin from the chip plane.

13. A semiconductor device, comprising:

a first semiconductor chip;

a heat dissipation member;

a heat conductive member disposed between a chip plane of the first semiconductor chip and the heat dissipation member;

an outflow prevention part that prevents outflow of the heat conductive member from the chip plane; and a substrate on which the first semiconductor chip is stacked and in which an opening that exposes a part of the chip plane is formed, wherein a first surface of the first semiconductor chip is a light-receiving surface, wherein a second surface of the first semiconductor chip is the chip plane, and wherein the outflow prevention part includes a notch formed in the substrate.

14. The semiconductor device according to claim 13, wherein the notch is formed by at least one of processing of a base material of the substrate, processing of a solder resist, patterning for a wiring pattern, or silk printing.

15. The semiconductor device according to claim 14, wherein the notch is formed on each of both surfaces of the substrate.

16. The semiconductor device according to claim 15, wherein a shape of the notch differs between a first surface and a second surface of the substrate.

17. The semiconductor device according to claim 13, wherein the notch is formed adjacent to a part of an outer periphery of the opening.

18. The semiconductor device according to claim 13, wherein the notch is formed in a region surrounding an outer periphery of the opening.

19. The semiconductor device according to claim 13, wherein a predetermined electronic component is mounted on the substrate.

20. The semiconductor device according to claim 13, further comprising:

a first sealing resin configured to seal the first semiconductor chip, wherein the outflow prevention part is formed in the first sealing resin; and a second sealing resin having a lower elastic modulus than an elastic modulus of the first sealing resin; and a wiring layer in which an external terminal is provided on a first surface of the wiring layer and the second sealing resin and the first semiconductor chip are stacked on a second surface of the wiring layer, wherein the first sealing resin is stacked on the second sealing resin.

* * * * *